(12) United States Patent
Nagata et al.

(10) Patent No.: US 9,268,114 B2
(45) Date of Patent: Feb. 23, 2016

(54) DISPERSED COMPOSITION, POLYMERIZABLE COMPOSITION, LIGHT SHIELDING COLOR FILTER, LIQUID CRYSTAL DISPLAY DEVICE HAVING LIGHT SHIELDING COLOR FILTER, SOLID-STATE IMAGING DEVICE, WAFER-LEVEL LENS, AND IMAGING UNIT HAVING WAFER-LEVEL LENS

(75) Inventors: Yuzo Nagata, Shizuoka (JP); Masaru Yoshikawa, Shizuoka (JP); Makoto Kubota, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 186 days.

(21) Appl. No.: 13/143,481

(22) PCT Filed: Feb. 23, 2010

(86) PCT No.: PCT/JP2010/052777
§ 371 (c)(1),
(2), (4) Date: Jul. 6, 2011

(87) PCT Pub. No.: WO2010/098327
PCT Pub. Date: Sep. 2, 2010

(65) Prior Publication Data
US 2011/0279759 A1 Nov. 17, 2011

(30) Foreign Application Priority Data

Feb. 26, 2009 (JP) ................................. 2009-044241
Dec. 28, 2009 (JP) ................................. 2009-298646

(51) Int. Cl.
| | | |
|---|---|---|
| G02B 5/20 | (2006.01) | |
| G03F 7/004 | (2006.01) | |
| G02B 13/00 | (2006.01) | |
| G03F 7/00 | (2006.01) | |
| G03F 7/105 | (2006.01) | |
| G02F 1/1335 | (2006.01) | |
| G03F 7/027 | (2006.01) | |

(52) U.S. Cl.
CPC ............ *G02B 13/0025* (2013.01); *G02B 5/201* (2013.01); *G02B 13/0035* (2013.01); *G02B 13/0085* (2013.01); *G03F 7/0007* (2013.01); *G03F 7/105* (2013.01); *G02F 1/133512* (2013.01); *G03F 7/027* (2013.01)

(58) Field of Classification Search
CPC ....... G03F 7/0007; G03F 7/027; G03F 7/031; G03F 7/033; G03F 7/105; G02B 5/201; G02B 13/0035; G02B 13/0025; G02B 13/0085; G02F 1/133512
USPC ............ 430/7, 270.1; 349/106, 110; 257/432, 257/440
See application file for complete search history.

(56) References Cited

U.S. PATENT DOCUMENTS

2005/0215675 A1   9/2005   Nishida et al.
2011/0279759 A1  11/2011  Nagata et al.

FOREIGN PATENT DOCUMENTS

| EP | 2 112 182 A1 | * | 10/2009 |
|---|---|---|---|
| JP | 9-54431 A | | 2/1997 |
| JP | 9-146272 A | | 6/1997 |
| JP | 10-46042 A | | 2/1998 |
| JP | 10-114836 A | | 5/1998 |
| JP | 10-246955 A | | 9/1998 |
| JP | 2001-343744 A | | 12/2001 |
| JP | 2002-275343 A | | 9/2002 |
| JP | 2003-294935 A | | 10/2003 |
| JP | 2004-287409 A | | 10/2004 |
| JP | 2004287299 A | | 10/2004 |
| JP | 2004-347915 A | | 12/2004 |
| JP | 2005-128483 A | | 5/2005 |
| JP | 2005-266189 A | | 9/2005 |
| JP | 2005-539276 A | | 12/2005 |
| JP | 2006-010793 A | | 1/2006 |
| JP | 2007-033467 | * | 2/2007 |
| JP | 2007-115921 A | | 5/2007 |
| JP | 2007-271938 A | | 10/2007 |
| JP | 2008-046268 A | | 2/2008 |
| JP | 2008-203841 A | | 9/2008 |
| JP | 2008272604 A | | 11/2008 |
| JP | 2009-84452 A | | 4/2009 |
| JP | 2011-153283 A | | 8/2011 |
| KR | 2008/0014640 A | | 2/2008 |
| WO | 2007/107025 A1 | | 9/2007 |
| WO | WO 2008/123601 A2 | * | 10/2008 |
| WO | 2010/038836 A1 | | 4/2010 |

OTHER PUBLICATIONS

Computer-generated translation of JP 9-146272 (Jun. 1997).*
Computer-generated translation of JP 2001-343744 (Dec. 2001).*
Computer-generated translation of 2007-033467 (Feb. 2007).*
First Office Action, dated Feb. 1, 2013, issued in corresponding CN Application No. 201080008249.7, 13 pages in English and Chinese.
Notice of Reasons for Rejection, dated Dec. 18, 2012, issued in corresponding JP Application No. 2010-032773, 4 pages in English and Japanese.
Japanese Office Action issued Apr. 22, 2014 from the Japanese Patent Office in Japanese Patent Application No. 2013-116329.
Taiwanese Office Action received May 12, 2014 in a corresponding Taiwanese Patent Application No. 10320619840.
Office Action dated Nov. 11, 2014, issued by the Japanese Patent Office in counterpart Japanese Application No. 2013-116329.
Communication dated Oct. 30, 2015 from the Korean Intellectual Property Office in counterpart Korean Application No. 10-2011-7016240.

* cited by examiner

*Primary Examiner* — John A McPherson
(74) *Attorney, Agent, or Firm* — Sughrue Mion, PLLC

(57) ABSTRACT

The invention provides a dispersed composition including: (A) titanium black; (B) a polymer compound including a constituent component having a side chain structure to which an acidic group is linked via a linking group; and (C) a solvent. The (B) polymer compound is a polymer having a structure in which an acidic group is linked to a main chain part via a linking group.

23 Claims, 2 Drawing Sheets

DISPERSED COMPOSITION, POLYMERIZABLE COMPOSITION, LIGHT SHIELDING COLOR FILTER, LIQUID CRYSTAL DISPLAY DEVICE HAVING LIGHT SHIELDING COLOR FILTER, SOLID-STATE IMAGING DEVICE, WAFER-LEVEL LENS, AND IMAGING UNIT HAVING WAFER-LEVEL LENS

CROSS REFERENCE TO RELATED APPLICATIONS

This application is a National Stage of International Application No. PCT/JP2010/052777, filed on Feb. 23, 2010, which claims priority from Japanese Patent Application Nos. 2009-044241, filed on Feb. 26, 2009, and 2009-298646, filed on Dec. 28, 2009, the contents of all of which are incorporated herein by reference in their entirety.

TECHNICAL FIELD

The present invention relates to a dispersed composition containing titanium black, a polymerizable composition, a light shielding color filter using the composition, a solid-state imaging device equipped with the light shielding color filter, and a liquid crystal display device.

BACKGROUND ART

Color filters used in liquid crystal display devices are equipped with a light shielding film called black matrix, for the purpose of shielding light among colored pixels and enhancing the contrast. Furthermore, solid-state imaging devices are also provided with a black matrix for the purpose of preventing generation of noise, enhancing the image quality, and the like. A black matrix is produced by preparing a polymerizable composition that includes a polymerizable composition in which a black coloring material having light shielding properties is dispersed, a polymerizable compound, a polymerization initiator and other components, and forming a pattern with the polymerizable composition.

As the composition for forming a black matrix for liquid crystal display devices or solid-state imaging devices, photosensitive resin compositions containing a black coloring material such as carbon black or titanium black are known.

Black matrices for liquid crystal display devices needs to have high light shielding properties in order to increase the contrast and enhance the visibility. On the other hand, black matrices for solid-state imaging devices needs to have light shielding properties with respect to light in the visible region, in addition to light shielding properties in the infrared region.

Conventional light shielding color filters that form light shielding black matrices have mainly used carbon black. However, there has been a problem in that if the filling amount of carbon black is increased for the purpose of increasing the light shielding properties, it becomes difficult to disperse carbon black and deteriorates pattern formability.

While there is a demand for further miniaturization of black matrices for liquid crystal display devices, black matrices for solid-state imaging devices (in particular, black matrices formed on the surface of a support opposite to the side on which light-receiving devices are formed (hereinafter, also referred to as "back surface") need to have an ability of uniformly shielding light in a larger area, as compared with black matrices for liquid crystal display devices.

Furthermore, when a light shielding film having a large area is formed as a light shielding film for solid-state imaging devices by using a conventional photosensitive resin composition, there may be a case of forming a region in a peripheral portion in which the thickness of the light shielding film is smaller than the thickness at the central part of the light shielding film (steps), whereby the light shielding ability at the peripheral part of the light shielding film may decrease.

In response to the requirements for product quality of black matrices with high light shielding properties as described above, titanium black, which exhibits high light shielding properties, has become very useful, and various methods have been proposed in order to improve the dispersibility of titanium black (see Japanese Patent Application Laid-Open (JP-A) No. 10-246955, JP-A No. 9-54431, JP-A No. 10-46042, JP-A No. 2007-115921, JP-A No. 10-114836, JP-A No. 2002-275343, and JP-A No. 2005-266189). However, since titanium black has a large specific gravity, it is more difficult to disperse titanium black as compared with carbon black, and problems such as precipitation over time are prone to occur. Therefore, when forming a uniform light shielding color filter using titanium black, there is a demand for a material that achieves favorable dispersibility and dispersion stability of titanium black, and is capable of forming a favorable light shielding pattern with high sensitivity.

Furthermore, in recent years, imaging units having a small size and reduced thickness are used in portable terminals of electronic instruments such as mobile phones or personal digital assistants (PDAs). Such imaging units normally include a solid-state imaging device such as a charge coupled device (CCD) image sensor or a complementary metal-oxide semiconductor (CMOS) image sensor, and a lens for forming a subject image on the solid-state imaging device.

As the size or the thickness of mobile terminals decreases, there is a demand for reducing the size or the thickness of imaging units. Further, in order to reduce the production costs for mobile terminals, streamlining of production processes is desired. As a method for producing a large number of small lenses, a method of mass producing lens modules is known in which a wafer-level lens, formed from a support and plural lenses provided on the support, is cut and separated into plural lenses.

Further, a method of mass producing imaging units is known in which a support on which plural lenses are formed and a sensor support on which plural solid-state imaging devices are formed are assembled, and the sensor support is cut together with the support such that a set of a lens and a solid-state imaging device is included therein.

Conventionally, in regard to wafer-level lenses, for example, a constitution of a multilayer wafer-level lens formed by layering supports each having plural lenses formed thereon is known (see, for example, Japanese Patent Application National Publication (Laid-Open) No. 2005-539276). Further, a method of obtaining a wafer-level lens by supplying a material for forming lenses on a support, and forming lenses on the support using a mold, is known (see, for example, WO 2007/107025). It is important also for such wafer-level lenses to form suitable light shielding films.

DISCLOSURE OF THE INVENTION

Problems to be Solved by the Invention

The present invention has been made under such circumstances, and the invention is intended to achieve the following objects.

Specifically, it is an object of the invention to provide a dispersed composition in which titanium black exhibits high dispersibility and does not settle over time, the dispersed composition exhibiting high dispersibility and storage stability.

It is another object of the invention to provide a polymerizable composition capable of forming a pattern with excellent light shielding properties, and capable of forming a cured light shielding film that exhibits satisfactory adhesion sensitivity, while suppressing occurrence of residues in unexposed portions. Yet another object of the invention is to provide a light shielding color filter having a colored pattern with high light shielding properties by using the polymerizable composition. Still another object of the invention is to provide a solid-state imaging device with high image quality formed by using the light shielding color filter, a liquid crystal display device, a wafer-level lens that can be simply and easily produced by having a light shielding color filter that regulates the light amount to an appropriate level, and an imaging unit equipped with the wafer-level lens.

Means for Solving the Problem

The inventors of the present invention have conducted intensive studies and, as a result, the inventors have completed the present invention based on the findings that the above problems can be solved by using, as a polymer dispersant, a polymer compound having an acidic group, the acidic functional group being linked to the main chain part via a linking group.

The following are specific means for addressing the objects.

<1> A dispersed composition comprising: (A) titanium black; (B) a polymer compound comprising a constituent component having a side chain structure to which an acidic group is linked via a linking group; and (C) a solvent.

<2> The dispersed composition according to <1>, wherein the acidic group comprises a carboxylic acid group.

<3> The dispersed composition according to <1> or <2>, wherein the linking group includes a functional group selected from the group consisting of an aromatic ring, an ether group, an ester group, an amide group, a urea group and a urethane group.

<4> The dispersed composition according to any one of <1> to <3>, wherein the linking group includes an aromatic ring.

<5> The dispersed composition according to any one of <1> to <4>, wherein the (B) polymer compound, comprising a constituent component having a side chain structure to which an acidic group is linked via a linking group, is a polymer compound comprising a constituent component represented by the following formula (1-2):

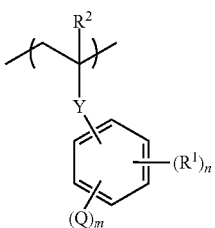

formula (1-2)

wherein, in the formula (1-2), $R^1$ represents an alkyl group, an aryl group, an alkoxy group, an aryloxy group, a heteroaryloxy group, an alkyloxycarbonyl group, an aryloxycarbonyl group, an alkylamide group, an arylamide group, a halogen atom or a nitro group; Q represents a carboxylic acid group; n represents an integer of from 0 to 4; m represents an integer of from 1 to 5; $R^2$ represents a hydrogen atom or an alkyl group; and Y represents a divalent linking group.

<6> The dispersed composition according to any one of <1> to <5>, wherein the (B) polymer compound, comprising a constituent component having a side chain structure to which an acidic group is linked via a linking group, further comprises a graft chain.

<7> The dispersed composition according to any one of <1> to <6>, wherein the dispersed composition is a liquid obtained by dispersing, by a multistage dispersion method, a liquid containing (A) titanium black, (B) the polymer compound comprising a constituent component having a side chain structure to which an acidic group is linked via a linking group, and (C) the solvent.

<8> A photopolymerizable composition comprising: the dispersed composition according to any one of <1> to <7>; (D) a polymerization initiator; and (E) a polymerizable compound.

<9> The photopolymerizable composition according to <8>, wherein the (D) polymerization initiator comprises an oxime photoinitiator.

<10> A light shielding color filter comprising a support and a colored region, the colored region being formed by applying the photopolymerizable composition according to <8> or <9> onto the support, and exposing and developing the photopolymerizable composition.

<11> A solid-state imaging element comprising the light shielding color filter according to <10>.

<12> A liquid crystal display element comprising the light shielding color filter according to <10>.

<13> A wafer-level lens comprising the light shielding color filter according to <10>.

<14> An imaging unit comprising the wafer-level lens according to <13>.

In the invention, the term "light shielding color filter" refers to a light shielding pattern obtained by exposing a photosensitive polymerizable composition to light and developing the same, the photosensitive polymerizable composition at least containing a titanium black-dispersed composition, a polymerizable compound and a photopolymerization initiator. The color of the "light shielding color filter" according to the invention may be an achromatic color such as black or grey, or may be a color in which a chromatic color is mixed with black or grey.

The "light shielding color filter" according to the invention is obtained by exposing and developing a photosensitive polymerizable composition including a black coloring material containing titanium black, which is a specific component of the invention, a specific polymer compound, a polymerizable compound, a polymerization initiator and a solvent. The light shielding color filter may also be referred to as a light shielding film or a light shielding filter.

The mechanism of the invention is not clearly known but is presumed as follows.

The dispersed composition of the invention uses, as a dispersant, a polymer compound having an acidic group which is linked to the main chain part via a linking group. Therefore, the acidic group, which is a group adsorptive to titanium black, is positioned away from the main chain part of the polymer by a distance corresponding to the length of the linking group (chain length). As a result, flexibility of the acidic group can be increased, and a decrease in the adsorbability due to steric hindrance of the main chain part can be suppressed. Accordingly, the adsorptive power of the polymer dispersant with respect to titanium black is enhanced, and dispersibility of titanium black can also be enhanced. Furthermore, according to a preferred embodiment of the invention, in which the linking group disposed between the acidic group and the main chain part has a structure selected from an aromatic ring, an ether group, an ester group, an amide group, a urea group and a urethane group, the adsorptive effect of the structure with respect to titanium black causes a further improvement in dispersibility. This effect of introducing a particular structure to the linking group is thought to lie in that the synergistic effect of adsorbability is further enhanced by having a particular structure selected from an aromatic ring, an ether group, an ester group, an amide group, a urea group and a urethane group at a position close to the acidic group, which is a group adsorptive to titanium black.

Furthermore, the specific resin according to the invention, having an acidic group with high flexibility, exhibits an effect of improving developability when the resin is used in a polymerizable composition as a polymer dispersant.

Effect of the Invention

According to the present invention, a dispersed composition that exhibits high dispersibility and storage stability, in which titanium black exhibits high dispersibility and does not settle out even after a lapse of time, can be provided.

Furthermore, according to the invention, a polymerizable composition that is capable of forming a pattern having excellent light shielding properties, suppressing generation of residues in unexposed regions, and forming a cured light shielding film having satisfactory adhesion sensitivity, can be provided. The invention also provides a light shielding color filter having a colored pattern formed from the polymerizable composition, the colored pattern exhibiting high light shielding properties The invention also provides a solid-state imaging device with high image quality formed by using the light shielding color filter, a liquid crystal display device, a wafer-level lens that can be simply and easily produced by having a light shielding color filter that regulates the light amount to an appropriate degree, and an imaging unit equipped with the wafer-level lens.

BEST MODE FOR CARRYING OUT THE INVENTION

Figure 1:
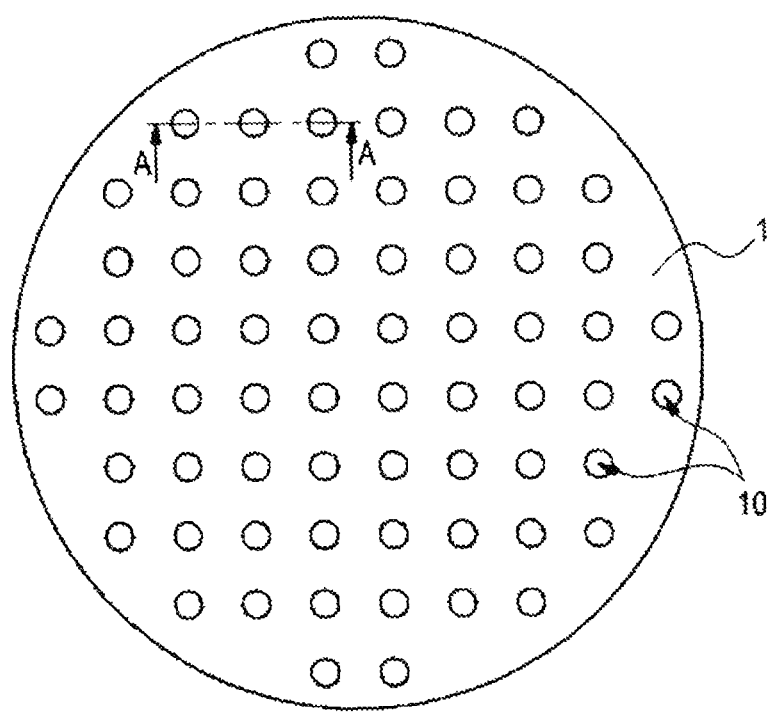
FIG. 1 is a planar view showing an example of the wafer-level lens array.

Hereinafter, the present invention will be described in more detail.

[Dispersed Composition]

The dispersed composition of the invention is a dispersed composition including (A) titanium black, (B) a polymer compound having an acidic group which is linked to the main chain part via a linking group, and (C) a solvent.

Hereinafter, the components included in the dispersion composition of the invention will be explained.

<(A) Titanium Black>

Titanium black according to the invention are black particles including titanium atoms, and specific components include lower titanium oxide and titanium oxynitride.

Examples of the method for producing titanium black include a method of heating a mixture of titanium dioxide and titanium metal in a reducing atmosphere and thereby inducing reduction; a method of reducing ultrafine titanium dioxide obtained by high temperature hydrolysis of titanium tetrachloride in a reducing atmosphere containing hydrogen; a method of reducing titanium dioxide or titanium hydroxide at high temperature in the presence of ammonia; and a method of attaching titanium dioxide or titanium hydroxide to a vanadium compound, and reducing the compound at high temperature in the presence of ammonia.

Furthermore, the surface of titanium black particles may be modified according to necessity, for the purpose of enhancing dispersibility, suppressing aggregation thereof, or the like. For example, titanium black particles may be coated with silicon oxide, titanium oxide, germanium oxide, aluminum oxide, magnesium oxide or zirconium oxide. It is also possible to treat the surface of titanium black particles with a water-repellent material such as those disclosed in JP-A No. 2007-302836.

The particle size of titanium black is not particularly limited, but from the viewpoint of dispersibility and colorability, titanium black particles preferably has an average primary particle size in the range of from 3 nm to 2000 nm, more preferably in the range of from 10 nm to 500 nm, and even more preferably in the range of from 10 nm to 100 nm.

The particle size of titanium black can be measured by the following method.

It is known that the particle size can be measured by a method of directly observing particles with a transmission electron microscope and measuring the minor axis diameter or the major axis diameter, or by a method of determining the content of particles having a predetermined particle size contained in a sample by a small angle X-ray scattering method.

The specific surface area of titanium black is not particularly limited, but in order to obtain predetermined water repellency after performing a surface treatment of titanium black with a water repellent, the value measured by a BET method is usually approximately from 5 $m^2/g$ to 150 $m^2/g$, and particularly preferably from 20 $m^2/g$ to 100 $m^2/g$.

Examples of commercially available products of titanium black include TITANIUM BLACK 10S, 12S, 13M, 13M-C, 13R and 13R-N (trade names, manufactured by Mitsubishi Materials Corp.); and TILACK D (trade name, manufactured by Ako Kasei Co., Ltd.) However, titanium black that can be used in the invention is not limited to these products.

An extender pigment may be added to titanium black used in the invention, according to necessity. Examples of the extender pigment include barium sulfate, barium carbonate, calcium carbonate, silica, basic magnesium carbonate, alumina white, gloss white, Saturn white, and hydrotalcite. These extender pigments may be used singly or as a mixture of two or more kinds. The amount of use of the extender pigment is usually from 0 to 100 parts by mass, preferably from 5 to 50 parts by mass, and more preferably from 10 to 40 parts by mass, with respect to 100 parts by mass of titanium black. In the invention, the titanium black and the extender pigment may be used after modifying the surface thereof with a polymer, as necessary.

The content of the titanium black to be added to the dispersed composition of the invention is adjusted such that the content of titanium black in the dispersed composition is from 20% by mass to 94% by mass. The content of titanium black in the dispersed composition is more preferably in the range of from 40% by mass to 92% by mass, and even more preferably in the range of from 40% by mass to 80% by mass.

When the content of titanium black is adjusted to the range as mentioned above, curability of the polymerizable composition of the invention can be improved, and a uniform film can be formed. When titanium black is contained at a high concentration, sufficient light shielding properties can be obtained, and the polymerizable composition containing titanium black can be suitably used for the formation of a light shielding color filter.

Furthermore, a light shielding pigment other than titanium black may be mixed and used in the dispersion composition of the invention.

Such a light shielding pigment that may be mixed in the dispersed composition is not particularly limited as long as the pigment has an absorbance in the visible region, and examples thereof include the extender pigments as mentioned above, carbon black, and organic pigments such as C.I. Pigment Blue 1, 2, 15, 15:1, 15:2, 15:3, 15:4, 15:6, 16, 22, 60, 64, 66, 79 and 80; C.I. Pigment Violet 1, 19, 23, 27, 32, 37 and 42; C.I. Pigment Brown 25 and 28; and C.I. Pigment Black 1 and 7.

Exemplary use of a light shielding pigment other than titanium black in a mixture include the use of titanium black and carbon black mixed at 6:1, and the use of titanium black and titanium oxide mixed at 3:1.

The light shielding pigment other than titanium black to be used in a mixture may be used in the range of from 0.01 to 99.99 parts by mass, and preferably in the range of from 20 to 70 parts by mass, with respect to 100 parts by mass of titanium black.

<(B) Polymer Compound Having Constituent Component Having Side Chain Structure to which Acidic Group is Linked Via Linking Group>

The dispersed composition of the invention contains a polymer having an acidic group which is linked to the main chain part via a linking chain, more specifically, a polymer compound containing, as a polymerizable component, a constituent component having a side chain structure to which an acidic group is linked via a linking group (hereinafter, also referred to as a "specific resin").

In the (B) specific resin of the invention, the main chain part and the acidic group, which is a group absorptive with respect to titanium black, are linked via a linking group including one or more atoms other than a hydrogen atom. The longer the chain length of the linking chain is, i.e., the more the number of atoms used to link the polymer main chain to the acidic group is, i.e., the more the number of atoms constituting the main skeleton of the linking group is, the more the flexibility of the acidic group can be enhanced. However, if the chain length of the linking group is too long, the number of acidic groups that can be introduced into the specific resin is limited. From this point of view, the main chain part and the acidic group are preferably linked via a linking group including from 2 to 100 atoms other than a hydrogen atom, more preferably linked via a linking group including from 4 to 60 atoms, and even more preferably linked via a linking group having from 6 to 30 atoms.

The "main skeleton of the linking group" according to the invention refers to an atom or an atomic group that is used only for linking an atom that forms the main chain skeleton in a constituent component to the acidic group at a chain end. In particular, when there are plural linking paths, it refers to an atom or an atomic group that constitutes the path including the smallest number of atoms.

The main chain part of the specific resin of the invention refers to a moiety that has been polymerized during synthesis of the polymer. In the case of a polymer obtained by polymerizing a methacrylic acid ester, the main chain part refers to an alkylene moiety to which a methacrylic moiety is linked via polymerization.

The specific resin of the invention is a compound having an acidic group at the end of a side chain. The acidic group refers to a functional group defined as at least one of Bronsted acid or Lewis acid, or a functional group having the structure of a salt of the functional group as defined above. The acidic group may be, for example, an acid group selected from a carboxylic group, a phosphoric group or a sulfonic group, or may be a salt of the acid group. In view of the solubility of the specific resin in a solvent, stability over time, variety of the monomers used as a raw material etc., a carboxylic group is preferably used as the acidic group.

In the specific resin according to the invention, the acidic group is preferably linked to the main chain via a linking group that includes a functional group selected from an aromatic ring, an ether group, an ester group, an amide group, a urea group and a urethane group.

The effect achieved by selecting the above acidic group is thought to be that by having, as a linking group, an aromatic ring, an ether group, an ester group, an amide group, a urea group and/or a urethane group at a position close to the acidic group, which is a group adsorptive with respect to titanium black, a synergistic effect in terms of adsorbability is also obtained. Furthermore, since titanium black includes nitrogen atoms, a functional group capable of hydrogen bonding is preferably used as the linking group, and an amide group, a urea group or a urethane group is preferably used. On the other hand, when an aromatic ring is introduced, entanglement of the polymer can be suppressed due to steric hindrance as compared with conventional alkyl chains. Moreover, dispersibility can be enhanced since a benzene ring tends to be oriented outside the polymer from the polymer main chain part. Accordingly, it is preferable to introduce an aromatic ring as a linking group. It is also possible to use multiple kinds of linking groups in combination. For example, it is possible to use a combination of an aromatic ring with an ether group, an aromatic ring with an ester group, an aromatic ring with a urea group, an ether group with a urea group, an aromatic ring with an ether group and a urea group, or the like.

As mentioned above, it is preferable to introduce an aromatic ring as a linking group in the specific resin of the invention. Various kinds of aromatic rings can be used, such as a ring that does not contain a heteroatom and a ring containing a heteroatom. Among them, a benzene ring is more suitably used.

The (B) specific resin is preferably a resin having a partial structure represented by the following formula (1) in a side chain.

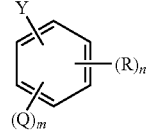

formula (1)

In the formula (1), Y represents a linking group to the main chain part of a polymer compound; R represents an alkyl group, an aryl group, an alkoxy group, an aryloxy group, a heteroaryloxy group, an alkyloxycarbonyl group, an aryloxycarbonyl group, an alkylamide group, an arylamide group, a halogen atom or a nitro group; Q represents an acidic group; n represents an integer of from 0 to 4; and m represents an integer of from 1 to 5. These groups may be further substituted.

More specifically, the specific resin of the invention is preferably a polymer compound including a constituent component represented by the following formula (1-2).

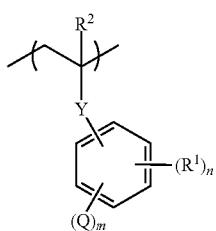

formula (1-2)

In the formula (1-2), $R^1$ represents an alkyl group, an aryl group, an alkoxy group, an aryloxy group, a heteroaryloxy group, an alkyloxycarbonyl group, an aryloxycarbonyl group, an alkylamide group, an arylamide group, a halogen atom or a nitro group; Q represents a carboxylic acid group; n represents an integer of from 0 to 4; m represents an integer of from 1 to 5; $R^2$ represents a hydrogen atom or an alkyl group; Y represents a divalent linking group and has the same definitions as Y in the formula (1), which will be described later.

In particular, in the case of using a specific resin having a partial structure represented by the formula (1), preferably a resin having a structural unit represented by the formula (1-2), entanglement of the polymer may be suppressed due to the steric hindrance of the benzene ring, as compared with the case of having a linking group formed from a ordinary alkyl chain. Furthermore, since the benzene ring is more likely to be oriented outside from the polymer main chain part, it is easier for the polymer to interact with titanium black, and whereby dispersibility of titanium black can be enhanced.

The partial structure represented by the formula (1) includes an aromatic ring. Therefore, when an initiator having an aromatic ring is used in combination as a polymerization initiator, the initiator having an aromatic ring is attracted to the dispersant having an aromatic ring via interaction between the aromatic rings. As a result, the polymerization initiator and the pigment are stabilized at positions close to each other in the dispersed composition or in a film formed from the polymerizable composition. Accordingly, when a film formed from the polymerizable composition is exposed to light, curing at a portion near the pigment is promoted and discoloration of the film caused by falling out of the pigment is suppressed. There is also an advantage in that the curing sensitivity is spuriously enhanced. Due to such action, by using the specific resin having a partial structure represented by the formula (1), a balance between developability and curing sensitivity can be more reliably achieved. It was also found that the above effect is particularly significant when an oxime initiator is used as the (D) polymerization initiator, which will be described later.

In the formula (1) and the formula (1-2), Y represents a divalent linking group to be linked to the main chain part of the polymer. The structure of the linking group is not particularly limited, but from the viewpoint of decreasing the pKa of the acidic group typified by a carboxylic acid group, the linking group is preferably linked to a benzene ring via a substituent that includes an electron-withdrawing group. Examples of the electron-withdrawing group include an alkoxycarbonyl group, an arylcarbonyl group, a heteroarylcarbonyl group, an alkylamide group, an arylamide group, a heteroarylcarbonyl group, an alkylsulfonamide group, an arylsulfonamide group, a heteroarylsulfonamide group, an alkylsulfonyl group, an arylsulfonyl group, a heteroarylsulfonyl group, a nitro group, a halogen atom, a polyfluoroalkyl group, and a polyfluoroaryl group.

The linking group represented by Y is more preferably a linking group constituted by including an ester group, an amide group or a sulfonamide group, more preferably a linking group including an ester group.

The following are specific examples of preferred linking group to the main chain represented by Y [(Y-1) to (Y-22)]. Y is not limited to these structures. In the following structures, the binding moiety to the main chain part of the polymer is designated by X, and the moiety linked to the partial structure represented by the formula (1) is designated by Z.

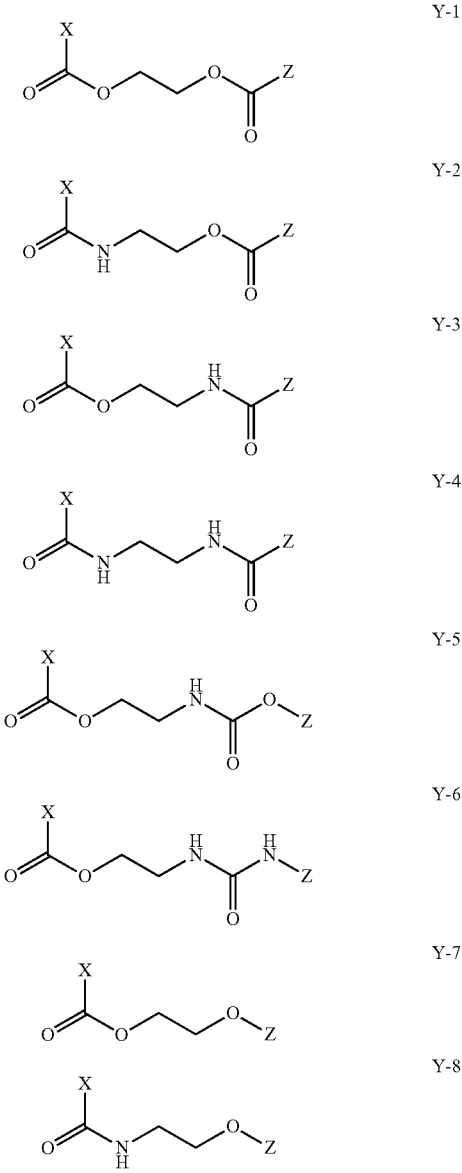

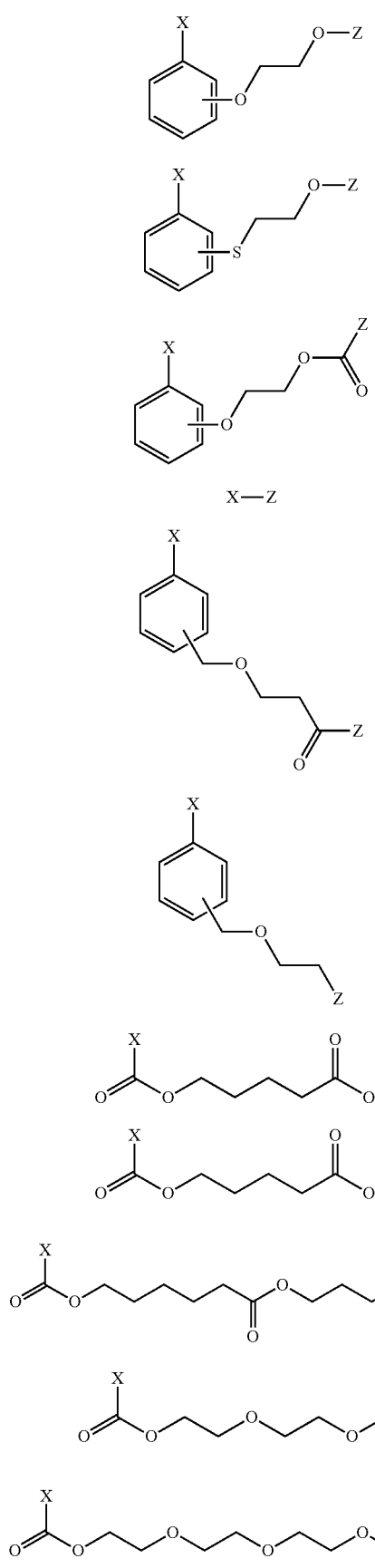

R in the formula (1) and R¹ in the formula (1-2) each represent an alkyl group, an aryl group, an alkoxy group, an aryloxy group, a heteroaryloxy group, an alkyloxycarbonyl group, an aryloxycarbonyl group, an alkylamide group, an arylamide group, a halogen group or a nitro group. From the viewpoint of decreasing the pKa of the carboxylic acid group, R and R¹ are each preferably a hydrogen atom or a substituent substituted by an electron-withdrawing group; more preferably an alkyloxycarbonyl group, an aryloxycarbonyl group, an alkylamide group, an arylamide group, a halogen group, a nitro group, or a carboxyl group; and even more preferably an alkyloxycarbonyl group or an aryloxycarbonyl group. These groups may be further substituted.

Examples of the substituent that may be further introduced to these groups include an acidic functional group such as a carboxyl group, a phosphoric acid group or a sulfonic acid group, or a salt thereof; a basic functional group such as a monoalkylamino group, a dialkylamino group, a monoarylamino group or a diarylamino group; an alkyl group such as a methyl group, an ethyl group or a heterocyclohexyl group; an aryl group such as a phenyl group, a naphthyl group or a pyridine group; and a heteroaryl group.

In the formula (1), Q represents an acidic group, and examples thereof include a carboxylic acid group, a phosphoric acid group, and a sulfonic acid group. From the viewpoint of solubility in a solvent used as a dispersion medium, or developability of a polymerizable composition at the time of pattern formation, Q is preferably a carboxylic acid group. Q may be introduced to the benzene ring via a linking group. Furthermore, in the formula (1-2), Q represents a carboxylic acid group, which is the most preferred embodiment.

m represents an integer of from 1 to 5. m represents the number of acidic groups included in the partial structure, and is preferably from 1 to 3, and more preferably 1 or 2.

In the formula (1), n represents an integer of from 0 to 4, and preferably from 0 to 2.

Specific examples of the partial structure represented by the formula (1) are presented below. X in the following structures represents the linking moiety to the main chain. The partial structure represented by the formula (1) is not limited to the following specific examples.

formula (1)-Example 1
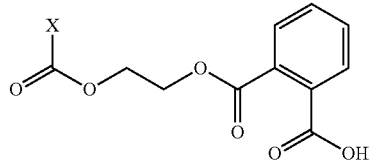
formula (1)-Example 2
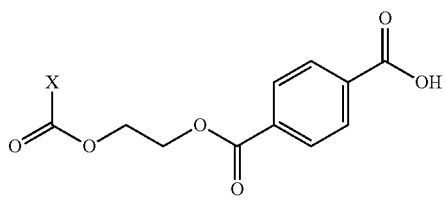
formula (1)-Example 3
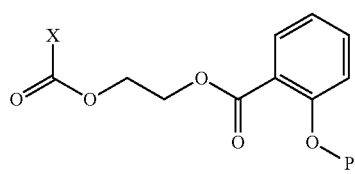
formula (1)-Example 4
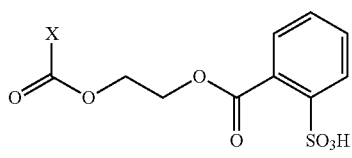
formula (1)-Example 5
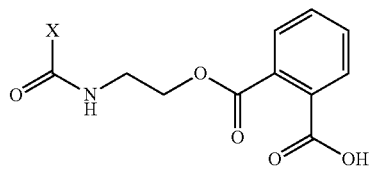
formula (1)-Example 6
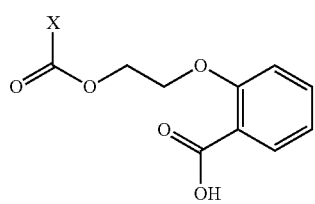
formula (1)-Example 7
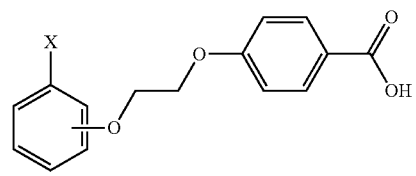
formula (1)-Example 8
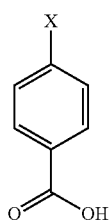
formula (1)-Example 9
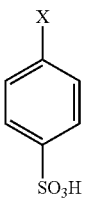
formula (1)-Example 10
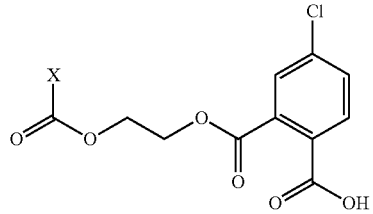
formula (1)-Example 11
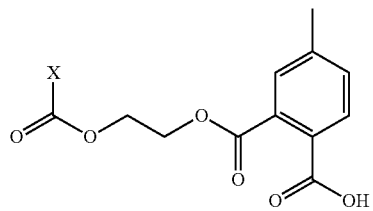
formula (1)-Example 12
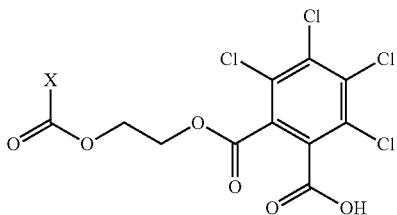
formula (1)-Example 13
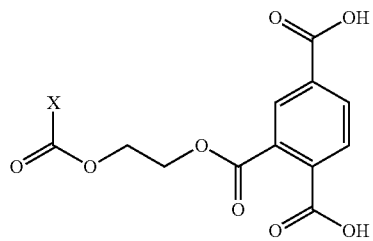
formula (1)-Example 14
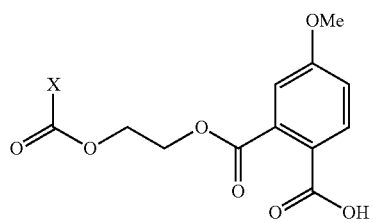

formula (1)-Example 15
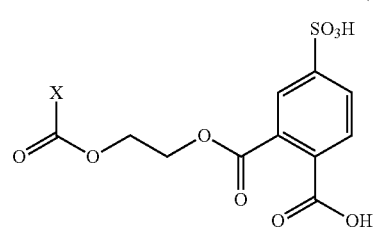
formula (1)-Example 16
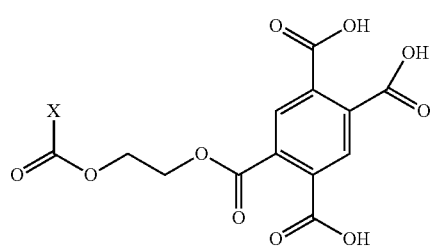
formula (1)-Example 17
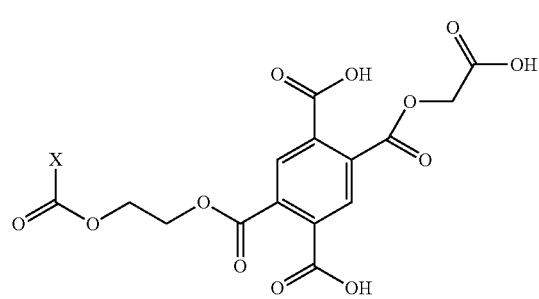
formula (1)-Example 18
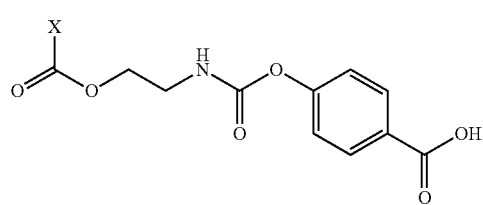
formula (1)-Example 19
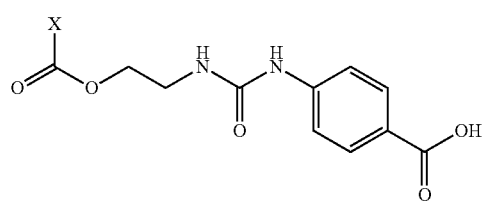
formula (1)-Example 20
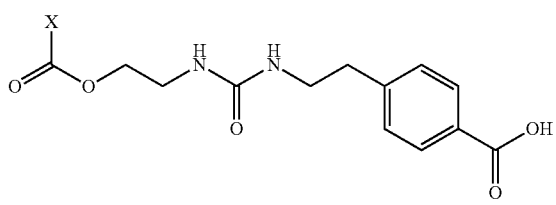
formula (1)-Example 21
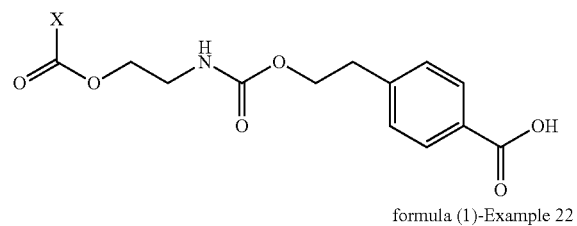
formula (1)-Example 22
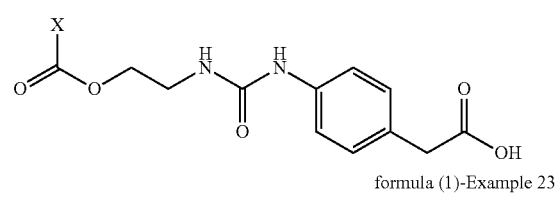
formula (1)-Example 23
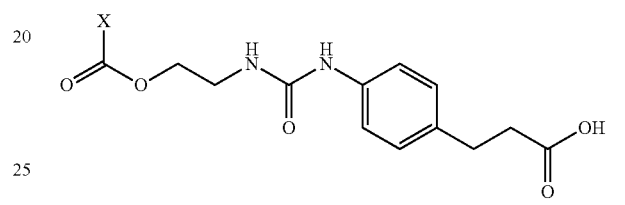
formula (1)-Example 24
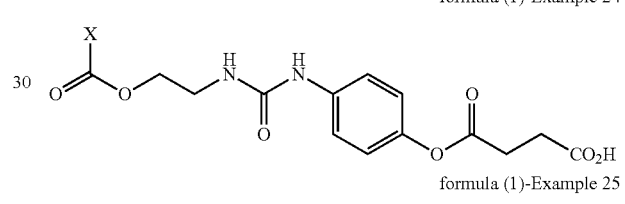
formula (1)-Example 25
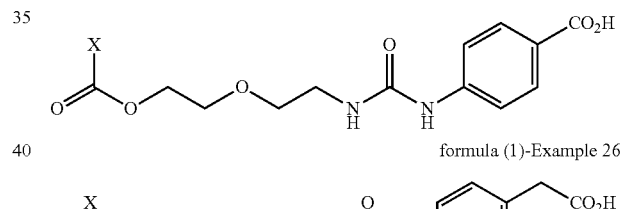
formula (1)-Example 26
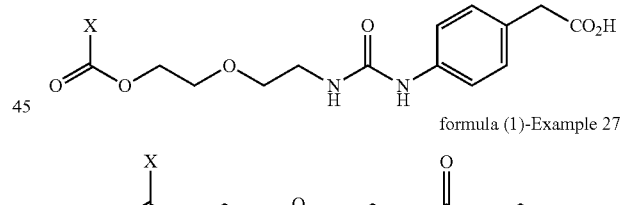
formula (1)-Example 27
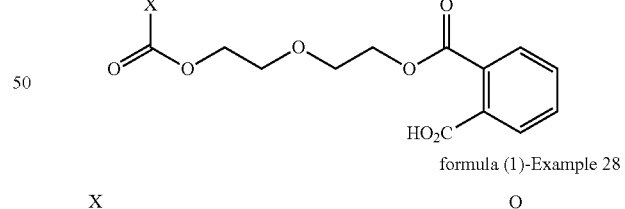
formula (1)-Example 28
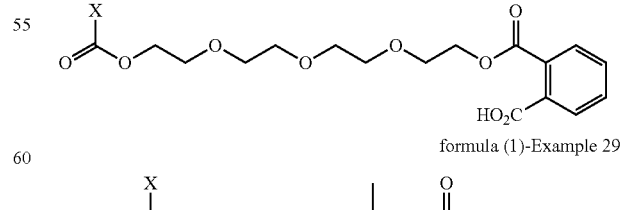
formula (1)-Example 29
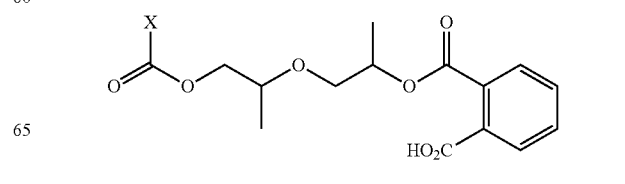

-continued formula (1)-Example 30

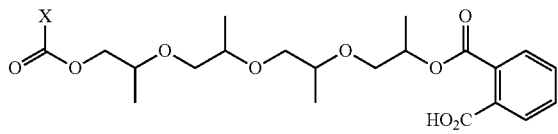

The acid value of the specific resin according to the invention is preferably as high as possible in order to efficiently disperse titanium black having nitrogen atoms. However, if the acid value is too high, interaction among the dispersants may be increased, whereby dispersibility may be decreased. From this point of view, the acid value of the specific resin is preferably from 20 to 300 mg KOH/g, more preferably from 50 to 275 mg KOH/g, and even more preferably from 75 to 250 mg KOH/g.

The acid value of the specific resin may be calculated from, for example, an average content of the acidic group in the specific resin. Furthermore, a resin having a desired acid value may be obtained by changing the content of the monomer unit including an acidic group that constitutes the specific resin.

The partial structure including an acidic group (constituent component) in the (B) specific resin according to the invention is preferably included in an amount of from 5% to 95%, and more preferably from 30% to 70%, in terms of mass, with respect to the total mass of the specific resin. When the content is in this range, dispersibility and dispersion stability of titanium black are improved, and effects of improving developability, suppressing surface roughness during application, or the like may be obtained.

Since the specific resin according to the invention is formed by introducing therein a partial structure containing an acidic group capable of exhibiting alkali-solubility, such as a carboxylic acid group, and the acidic group has excellent mobility because it is linked via a specific linking group, the specific resin may also function as a resin that imparts developability during pattern formation by alkali development.

Accordingly, by introducing a partial structure containing an acidic group to the specific resin that functions as a polymer dispersant in the dispersed composition of the invention, the polymerizable composition of the invention containing this partial structure exhibits alkali solubility derived from the dispersant resin itself, which is essential for dispersing titanium black. As a result, a polymerizable compound that exhibits superior light shielding properties in exposed portions and improved alkali developability in unexposed portions can be obtained.

The polymer structure of the specific resin is not particularly limited, and a linear polymer, a graft polymer, a polymer having an acidic group at the end of a linear polymer, a polymer having an acidic group at the end of a graft polymer, a star polymer, a block polymer and the like may be used. Among them, from the viewpoint of dispersion stability, a graft polymer is preferred.

The main chain structure of the graft polymer is not particularly limited, and a poly(meth)acrylic structure, polyester, polyurethane, polyurea and the like may be used. In view of the solubility in a solvent that is used as a dispersion medium for the polymer, or in view of the convenience of synthesis, a poly(meth)acrylic structure is preferred.

When the specific resin of the invention is a graft polymer, it is preferable that the graft polymer have a structure in which a graft chain is linked to the main chain, in addition to the specific partial structure having an acidic group in a side chain.

The graft chain to be introduced into the specific resin is preferably a graft chain having a number of atoms other than hydrogen atoms in the range of from 40 to 10000. The graft chain in this case represents a chain starting from the atom that constitutes the main chain of the copolymer and has a branched side chain structure directly linked thereto, to the end of the group that is branched from the main chain.

If the graft chain is too long, an effect of steric repulsion is increased and dispersibility is enhanced. However, if the graft chain is too long, the adsorptive power with respect to titanium black is decreased, and dispersibility is decreased. For this reason, the number of atoms other than hydrogen atoms per graft chain in the (B) specific resin (dispersant) used in the invention is preferably from 40 to 10000, the number of atoms more preferably from 50 to 2000, and even more preferably from 60 to 1000.

Examples of the structure of the graft chain that may be used include poly(meth)acrylic, polyester, polyurethane, polyurea, polyamide and polyether, but in order to enhance the interactability between the graft moiety and the solvent, and to thereby increase dispersibility, a graft chain having a poly(meth)acrylic structure, poly(meth)acrylic, polyester or polyether is preferred, and a graft chain having polyester or polyether is more preferred.

In order to introduce a graft chain having such a structure to the specific resin of the invention, a macromonomer having the structure as mentioned above may be used upon synthesis of the specific resin, and a macromonomer and another monomer may be polymerized. The structure of the macromonomer used herein is not particularly limited as long as the structure has a substituent capable of being linked to the polymer main chain part and satisfies the requirements of the invention, but a macromonomer having a reactive double bond is preferably used.

Examples of commercially available macromonomers that may be suitably used for the synthesis of the specific resin include AA-6, AA-10, AB-6, AS-6, AN-6, AW-6, AA-714, AY-707, AY-714, AK-5, AK-30, AK-32 (all trade names, manufactured by Toagosei Co., Ltd.), BLENMER PP-100, BLENMER PP-500, BLENMER PP-800, BLENMER PP-1000, BLENMER 55-PET-800, BLENMER PME-4000, BLENMER PSE-400, BLENMER PSE-1300, and BLENMER 43PAPE-600B (all trade names, manufactured by NOF Corp.). Among these, AA-6, AA-10, AB-6, AS-6, AN-6 (all trade names, manufactured by Toagosei Co., Ltd.), and BLENMER PME-4000 (trade name, manufactured by NOF Corp.)

The graft moiety in the specific resin that is used in the invention preferably includes at least one structural unit represented by the following formula (1), formula (2), formula (3), formula (4) or formula (5).

(1)

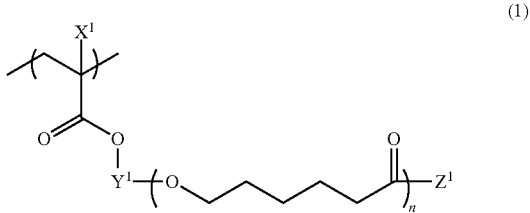

(2)
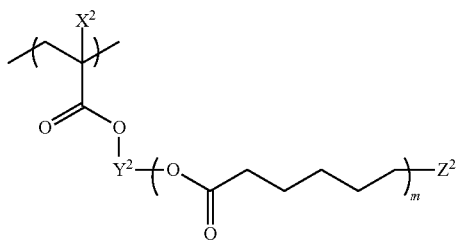

(3)
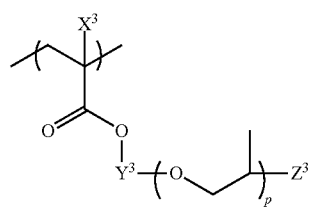

(4)
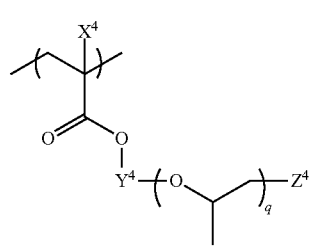

(5)
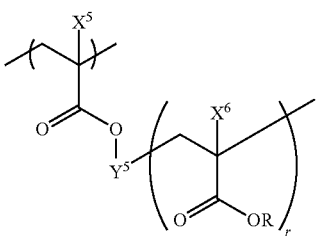

In the formula (1), formula (2), formula (3), formula (4) and formula (5), $X^1$, $X^2$, $X^3$, $X^4$, $X^5$ and $X^6$ each independently represent a hydrogen atom or a monovalent organic group. From the viewpoint of restrictions upon synthesis, $X^1$ to $X^6$ are preferably a hydrogen atom or an alkyl group having 1 to 12 carbon atoms, more preferably a hydrogen atom or a methyl group, and particularly preferably a methyl group.

In the formula (1), formula (2), formula (3), formula (4) and formula (5), $Y^1$, $Y^2$, $Y^3$, $Y^4$ and $Y^5$ each independently represent a divalent linking group, and the structure thereof is not particularly restricted. Specific examples include the following linking groups represented by (y-1) to (y-19). In the following structures, A and B refer to a left-side terminal group and a right-side terminal group in the formula (1) or formula (2), respectively. Among the structures shown below, (y-2) and (y-13) are more preferred in view of convenience of synthesis.

(y-1)
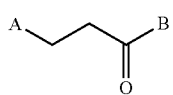

(y-2)
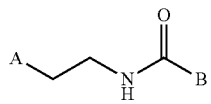

(y-3)
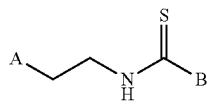

(y-4)

(y-5)
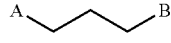

(y-6)
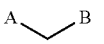

(y-7)
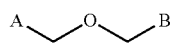

(y-8)
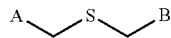

(y-9)

(y-10)
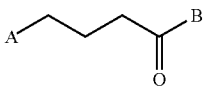

(y-11)
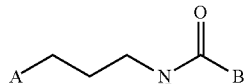

(y-12)
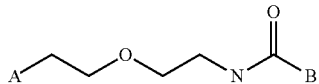

(y-13)
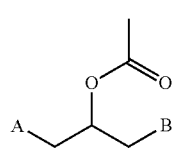

(y-14)
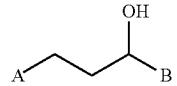

(y-15)
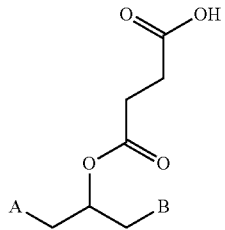

(y-16)
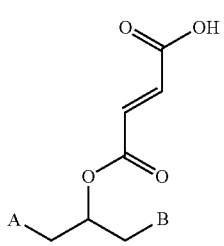

(y-17)
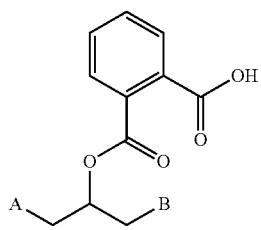

(y-18)
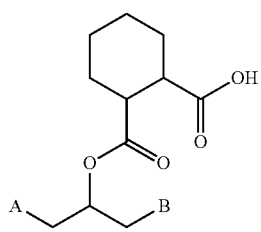

(y-19)
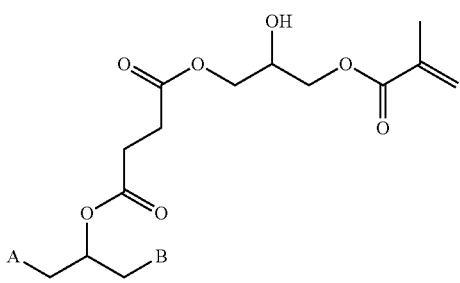

In the formula (1), formula (2), formula (3), formula (4) and formula (5), $Z^1$, $Z^2$, $Z^3$ and $Z^4$ each independently represent a monovalent organic group, and although the structure is not particularly limited, specific examples include a hydroxy group, an alkoxy group, an aryloxy group or a heteroaryloxy group, an alkyl thioether group, an aryl thioether group or a heteroaryl thioether group, and an amino group. Among these, especially from the viewpoint of enhancing dispersibility, and from the viewpoint that it is preferable to have a steric repulsion effect, $Z^1$, $Z^3$ and $Z^4$ are each preferably an alkoxy group having 5 to 24 carbon atoms, and among them, an alkoxy group in which the alkyl moiety has a branched structure having 5 to 24 carbon atoms, or an alkoxy group in which an alkyl moiety having a cyclic structure having 5 to 24 carbon atoms is particularly preferred. $Z^2$ is preferably an alkylcarbonyloxy group having an alkyl moiety having 5 to 24 carbon atoms, and among them, an alkylcarbonyloxy group having a branched alkyl having 5 to 24 carbon atoms, or an alkylcarbonyloxy group having a cyclic alkyl having 5 to 24 carbon atoms is particularly preferred.

In the formula (1), formula (2), formula (3), formula (4) and formula (5), n, m, p, q and r each represent an integer of from 1 to 500.

It is preferable for the specific resin used in the invention to include a structural unit represented by the formula (1), formula (2), formula (3), formula (4) or formula (5) in an amount in the range of from 10% to 90% by mass, and more preferably in the range of 30% to 70% by mass, with respect to the total mass of the specific resin. When the content is within this range, dispersibility of titanium black is increased, whereby favorable developability is achieved even when the specific resin is added to a polymerizable compound.

In the formula (5), R represents a hydrogen atom or a monovalent organic group, and the structure thereof is not particularly limited. Preferable examples include a hydrogen atom, an alkyl group, an aryl group and a heteroaryl group, and more preferable examples include a hydrogen atom and an alkyl group. The structural unit represented by the formula (5) may be used as a mixture including two or more kinds of R having different structures in the molecule.

In the specific resin of the invention, a functional group capable of forming interaction with titanium black may be introduced, in addition to an acidic group and a graft moiety. Examples of the structural unit formed by introducing such a functional group include a structural unit having a basic group, a structural unit having a coordinating group, and a structural unit having reactivity.

Examples of the basic group included in the structural unit having a basic group include a primary amino group, a secondary amino group, a tertiary amino group, a heterocycle containing a nitrogen atom, and an amide group, and particularly preferred is a tertiary amino group having satisfactory adsorptive power with respect to the pigment and having high dispersibility. These groups may be used singly or in combination of two or more kinds The content of the copolymerization component (a structural unit having a basic group), which is suitably used in the specific resin of the invention, is from 0.01% by mole to 50% by mole in the specific resin, and particularly preferably from 0.01% by mole to 30% by mole from the viewpoint of suppressing developability inhibition.

Examples of the structural unit having a coordinating group or reactivity include an acetylacetoxy group, a trialkoxysilyl group, an isocyanate group, an acid anhydride, and an acid chloride, and particularly preferred is an acetylacetoxy group having satisfactory adsorptive power with respect to the pigment and high dispersibility. These groups may be used singly or in combination of two or more kinds. The content of the copolymerization component (a structural unit having a coordinating group or a structural unit having reactivity), which is suitably used in the specific resin of the invention, is from 0.5% by mole to 50% by mole in the specific resin, and particularly preferably from 1% by mole to 30% by mole from the viewpoint of suppressing developability inhibition.

The content of the functional group capable of interacting with titanium black, such as a functional group of a monomer having an acidic group or the like, is preferably from 0.05 to 90% by mass, more preferably from 1.0 to 80% by mass, and even more preferably from 10 to 70% by mass, based on the specific resin, from the viewpoint of interaction with titanium black, dispersion stability and penetrability with respect to a developer.

The specific resin contained in the dispersed composition of titanium black according to the invention may further contain other structural units having various functions, for example, a structural unit having a functional group which has affinity to the solvent as a dispersion medium used in the specific resin, as a copolymerization component, in addition to the structural unit as mentioned above and the functional group capable of interacting with titanium black, for the purpose of enhancing the performances such as image strength, as long as the other structural units do not impair the effects of the invention.

Examples of the copolymerization component that can be copolymerized in the specific resin according to the invention include a radical polymerizable compound selected from acrylic acid esters, methacrylic acid esters, styrenes, acrylonitriles, methacrylonitriles and the like.

Specific examples include alkyl acrylate, alkyl methacrylate, acrylamides, styrenes such as styrene or alkylstyrene, acrylonitrile, and methacrylonitrile.

Among these radical polymerizable compounds, methacrylic acid esters, acrylamides, methacrylamides and styrenes are suitably used.

The above compounds may have various types of substituents, and the substituents are not particularly limited.

The copolymerization component may be used singly, or in combination of two or more kinds The content of the copolymerization component (radical polymerizable compound), which is suitably used in the dispersant (specific resin), is from 0% by mole to 90% by mole, and particularly preferably from 0% by mole to 60% by mole. When the content is within the range mentioned above, satisfactory pattern formation can be achieved.

Examples of the solvent used in the synthesis of the specific resin include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethyl sulfoxide, toluene, ethyl acetate, methyl lactate, and ethyl lactate. These solvents may be used singly, or as mixtures of two or more kinds.

Specific examples of the (B) specific resin (dispersant) used in the dispersed composition of the invention include the following exemplary compound 1 to exemplary compound 50.

Exemplary Compound 1

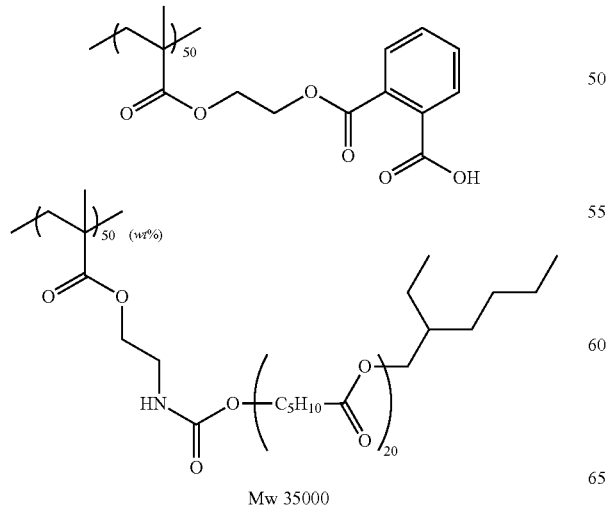

Mw 35000

-continued

Exemplary Compound 2

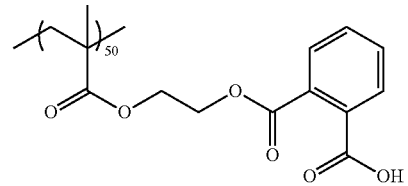

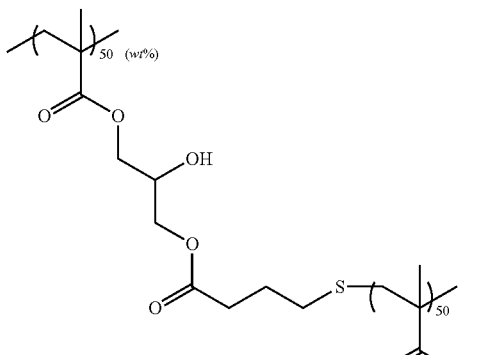

Mw 55000

Exemplary Compound 3

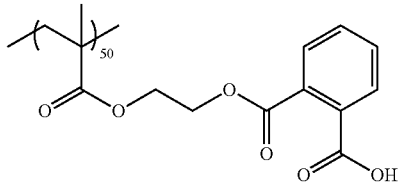

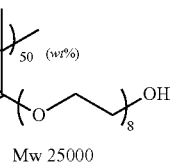

Mw 25000

Exemplary Compound 4

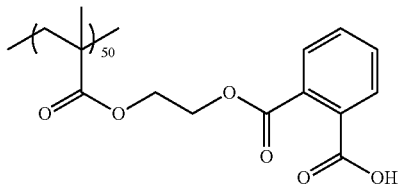

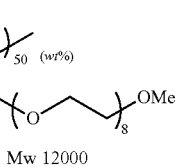

Mw 12000

Exemplary Compound 5

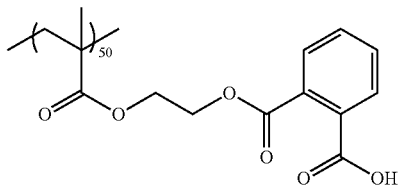

-continued
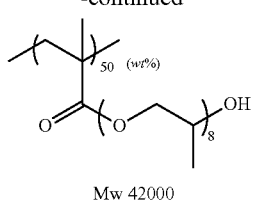
Mw 42000
Exemplary Compound 6
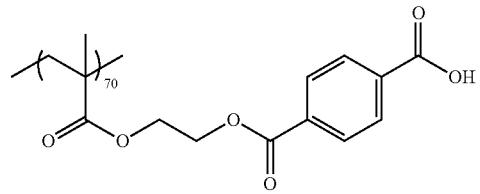
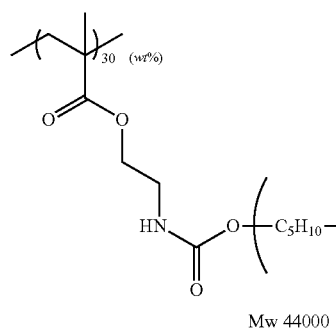
Mw 44000
Exemplary Compound 7
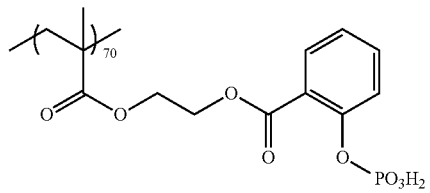
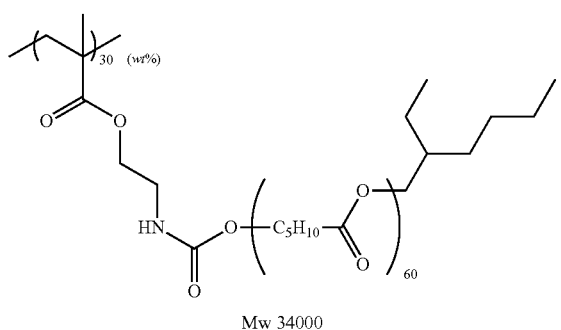
Mw 34000
Exemplary Compound 8
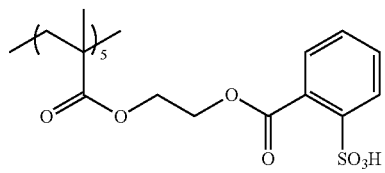
-continued
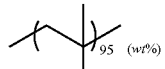
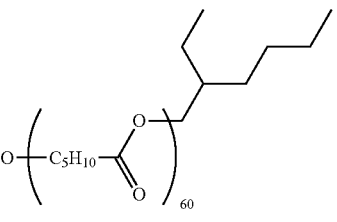
Mw 55000
Exemplary Compound 9
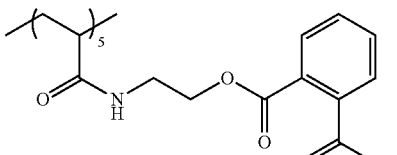
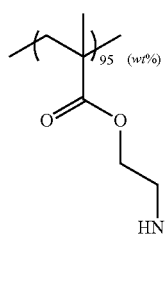
Mw 55000
Exemplary Compound 10
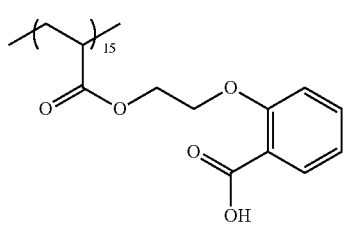
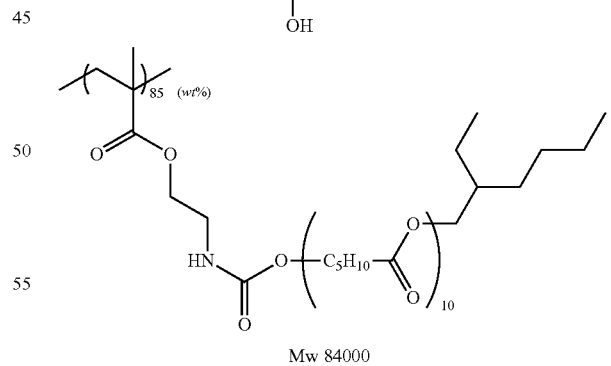
Mw 84000
Exemplary Compound 11
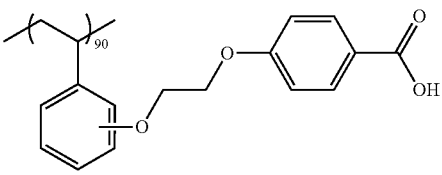

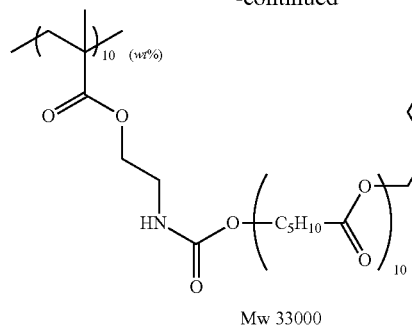
Mw 33000
Exemplary Compound 12
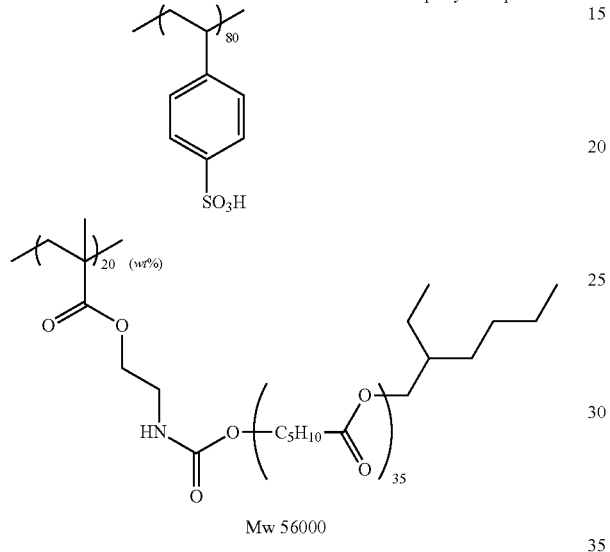
Mw 56000
Exemplary Compound 13
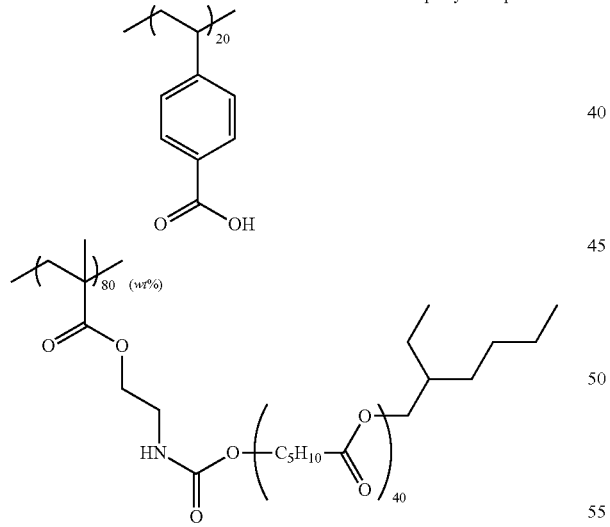
Mw 33000
Exemplary Compound 14
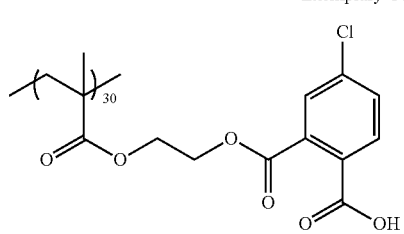
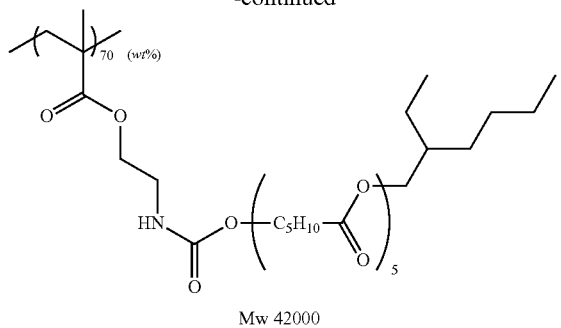
Mw 42000
Exemplary Compound 15
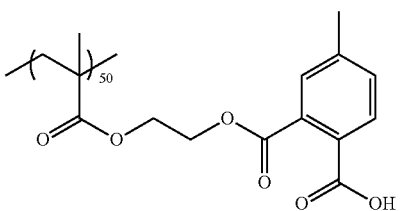
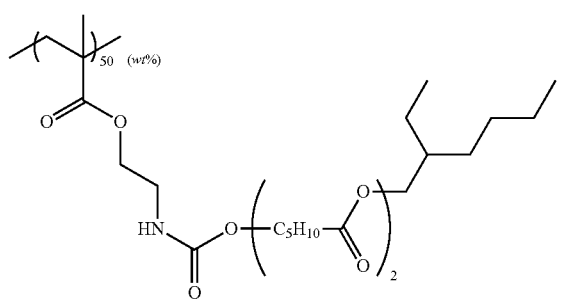
Mw 42000
Exemplary Compound 16
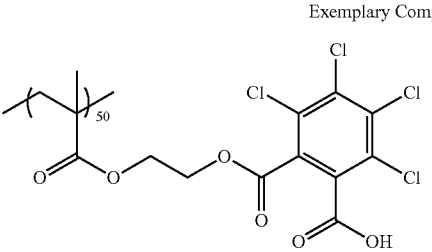
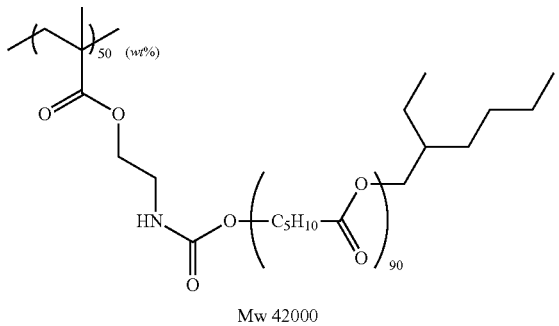
Mw 42000

-continued
Exemplary Compound 17
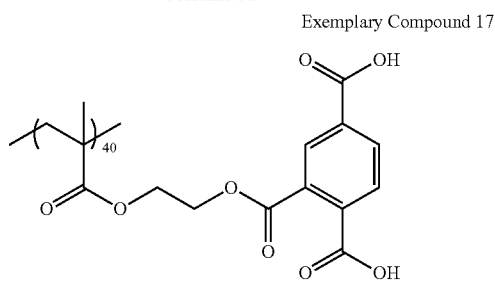
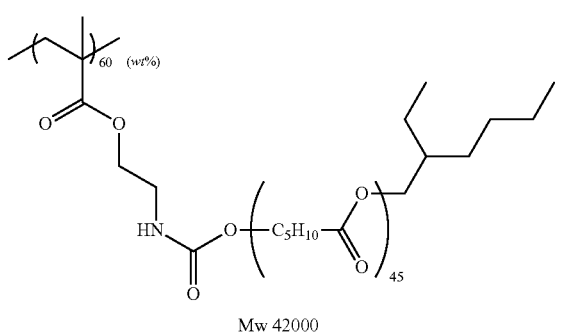
Mw 42000
Exemplary Compound 18
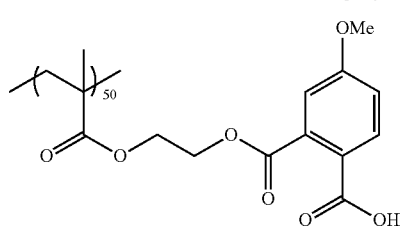
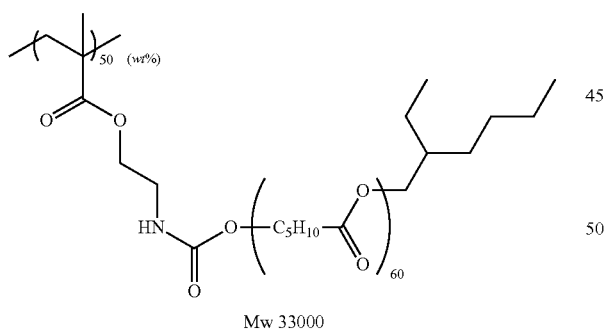
Mw 33000
Exemplary Compound 19
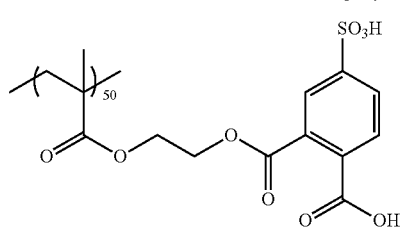
-continued
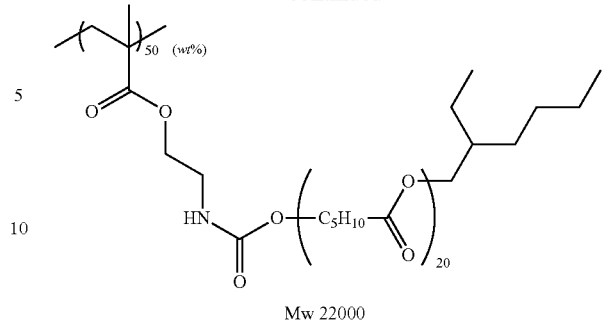
Mw 22000
Exemplary Compound 20
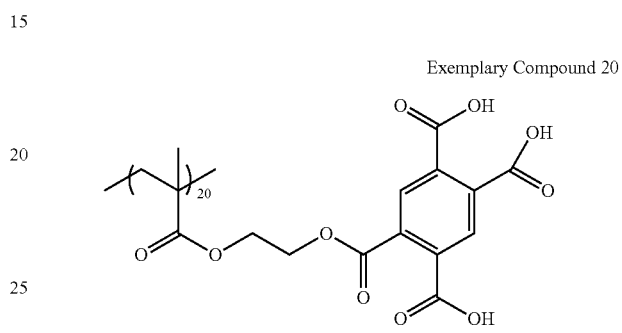
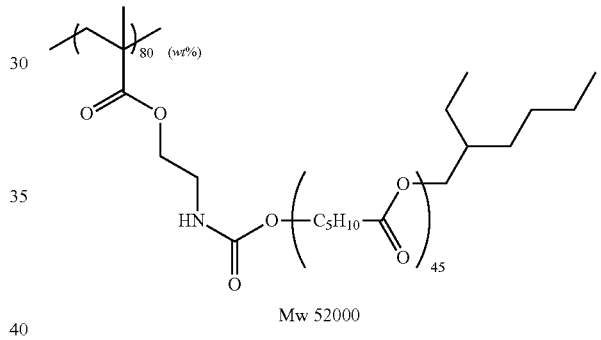
Mw 52000
Exemplary Compound 21
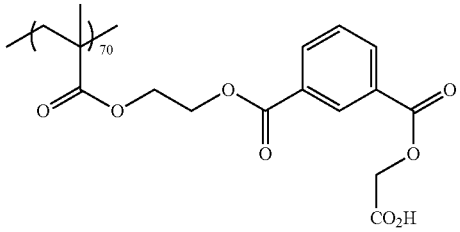
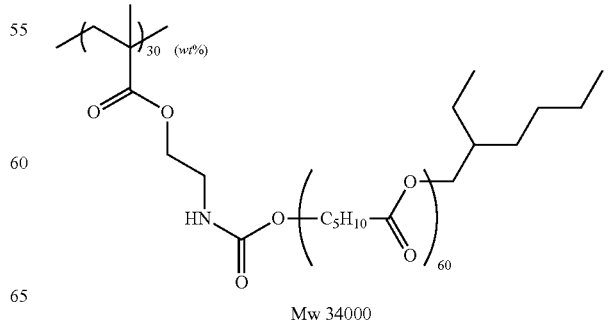
Mw 34000

Exemplary Compound 22
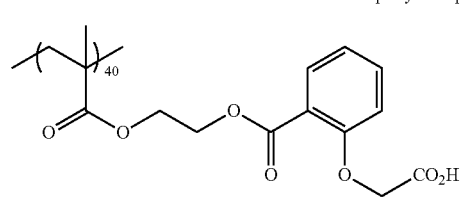
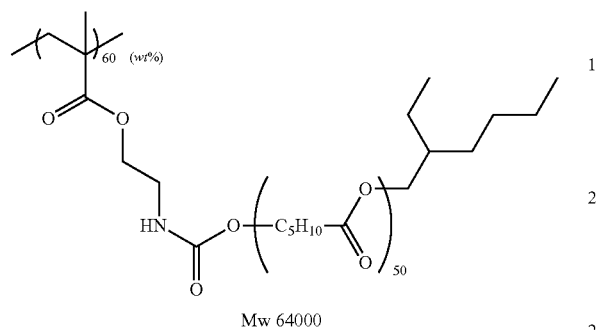
Mw 64000
Exemplary Compound 23
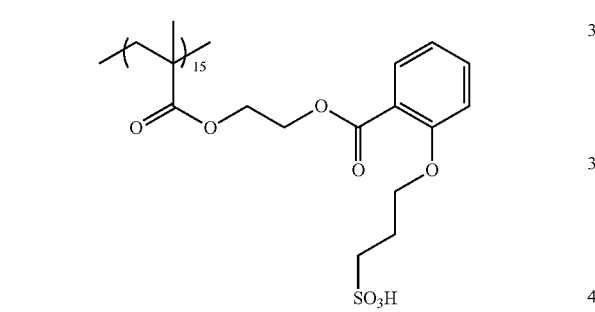
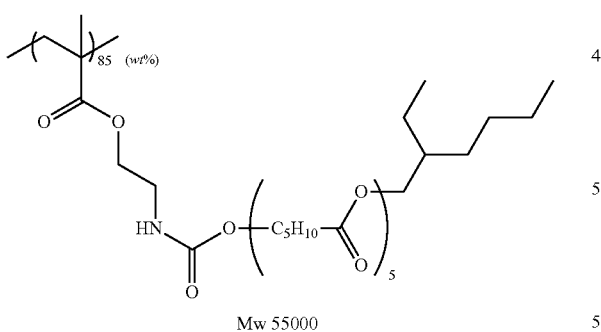
Mw 55000
Exemplary Compound 24
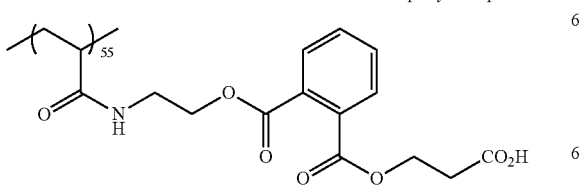
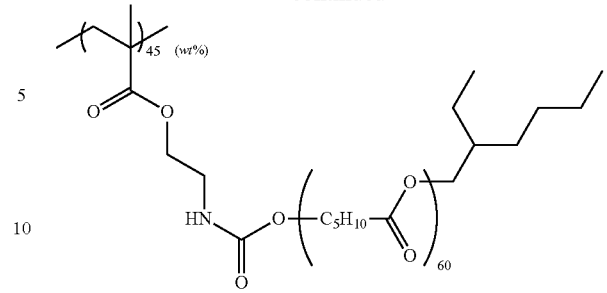
Mw 45000
Exemplary Compound 25
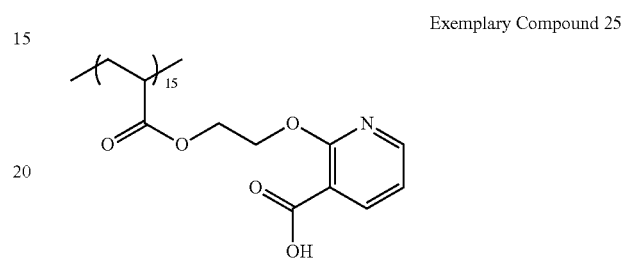
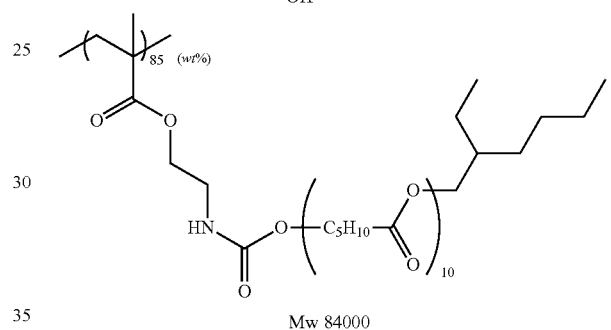
Mw 84000
Exemplary Compound 26
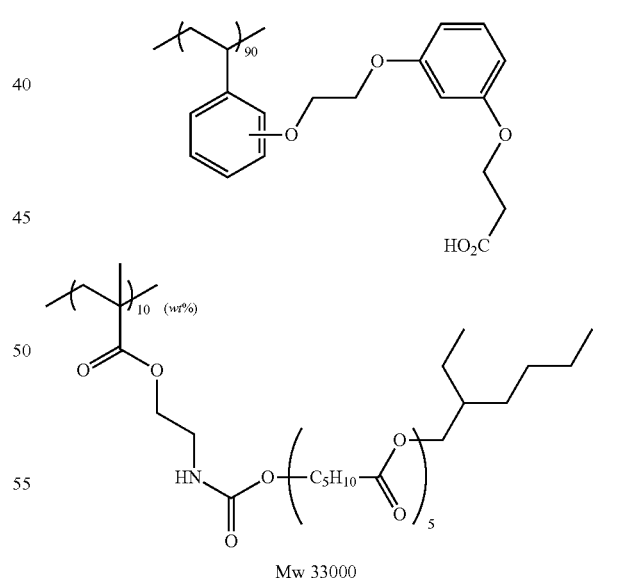
Mw 33000
Exemplary Compound 27
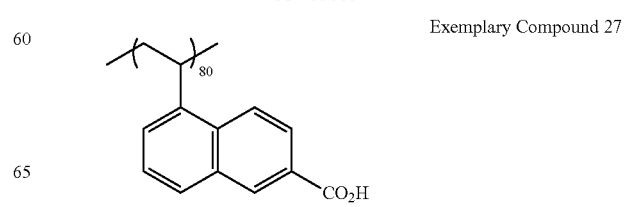

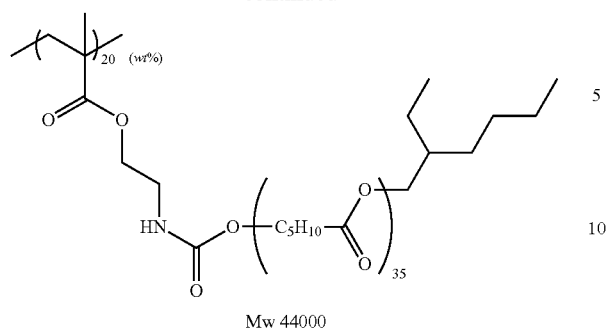
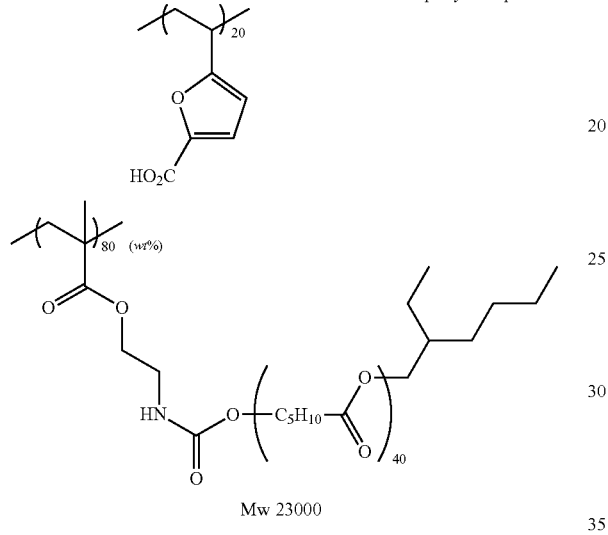
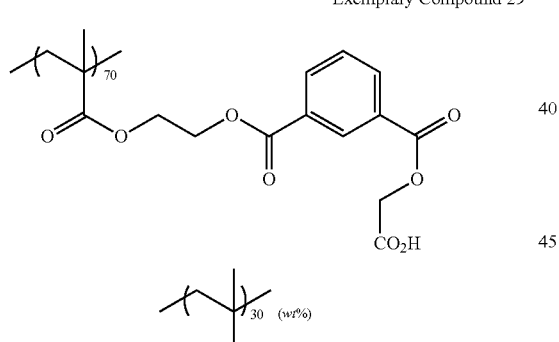
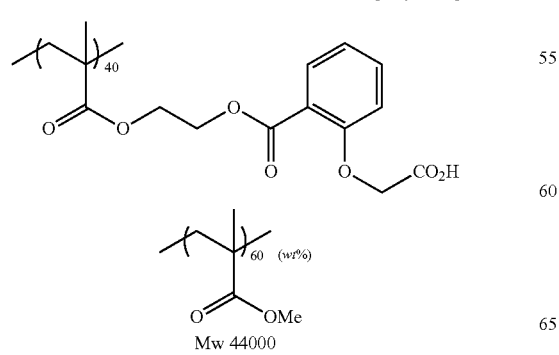
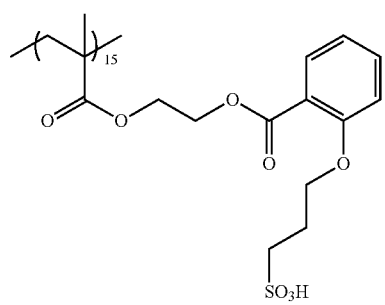
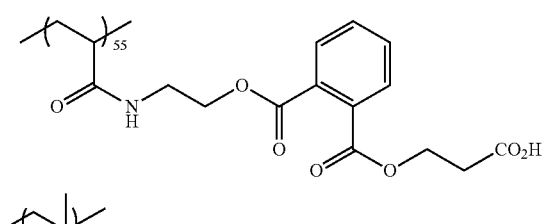
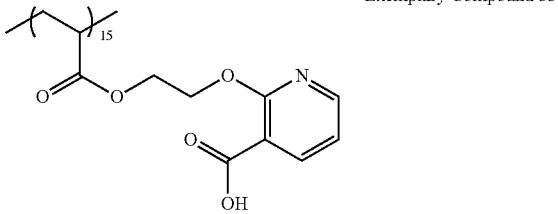
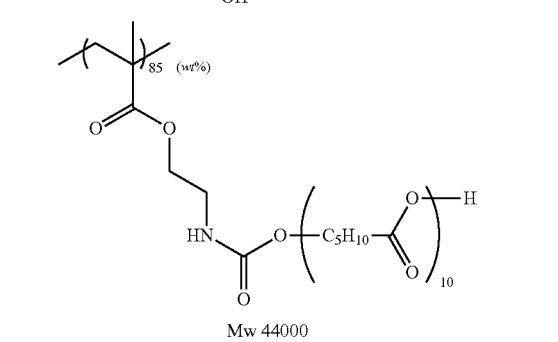

Exemplary Compound 34
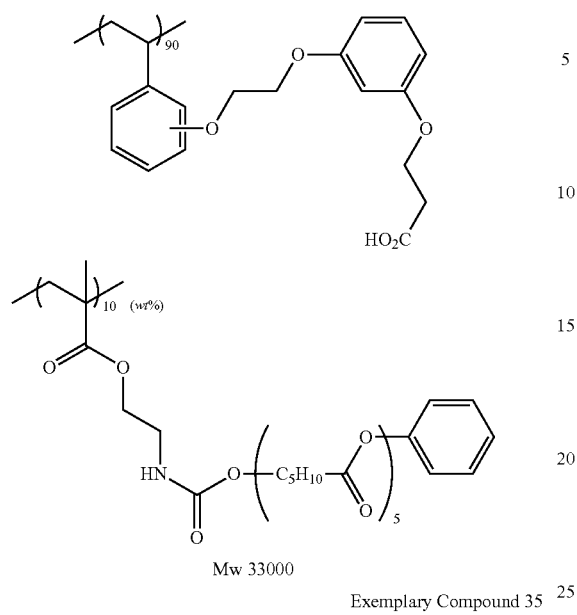
Mw 33000
Exemplary Compound 35
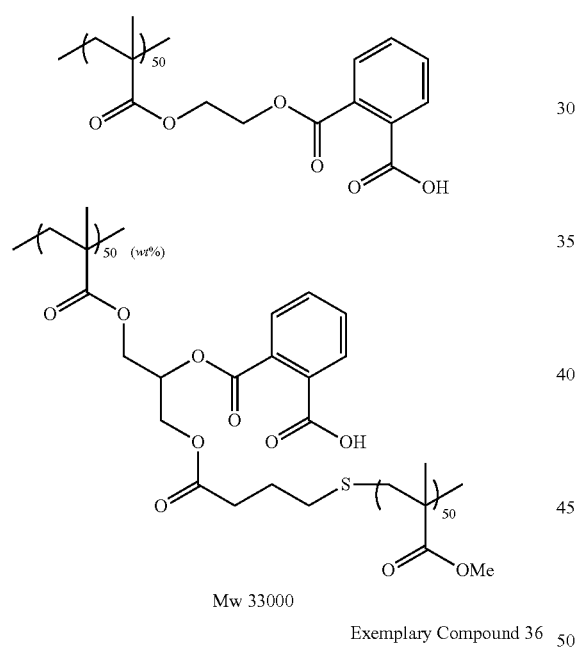
Mw 33000
Exemplary Compound 36
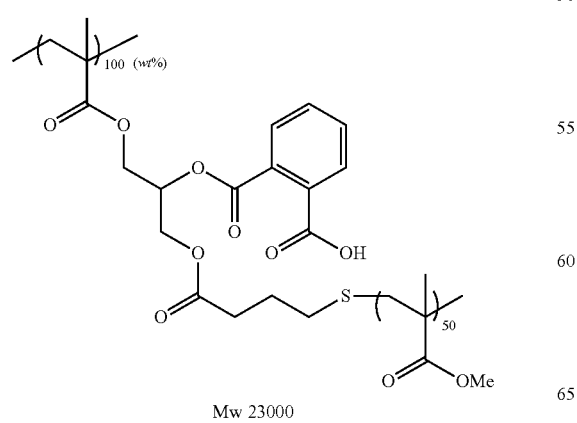
Mw 23000
Exemplary Compound 37
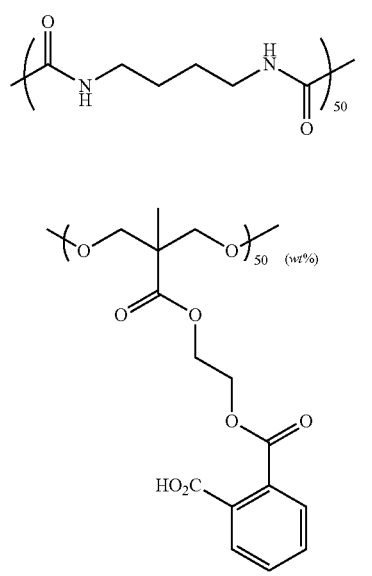
Mw 55000
Exemplary Compound 38
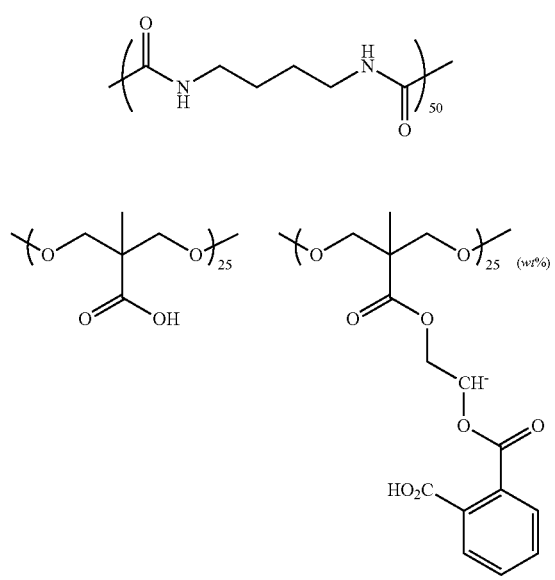
Mw 35000
Exemplary Compound 39
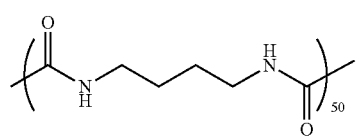

-continued
Exemplary Compound 40
Exemplary Compound 41
Exemplary Compound 42
-continued
Exemplary Compound 43
Exemplary Compound 44
Exemplary Compound 45
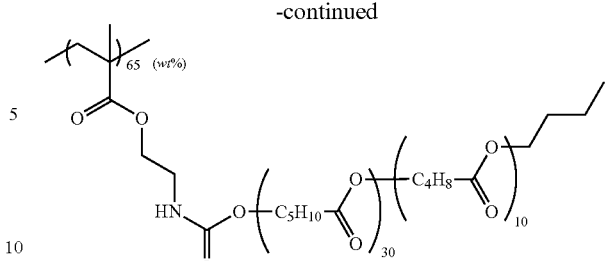
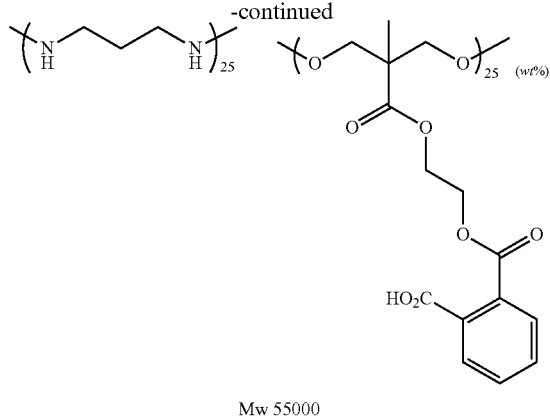

-continued

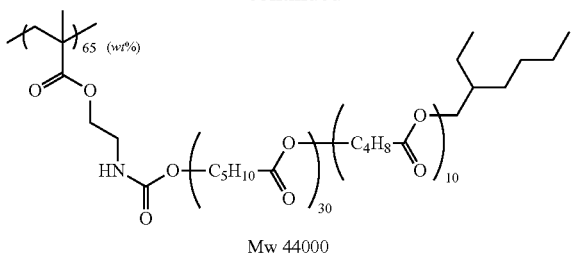

Mw 44000

Exemplary Compound 46

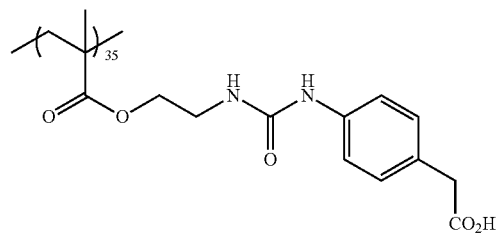

Mw 44000

Exemplary Compound 48

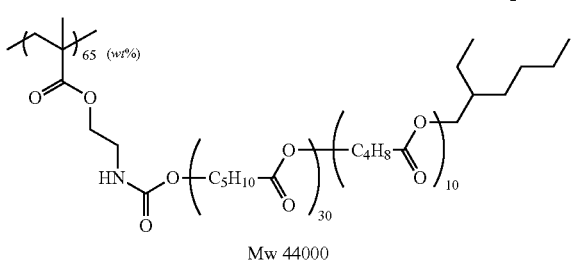

Mw 24000

Exemplary Compound 49

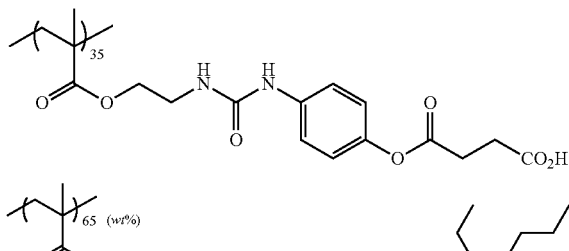

Mw 34000

-continued

Exemplary Compound 50

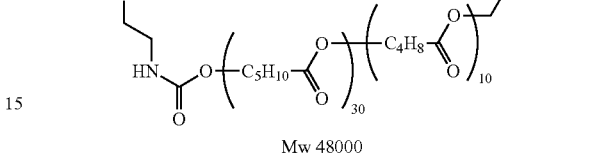

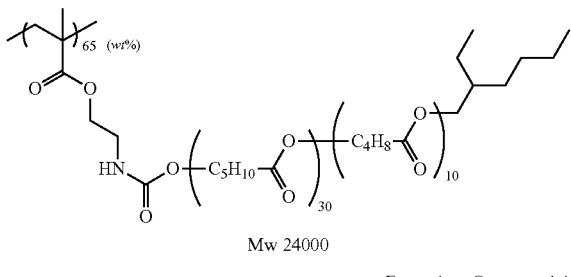

Mw 48000

The weight average molecular weight of the (B) specific resin according to the invention is preferably from 10,000 to 300,000, more preferably from 15,000 to 200,000, even more preferably from 20,000 to 100,000, and particularly preferably from 25,000 to 50,000, from the viewpoint of suppressing exfoliation of a pattern during development, and achieving developability. The weight average molecular weight of the specific resin may be measured by, for example, gel permeation chromatography (GPC).

In the dispersed composition, this specific resin is a dispersing resin that imparts dispersibility to titanium black, and since the specific resin has excellent dispersibility and compatibility with a solvent due to a graft chain, the resin can impart favorable dispersibility and dispersion stability with time to titanium black. Furthermore, when the specific resin is used in a polymerizable composition, since the specific resin has affinity with a solvent, a polymerizable compound or other resins that may be used in combination, generation of residues during alkali development can be suppressed.

The content of the (B) specific resin (dispersant) with respect to the total solid content of the dispersed composition of the invention is preferably in the range of from 0.1 to 50% by mass, more preferably in the range of from 1 to 40% by mass, and even more preferably in the range of from 5 to 20% by mass, from the viewpoint of dispersibility and dispersion stability.

—Other Resins—

The dispersed composition of the invention may contain a resin other than the specific resin (hereinafter, also referred to as "other resin(s)"), for the purpose of adjusting the dispersibility of titanium black.

Examples of the other resins that may be used in the invention include a polymer dispersant (for example, polyamideamine and salts thereof, polycarboxylic acid and salts thereof, a high molecular weight unsaturated acid ester, a modified polyurethane, a modified polyester, a modified poly(meth)acrylate, a (meth)acrylic copolymer, naphthalenesulfonic acid-formalin condensate), a polyoxyethylene alkyl phosphoric acid ester, a polyoxyethylene alkyl amine, an alkanolamine, and pigment derivatives.

These other resins may be further classified into a linear polymer, a terminal-modified polymer, a graft polymer, and a block polymer.

The other resins adsorb to the surface of titanium black or the surface of the pigment that may be optionally used as desired, and functions to prevent re-aggregation. Therefore, a terminal-modified polymer, a graft polymer and a block polymer, which are polymers having an anchoring site to the pigment surface, may be mentioned as preferable structures.

On the other hand, the other resins also have an effect of promoting adsorption of the dispersing resin by modifying the pigment surface.

The other resins also preferably have an aromatic ring, and in which case the other resins may interact with the specific resin and enhance dispersibility.

Specific examples of the other resins that may be used in the invention include "DISPERBYK-101 (polyamide amine phosphate), 107 (carboxylic acid ester), 110 (copolymer containing an acidic group), 130 (polyamide), 161, 162, 163, 164, 165, 166, 170 (high molecular weight copolymers)" and "BYK-P104, P105 (high molecular weight unsaturated polycarboxylic acids)" (trade names, manufactured by BYK Chemie GmbH); "EFKA 4047, 4050, 4010, 4165 (polyurethane-based), EFKA 4330, 4340 (block copolymers), 4400, 4402 (modified polyacrylates), 5010 (polyester amide), 5765 (high molecular weight polycarboxylate), 6220 (fatty acid polyester), 6745 (phthalocyanine derivative) and 6750 (azo pigment derivative)" (trade names, manufactured by EFKA GmbH & CO KG); "AJISPER-PB821, PB822" (trade names, manufactured by Ajinomoto Fine-Techno Co., Inc.); "FLOWREN TG-710 (urethane oligomer)", "POLYFLOW No. 50E, No. 300 (acrylic copolymers)" (trade names, manufactured by Kyoeisha Chemical Co., Ltd.); "DISPARLON KS-860, 873SN, 874, #2150 (fatty acid polyvalent carboxylic acids), #7004 (polyether ester), DA-703-50, DA-705 and DA-725" (trade names, manufactured by Kusumoto Chemicals, Ltd.); "DEMOL RN, N (naphthalenesulfonic acid-formalin polycondensates), MS, C, SN—B (aromatic sulfonic acid-formalin polycondensates)", "HOMOGENOL L-18 (high molecular weight polycarboxylic acid)", "EMULGEN 920, 930, 935, 985 (polyoxyethylene nonyl phenyl ethers)" and "ACETAMIN 86 (stearylamine acetate)" (trade names, manufactured by Kao Corp.); "SOLSPERSE 5000 (phthalocyanine derivative, 22000 (azo pigment derivative), 13240 (polyester amine), 3000, 17000, 27000 (polymers having functional moieties at the chain ends), 24000, 28000, 32000 and 38500 (graft type polymers)" (trade names, manufactured by Lubrizol Corp.); "NIKKOL T106 (polyoxyethylene sorbitan monooleate) and MYS-IEX (polyoxyethylene monostearate)" (trade names, manufactured by Nikko Chemicals Co., Ltd.).

These other resins may be used singly, or two or more kinds may be used in combination.

<(C) Solvent>

The dispersed composition of the invention may use various kinds of organic solvents as a dispersion medium for titanium black.

Examples of the solvent used herein include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methxoypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, and ethyl lactate.

These solvents may be used singly or as a mixture. The solid concentration with respect to the solvent is preferably from 2 to 60% by mass.

The dispersed composition of the invention is preferably produced by dispersing a mixed liquid containing titanium black, a dispersant and a solvent, by a multistage dispersion method. The multistage dispersion method refers to a method of dispersing by adding a dispersing resin in multiple steps including the beginning of dispersion and in the middle of dispersion. In particular, from the viewpoint of production stability, it is preferable to disperse the mixed liquid by a two-stage dispersion method. The two-stage dispersion method refers to a method including performing an initial dispersion treatment (hereinafter, also referred to as a "first-stage dispersion treatment"), and then performing a further dispersion treatment by adding a further dispersant to the dispersion obtained by the first stage dispersion treatment (hereinafter, also referred to as a "second-stage dispersion treatment").

In the invention, the dispersion process of titanium black can be performed by adding a dispersant in multiple steps, rather than adding the total amount of the dispersant at once irrespective of the extent of the dispersion, in consideration of the progress of dispersion of titanium black (for example, the timing at which the pace of decrease in particle size turns to decrease during a process in which the particle size decreases when a dispersant is added to a mixed solution at the beginning of the dispersion treatment). In this way, aggregation that tends to occur during a process of finely dispersing can be effectively suppressed, and an effect of improving dispersibility by the addition of a dispersant can be enhanced. As a result, a precipitation phenomenon of titanium black can be prevented and a dispersed composition that exhibits superior dispersion stability as compared with a dispersed composition produced by a conventional dispersion treatment.

The "multistage dispersion treatment" according to the invention refers to a dispersion treatment in which the ratio of the dispersion (D) to the titanium black (P) (D/P ratio) increases in each and every stage, such as a first stage, a second stage and so on, and a dispersion treatment in which the D/P ratio does not increase in each and every stage of dispersion treatment is not included in the multistage dispersion treatment. For example, a treatment including stopping a dispersion treatment and starting a dispersion treatment after an interval but at the same D/P ratio, and a treatment including performing a dispersion treatment by changing the type of dispersing machine, the type or the amount of the beads etc. but not changing the D/P ratio, in which the dispersion treatment is not performed as a single continuous process, is not included in the multistage dispersion treatment according to the invention.

<First Stage Dispersion Treatment>

The first stage dispersion treatment is a dispersion treatment in which a mixed liquid containing titanium black, a dispersant and a solvent is subjected to a dispersion treatment.

In the first stage dispersion treatment, the mass ratio of the dispersant (D) to the titanium black (P) [D/P ratio] in the mixed liquid is preferably from 0.05 to 1.00, and more preferably from 0.05 to 0.50. When the mass ratio is adjusted to 1.00 or less so as not to be too high, the dispersion can progress more smoothly, and when the mass ratio is adjusted to 0.05 or greater, dispersion stability can be further improved.

The dispersing apparatus used in the dispersion treatment is not particularly limited, and for example, a dispersing apparatus in which a mixed liquid is repeatedly subjected to a dispersion treatment, such as a circulation dispersing apparatus, may be used. Specific examples of the dispersing apparatus include ULTRA APEX MILL (trade name, manufactured by Kotobuki Industries Co., Ltd.), and DYNO-MILL ECM series (trade name, manufactured by Shinmaru Enterprises Corp.)

The temperature at the time of a dispersion treatment is not particularly limited, and from the viewpoint of dispersion stability, the temperature is preferably from 5° C. to 60° C., and more preferably from 20° C. to 40° C.

It is also preferable to carry out the dispersion treatment using beads. The composition or the size (diameter) of the beads is not particularly limited, and known compositions and diameters may be applied. For example, beads having a diameter of 0.01 mm to 0.10 mm are suitable.

The mass ratio of a solvent to titanium black [solvent/titanium black] in the mixed liquid in the first stage dispersion treatment is preferably from 1.0 to 9.0, and more preferably from 1.0 to 5.0, from the viewpoint of ease of dispersion.

Details of the components including titanium black, a dispersant and a solvent in a mixed liquid, which is an object to be dispersed, will be described later. Furthermore, the mixed liquid may also contain components of a photosensitive resin composition (for example, a resin, a photopolymerization initiator, and a polymerizable compound), which will be described later, in addition to the titanium black, dispersant and solvent.

<Second Stage Dispersion Treatment>

The second stage dispersion treatment is a dispersion treatment in which a dispersant is further added to the dispersion liquid obtained by carrying out a dispersion treatment in the first stage dispersion treatment, and the dispersion liquid is subjected to a further dispersion treatment.

In this dispersion treatment, titanium black is further subjected to a dispersion treatment with all or part of the remainder of the initial dispersant used in the first stage dispersion treatment. The dispersant used in the second stage may be the same or different from the dispersant used in the first stage.

In the second stage dispersion treatment, the mass ratio of the dispersant (D) to the titanium black (P) [D/P ratio] in the mixed liquid is preferably from 0.05 to 1.00, and more preferably from 0.05 to 0.50. When the mass ratio is adjusted to 1.00 or less so as not to be too high, the dispersion treatment can progress smoothly, and when the mass ratio is adjusted to 0.05 or greater, dispersion stability can be further improved.

The timing of adding a dispersant during the second stage dispersion treatment is not particularly limited, but from the viewpoint of achieving an effect of improving the dispersibility as a result of separately adding the dispersant, i.e., suppressing the settling of titanium black, it is preferable to add a dispersant when the change in the weight average particle size of titanium black became 10 nm/pass or less, or thereafter. In the second stage dispersion treatment, the dispersant may be added at one time, or may be added separately in two or more steps.

Here, the term "10 nm/pass or less" refers to that the amount of change in the weight average particle size per pass in the dispersing apparatus is 10 nm or less. One example of the situation in which the change in the weight average particle size per pass is "10 nm/pass or less" is a state such as described below. Specifically, in a system in which the weight average particle size decreases by the pass in an early stage from the beginning of a dispersion treatment but the change in the weight average particle size per pass becomes smaller as the dispersion proceeds, a state in which the amount of change in the weight average particle size per pass reaches 10 nm or less is referred to as "10 nm/pass or less".

The term "pass" refers to the number of times for the entire amount of dispersion liquid to pass via the dispersing apparatus. For example, when 25 liters of a mixed liquid is subjected to a dispersion treatment at a flow rate of 5 L/h in a dispersing apparatus, a dispersion treatment carried out for 5 hours corresponds to "one pass". The number of passes is determined by the following expression (A).

Number of passes=(flow rate [L/h]×treatment time [h])/amount of liquid to be treated [L]    Expression (A)

In the second dispersion treatment, a solvent may be added together with the dispersant. The solvent to be added may be of the same type as the solvent in the mixed liquid used in the first stage dispersion treatment, or may be of a different type. Furthermore, in the second stage dispersion treatment, components used in a photosensitive resin composition (for example, a resin, a photopolymerization initiator, and a polymerizable compound), which will be described later, may be added in addition to the dispersant and the solvent.

Preferable conditions (apparatus, temperature, and others) for the second stage dispersion treatment are the same as the preferable conditions for the first stage dispersion treatment. However, the conditions for the first stage dispersion treatment and the conditions for the second stage dispersion treatment may be the same or different from each other.

The dispersed composition (hereinafter, also referred to as a "final dispersed composition") of the invention is a composition that can be obtained via the first stage dispersion treatment and the second stage dispersion treatment (if necessary, a third or further stage dispersion treatment and other treatments).

The total content of the solvent in the final dispersed composition thus obtained is preferably from 30 to 95% by mass, more preferably from 40 to 90% by mass, and particularly preferably from 50 to 80% by mass, with respect to the total mass of the final dispersed composition.

Furthermore, the content ratio of the dispersant (D) to the titanium black (P) (D/P ratio) of the final dispersed composition thus obtained is preferably from 0.2 to 1.2.

The content of titanium black in the final dispersed composition thus obtained is preferably from 5 to 80% by mass, more preferably from 5 to 50% by mass, and particularly preferably from 5 to 30% by mass, with respect to the total mass of the composition.

[Polymerizable Composition]

The polymerizable composition of the invention is obtained by further adding (D) a polymerizable compound, (E) a polymerization initiator and the like to the dispersed composition of the invention containing (A) titanium black and (B) a specific resin. Since the polymerizable composition of the invention exhibits excellent dispersion stability of titanium black, cures with high sensitivity when energy is applied by light exposure or the like, and has satisfactory developability due to the function of the (B) specific resin, a uniform and highly precise pattern may be formed.

In the following, details of the polymerizable composition of the invention will be described. The details of the (A) titanium black and the (B) specific resin used in the polymerizable composition of the invention are described above with regard to the dispersed composition.

<(D) Polymerizable Compound>

The (D) polymerizable compound that may be used in the polymerizable composition of the invention is an addition polymerizable compound having at least one ethylenically unsaturated double bond, and is selected from compounds having at least one, and preferably two or more, ethylenically unsaturated bonds at its terminal end. Such compounds are widely known in the pertinent industrial field, and may be used in the invention without particular limitations.

Among them, a compound having at least one ethylenically unsaturated group capable of addition polymerization and having a boiling point of 100° C. or higher at normal pressure is preferred, and from the viewpoint of enhancing the curability, a tetrafunctional or higher-functional acrylate compound is more preferred.

Examples of the compound having at least one ethylenically unsaturated group capable of addition polymerization and having a boiling point of 100° C. or higher at normal pressure include monofunctional acrylates or methacrylates such as polyethylene glycol mono(meth)acrylate, polypropylene glycol mono(meth)acrylate and phenoxyethyl (meth)acrylate; and polyfunctional acrylates or methacrylates such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol hexa(meth)acrylate, hexanediol (meth)acrylate, trimethylolpropane tri(acryloyloxypropyl) ether, tri(acryloyloxyethyl) isocyanurate, compounds obtained by adding ethylene oxide or propylene oxide to a polyfunctional alcohol such as glycerin or trimethylolethane and then (meth)acrylating the same, compounds obtained by poly(meth)acrylating pentaerythritol or dipentaerythritol, the urethane acrylates described in Japanese Examined Patent Application Publication (JP-B) No. 48-41708, JP-B No. 50-6034 and JP-A No. 51-37193, the polyester acrylates described in JP-A No. 48-64183, JP-B No. 49-43191 and JP-B No. 52-30490, and epoxy acrylates obtained from reaction of epoxy resin and (meth)acrylic acid.

Furthermore, the photocurable monomers and oligomers described in Journal of the Adhesion Society of Japan, Vol. 20, No. 7, pp. 300-308, may also be used.

It is also possible to use the compounds obtained by adding ethylene oxide or propylene oxide to a polyfunctional alcohol and then (meth)acrylating the same, which are described in JP-A No. 10-62986 as the formulas (1) and (2) together with the specific examples thereof.

Among them, dipentaerythritol penta(meth)acrylate, dipentaerythritol hexa(meth)acrylate, and structures in which the acryloyl groups of these (meth)acrylates are interrupted by ethylene glycol or propylene glycol residues, are preferred. Oligomers of these compounds may also be used.

Furthermore, urethane acrylates such as those described in JP-B No. 48-41708, JP-A No. 51-37193, JP-B No. 2-32293 and JP-B No. 2-16765; and urethane compounds having an ethylene oxide-based skeleton such as those described in JP-B No. 58-49860, JP-B No. 56-17654, JP-B No. 62-39417 and JP-B No. 62-39418, are also suitable. Moreover, a photopolymerizable composition that exhibits excellent photosensitization speed may be obtained by using an addition polymerizable compound having an amino structure or a sulfide structure in the molecule, such as those described in JP-A No. 63-277653, JP-A No. 63-260909 and JP-A No. 1-105238. Commercially available products include urethane oligomers UAS-10 and UAB-140 (trade names, manufactured by Sanyo-Kokusaku Pulp Co., Ltd.), UA-7200 (trade name, manufactured by Shin Nakamura Chemical Co., Ltd.), DPHA-40H (trade name, manufactured by Nippon Kayaku Co., Ltd.), UA-306H, UA-306T, UA-306I, AH-600, T-600 and AI-600 (trade name, manufactured by Kyoeisha Chemical Co., Ltd.).

Furthermore, ethylenically unsaturated compounds having an acid group are also suitable, and examples of commercially available products include TO-756, which is a carboxyl group-containing trifunctional acrylate, and TO-1382, which is a carboxyl group-containing pentafunctional acrylate (trade names, manufactured by Toagosei Co., Ltd.).

The polymerizable compound may be used singly, or two or more kinds may be used in combination. In the case of combining two or more kinds, a combination of a polyfunctional ethylenically unsaturated compound and an ethylenically unsaturated compound having an acid group is suitably used from the viewpoint of curing sensitivity and developability, and a combination of dipentaerythritol hexa(meth)acrylate and TO-756 (trade name, manufactured by Toagosei Co., Ltd.), a combination of dipentaerythritol hexa(meth)acrylate and TO-1382 (trade name, manufactured by Toagosei Co., Ltd.), and the like, are preferably used. Furthermore, from the viewpoint of enhancing adhesiveness, a combination of a polyfunctional ethylenically unsaturated compound and an ethylenically unsaturated compound having a group capable of hydrogen bonding is also suitably used, and for example, a combination of dipentaerythritol hexa(meth)acrylate and UA-7200 (trade name, manufactured by Shin Nakamura Chemical Co., Ltd.) may also be preferably used.

The content of the (D) polymerizable compound in the total solid content of the polymerizable composition of the invention is preferably in the range of from 5% by mass to 90% by mass, more preferably in the range of from 10% by mass to 85% by mass, and even more preferably in the range of from 20% by mass to 80% by mass.

It is preferable when the content is within this range, since both adhesion sensitivity and developability are satisfactory without weakening the color hue.

<(E) Polymerization Initiator>

The (E) polymerization initiator used in the invention is a compound that decomposes by light, and initiates and promotes the polymerization of the (D) polymerizable compound, and a compound having an absorption in the wavelength region of from 300 nm to 500 nm is preferred. Furthermore, the polymerization initiator may be used singly, or two or more kinds thereof may be used in combination.

Preferable examples of the (E) polymerization initiator include acetophenone-based, ketal-based, benzophenone-based, benzoin-based, benzoyl-based, and xanthone-based compounds, active halogen compounds (triazine-based, oxadiazole-based, and coumarin-based compounds), acridine-based, biimidazole-based and oxime ester-based compounds. For example, active halogen compounds such as the halomethyloxadiazole described in JP-B No. 57-6096, and the halomethyl-s-triazine described in JP-B No. 59-1281 and JP-A No. 53-133428; ketals and acetals described in U.S. Pat. No. 4,318,791 and EP 88050 A; aromatic carbonyl compounds such as benzoin alkyl ether; aromatic ketone compounds such as benzophenones described in U.S. Pat. No. 4,199,420; (thio)xanthone or acridine compounds described in French Patent No. 2456741; coumarin-based or biimidazole-based compounds described in JP-A No. 10-62986; and sulfonium-organic boron complexes described in JP-A No. 8-015521.

As the photopolymerization initiator, specifically, suitable examples of the active halogen photopolymerization initiators (triazine-based, oxadiazole-based and coumarin-based compounds) include 2,4-bis(trichloromethyl)-6-p-methoxyphenyl-s-triazine, 2,4-bis(trichloromethyl)-6-p-methoxystyryl-s-triazine, 2,4-bis(trichloromethyl)-6-biphenyl-s-triazine, 2,4-bis(trichloromethyl)-6-(p-methylbiphenyl)-s-triazine, p-hydroxyethoxystyryl-2,6-di(trichloromethyl)-s-triazine, methoxystyryl-2,6-di(trichloromethyl)-s-triazine, 4-benzoxolane-2,6-di(trichloromethyl)-s-triazine, 4-(o-bromo-p-N,N-di(ethoxycarbonylamino)-phenyl)-2,6-di (chloromethyl)-s-triazine, 2-trichloromethyl-5-styryl-1,3,4- oxodiazole, 2-trichloromethyl-5-(cyanostyryl)-1,3,4-oxodiazole, 3-methyl-5-amino((s-triazin-2-yl)amino)-3-phenylcoumarin, and 3-chloro-5-diethylamino-((s-triazin-2-yl)amino)-3-phenylcoumarin.

Examples of the oxime ester compounds include the compounds described in J.C.S. Perkin II (1979), 1653-1660; J.C.S. Perkin II (1979), 156-162; Journal of Photopolymer Science and Technology (1995), 202-232; and JP-A No. 2000-66385; and the compounds described in JP-A No. 2000-80068 and Japanese Patent Application National Publication (Laid-Open) No. 2004-534797.

Furthermore, 1-phenyl-1,2-propanedione-2-(o-ethoxycarbonyl)oxime, O-benzoyl-4'-(benzomercapto)benzoyl hexyl ketoxime, 2,4,6-trimethylphenylcarbonyldiphenylphosphonyl oxide, hexafluorophosphorotrialkylphenylphosphonium salts, and the like are suitable.

Examples of other photopolymerization initiators that may be used in the invention include vicinal polyketaldonyl compounds, α-carbonyl compounds, acyloin ether, aromatic acyloin compounds substituted with α-hydrocarbons, polynuclear quinone compounds, a combination of triarylimidazolyl dimer/p-aminophenyl ketone, benzothiazole-based compounds/trihalomethyl-s-triazine-based compounds, and the oxime ester compounds described in JP-A No. 2000-66385.

As the (E) polymerization initiator used in the invention, an oxime compound is preferred from the viewpoint of sensitivity, stability over time and coloration upon post-heating.

Examples of the oxime compound include the compounds described in J. C. S. Perkin II (1979), 1653-1660; J. C. S. Perkin II (1979), 156-162; Journal of Photopolymer Science and Technology (1995), 202-232; and JP-A No. 2000-66385; and the compounds described in JP-A No. 2000-80068 and Japanese Patent Application National Publication (Laid-Open) No. 2004-534797.

In regard to the oxime compound used in the invention, when the dispersant includes an aromatic ring, an oxime compound containing an aromatic ring is preferred, from the viewpoint of interaction with the aromatic ring in the dispersant. In that case, the oxime compound exists locally near the pigment, and as a result, curing in the vicinity of the pigment is promoted, decoloration is suppressed, and the apparent adhesion sensitivity is increased.

As the oxime compound used in the invention, a compound represented by the following formula (3) is more preferred from the viewpoint of sensitivity and stability over time.

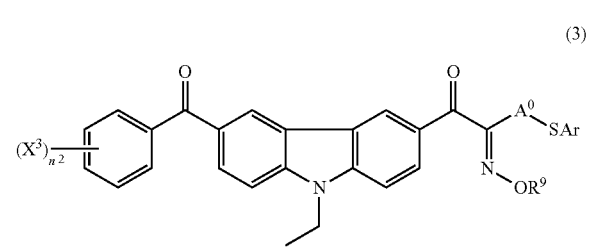

(3)

In the formula (3), $R^9$ and $X^3$ each independently represent a monovalent substituent; $A^o$ represents a divalent organic group; Ar represents an aryl group; and $n^2$ represents an integer of from 1 to 5.

Examples of $R^9$ include an alkyl group, an aryl group, an alkenyl group, an alkynyl group, an alkylsulfinyl group, an arylsulfinyl group, an alkylsulfonyl group, an arylsulfonyl group, an acyl group, an alkoxycarbonyl group, an aryloxycarbonyl group, a phosphinoyl group, a heterocyclic group, an alkylthiocarbonyl group, an arylthiocarbonyl group, a dialkylaminocarbonyl group, and a dialkylaminothiocarbonyl group. These groups may have a substituent.

Among them, $R^9$ is more preferably an acyl group, and specifically, an acetyl group, an ethyloyl group, a propioyl group, a benzoyl group and a toluoyl group are preferred.

Examples of the divalent organic group represented by $A^o$ in the formula (3) include alkylene having 1 to 12 carbon atoms, cyclohexylene and alkynylene.

The aryl group represented by Ar in the formula (3) is preferably an aryl group having from 6 to 30 carbon atoms, and the aryl group may be substituted. Among them, from the viewpoint of increasing sensitivity and suppressing coloration due to heating over time, a substituted or unsubstituted phenyl group is preferred.

In the formula (3), it is preferable that the structure "SAr" formed from Ar and adjacent S, is one of the following structures, from the viewpoint of sensitivity.

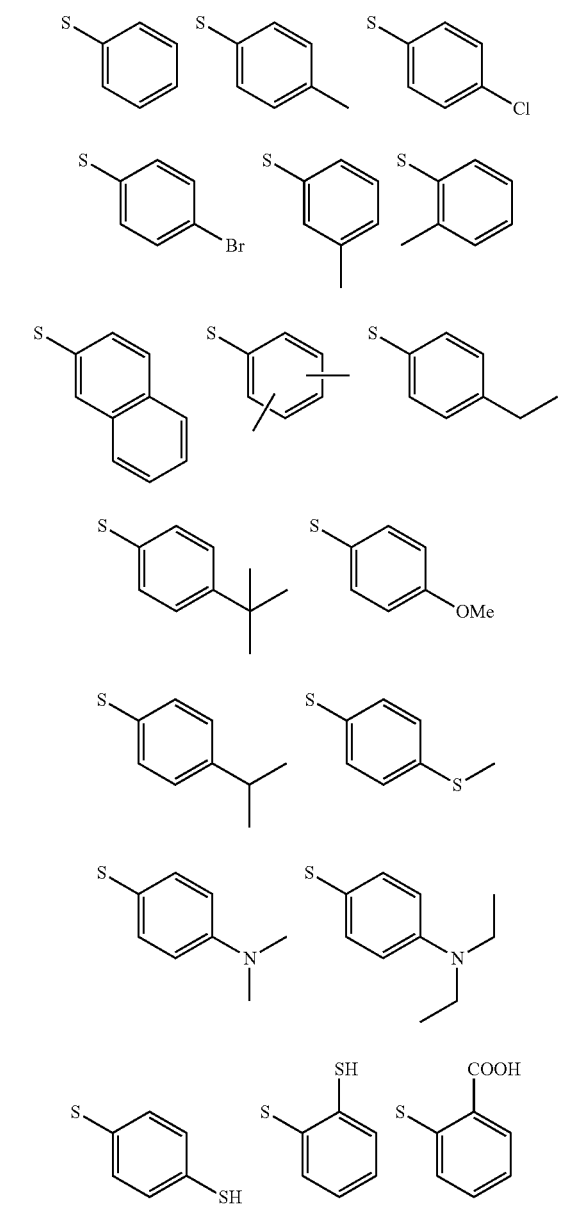

-continued

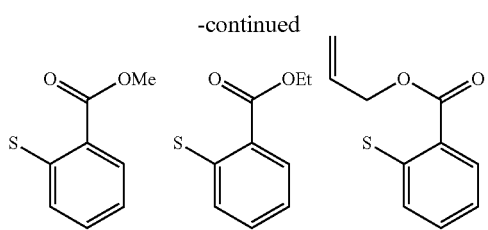

The substituent represented by $X^3$ in the formula (3) is preferably an alkyl group, an aryl group, an alkenyl group, an alkynyl group, an alkoxy group, an aryloxy group, an alkylthioxy group, an arylthioxy group, or an amino group.

Furthermore, $n^2$ in the formula (3) represents an integer of from 0 to 5, but an integer from of 0 to 2 is preferred.

Specific examples of the oxime compound represented by the formula (3) are presented below, but the invention is not intended to be limited to these.

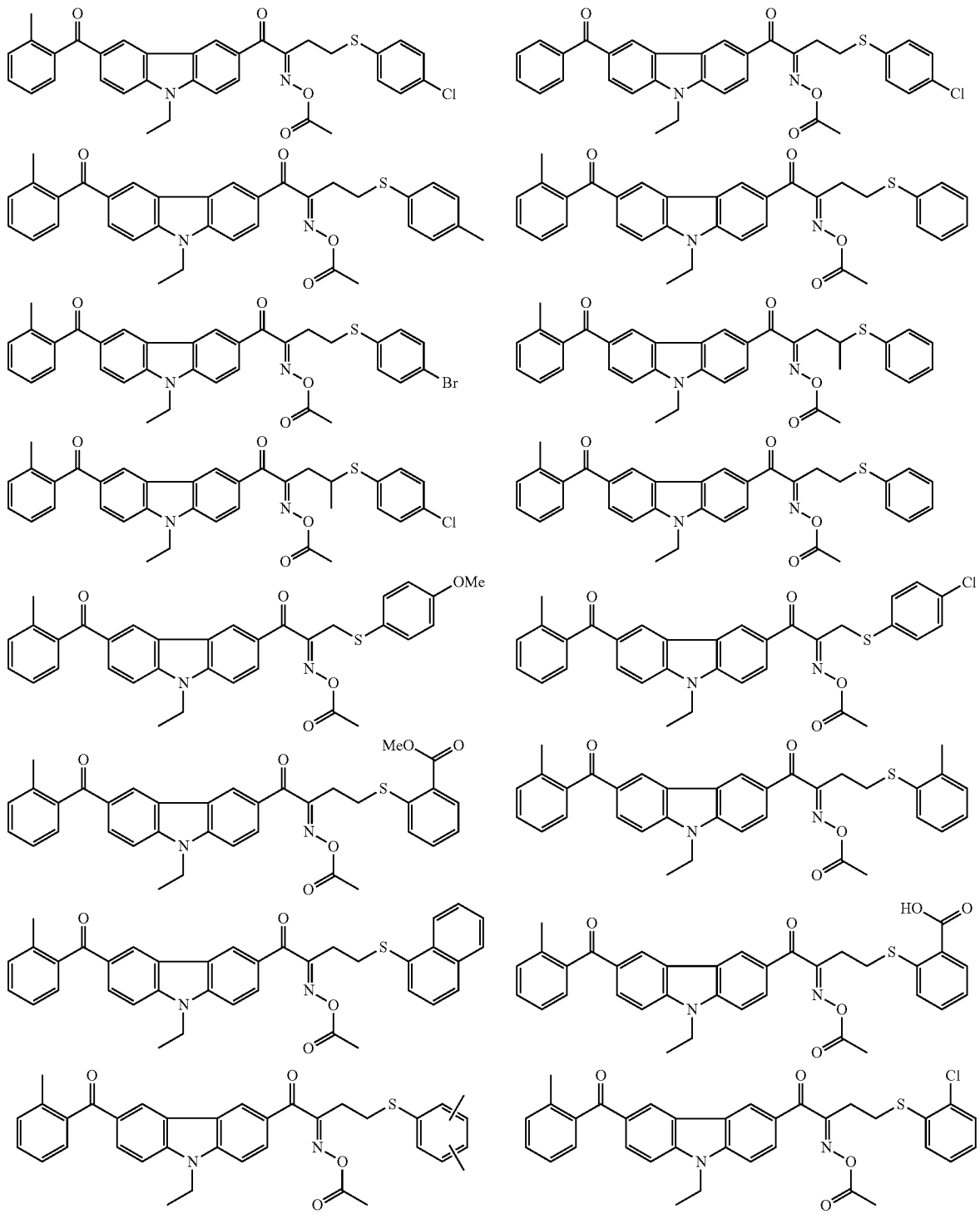

-continued

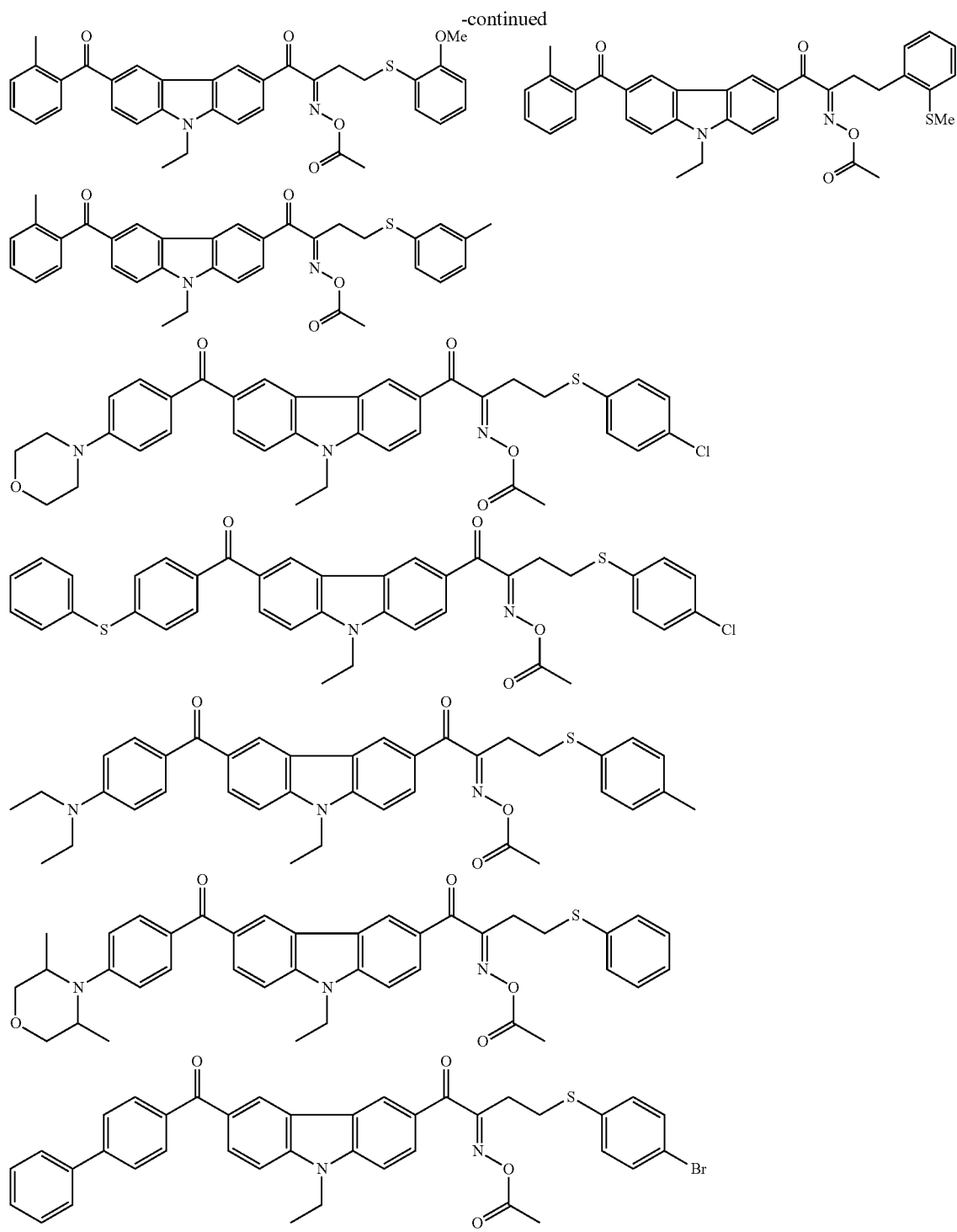

The oxime compound represented by the formula (3) has a function of a photopolymerization initiator that is decomposed by light and initiates and promotes polymerization of a photopolymerizable compound. In particular, the oxime compound has excellent sensitivity with respect to a light source of 365 nm or 405 nm.

Examples of the (E) polymerization initiator used in the polymerizable composition of the invention include, from the viewpoint of exposure sensitivity, a trihalomethyltriazine-based compound, an α-aminoketone compound, an acylphosphine-based compound, a phosphine oxide-based compound, an oxime-based compound, a triarylimidazole dimer, an onium-based compound, a benzophenone-based compound, and acetophenone-based compound, and at least one compound selected from the group consisting of a trihalomethyltriazine-based compound, an α-aminoketone compound, an oxime-based compound, a triarylimidazole dimer, and a benzophenone-based compound is most preferred.

In particular, when the polymerizable composition of the invention is used in the production of color filters for solid-state imaging devices, it is necessary to form fine pixels with a sharp shape. Therefore, it is important to develop unexposed portions without residues, in addition to ensuring curability. From this point of view, an oxime-based compound is particularly preferred. In particular, when fine pixels for solid-state imaging devices are formed, stepper exposure is used to perform exposure for curing. However, this exposure machine may be damaged by halogen, and the amount of a polymerization initiator needs to be kept low. Thus, in consideration of these factors, it is most preferable to use an oxime-based compound as the (E) polymerization initiator, in order to form a fine colored pattern such as a solid-state imaging device.

The content of the (E) polymerization initiator in the polymerizable composition of the invention is preferably from 0.1% by mass to 50% by mass, more preferably from 0.5% by mass to 30% by mass, and even more preferably from 1% by mass to 20% by mass, with respect to the total solid content of the polymerizable composition. When the content is within this range, satisfactory sensitivity and pattern formability may be obtained.

The content of titanium black in the total solid content of the polymerizable composition of the invention is preferably in the range of from 0.1 to 60% by mass, more preferably in the range of from 1 to 40% by mass, and even more preferably in the range of from 5 to 30% by mass, from the viewpoint of exhibiting the necessary light shielding properties, imparting developability, and the like.

The polymerizable composition of the invention may further contain optional components that will be described below, as necessary. The optional components that may be contained in the polymerizable composition will be explained below.

[Sensitizer]

The polymerizable composition of the invention may contain a sensitizer for the purpose of enhancing the radical generation efficiency of the radical polymerization initiator, and increasing the wavelength of the photosensitization wavelength.

The sensitizer that may be used in the invention is preferably a compound capable of sensitizing the (E) polymerization initiator by an electron transfer mechanism or an energy transfer mechanism.

Examples of the sensitizer include those belonging to the compounds listed below and having an absorption wavelength in the wavelength region of from 300 nm to 450 nm.

Examples include polynuclear aromatic compounds (for example, phenanthrene, anthracene, pyrene, perylene, triphenylene, and 9,10-dialkoxyanthracene), xanthenes (for example, fluorescein, eosin, erythrosin, rhodamine B, and Rose Bengal), thioxanthones (isopropylthioxanthone, diethylthioxanthone, and chlorothioxanthone), cyanines (for example, thiacarbocyanine, and oxacarbocyanine), merocyanines (for example, merocyanine, and carbomerocyanine), phthalocyanines, thiazines (for example, thionine, methylene blue, and toluidine blue), acridines (for example, acridine orange, chloroflavin, and acriflavin), anthraquinones (for example, anthraquinone), squaryliums (for example, squarylium), acridine orange, coumarins (for example, 7-diethylamino-4-methylcoumarin), ketocoumarin, phenothiazines, phenazines, styrylbenzenes, azo compounds, diphenylmethane, triphenylmethane, distyrylbenzenes, carbazoles, porphyrin, spiro compounds, quinacridone, indigo, styryl, pyrylium compounds, pyromethene compounds, pyrazolotriazole compounds, benzothiazole compounds, barbituric acid derivatives, thiobarbituric acid derivatives, aromatic ketone compounds such as acetophenone, benzophenone, thioxanthone and Michler's ketone, and heterocyclic compounds such as N-aryloxazolidinone.

[Co-Sensitizer]

It is preferable that the polymerizable composition of the invention further contain a co-sensitizer.

The co-sensitizer according to the invention has an action of further enhancing the sensitivity with respect to active radiation of the (E) polymerization initiator or the sensitizer, or suppressing the inhibition of polymerization of the (D) polymerizable compound by oxygen.

Examples of these co-sensitizers include amines, for example, the compounds described in M. R. Sander, et al., "Journal of Polymer Society", Vol. 10, p. 3173 (1972), JP-B No. 44-20189, JP-A No. 51-82102, JP-A No. 52-134692, JP-A No. 59-138205, JP-A No. 60-84305, JP-A No. 62-18537, JP-A No. 64-33104 and Research Disclosure No. 33825, and specific examples include triethanolamine, p-dimethylaminobenzoic acid ethyl ester, p-formyldimethylaniline, and p-methylthiodimethylaniline.

Other examples of the co-sensitizer include thiols and sulfides, for example, the thiol compounds described in JP-A No. 53-702, JP-B No. 55-500806 and JP-A No. 5-142772; and disulfide compounds described in JP-A No. 56-75643. Specific examples include 2-mercaptobenzothiazole, 2-mercaptobenzoxazole, 2-mercaptobenzimidazole, 2-mercapto-4-(3H)-quinazoline, and β-mercaptonaphthalene.

Other examples of the co-sensitizer include amino acid compounds (for example, N-phenylglycine), the organometallic compounds described in JP-B No. 48-42965 (for example, tributyltin acetate), the hydrogen donors described in JP-B No. 55-34414, and the sulfur compounds described in JP-A No. 6-308727 (for example, trithiane).

The content of these co-sensitizers is preferably in the range of from 0.1% by mass to 30% by mass, more preferably in the range of from 1% by mass to 25% by mass, and even more preferably in the range of from 0.5% by mass to 20% by mass, with respect to the total solid content by mass of the polymerizable composition, from the viewpoint of enhancing the curing rate by a balance between the polymerization growth rate and chain transfer.

[Polymerization Inhibitor]

According to the invention, it is preferable to add a polymerization inhibitor in order to inhibit unnecessary polymerization of a polymerizable compound having an ethylenically unsaturated double bond, during the production or storage of the polymerizable composition.

Examples of the polymerization inhibitor that may be used in the invention include phenolic hydroxyl group-containing compounds, N-oxide compounds, piperidine-1-oxyl free radical compounds, pyrrolidine-1-oxyl free radical compounds, N-nitrosophenylhydroxylamines, diazonium compounds, and cationic dyes, sulfide group-containing compounds, nitro group-containing compounds, and transition metal compounds such as $FeCl_3$ and $CuCl_2$.

Examples of the polymerization inhibitor that may be used in the invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine cerium(I) salt.

A preferred amount of addition of the polymerization inhibitor is from 0.01 parts by mass to 10 parts by mass, more preferably from 0.01 parts by mass to 8 parts by mass, and most preferably in the range of from 0.05 parts by mass to 5 parts by mass, with respect to 100 parts by mass of the (E) polymerization initiator.

When the amount of addition is within the above range, suppression of curing reaction in non-image areas and promotion of curing reaction in image areas can be sufficiently carried out, and the image formability and sensitivity can be improved.

[Binder Polymer]

In the polymerizable composition, a binder polymer may be further used, if necessary, for the purpose of enhancing the film properties. As the binder, a linear organic polymer is preferably used. As a linear organic polymer, any known polymers may be used. Preferably, a linear organic polymer which is soluble or swellable in water or weak alkaline water is selected, in order to enable water development or weak alkaline water development. The linear organic polymer may be selected and used as a film forming agent, but also as a developer with water, weak alkali water or organic solvent. For example, when a water-soluble organic polymer is used, water development can be carried out.

The production of the binder polymer may be achieved by, for example, applying a method according to known radical polymerization. The polymerization conditions for producing an alkali-soluble resin by a radical polymerization method, such as the temperature, the pressure, the type and the amount of the radical polymerization initiator, and the type of the solvent, may be readily determined by those having ordinary skill in the art, and these conditions may also be experimentally determined.

The linear organic polymer is preferably a polymer having a carboxylic acid in a side chain, and suitable examples include a methacrylic acid copolymer, an acrylic acid copolymer, an itaconic acid copolymer, a crotonic acid copolymer, a maleic acid copolymer, and a partially esterified maleic acid copolymer, as well as an acidic cellulose derivative having a carboxylic acid in a side chain, and a product obtained by adding an acid anhydride to a polymer having a hydroxyl group, particularly a copolymer of (meth)acrylic acid and another monomer capable of copolymerizing with (meth)acrylic acid. Examples of the other monomer capable of copolymerizing with (meth)acrylic acid include alkyl (meth)acrylate, aryl (meth)acrylate, and vinyl compounds. Examples of the alkyl (meth)acrylate and aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compounds include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer.

Among these, in particular, a benzyl (meth)acrylate/(meth)acrylic acid copolymer, or a multicomponent copolymer formed from benzyl (meth)acrylate/(meth)acrylic acid/another monomer is suitable. In addition to these, a compound obtained by copolymerizing 2-hydroxyethyl methacrylate, a 2-hydroxypropyl (meth)acrylate/polystyrene macromonomer/benzyl methacrylate/methacrylic acid copolymer, a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like, may be mentioned.

In order to enhance the crosslinking efficiency of the polymerizable composition of the invention, an alkali-soluble resin having a polymerizable group may be used, and polymers including an allyl group, a (meth)acrylic group, an allyloxyalkyl group or the like in a side chain as a polymerizable group are useful. Preferable examples of these polymers including a polymerizable group include a urethane-modified, polymerizable double bond-containing acrylic resin obtained by reacting an isocyanate group with an OH group such that one isocyanate group is left unreacted, and then reacting a compound containing a (meth)acryloyl group with an acrylic resin containing a carboxyl group; an unsaturated group-containing acrylic resin obtainable by reaction between an acrylic resin containing a carboxyl group and a compound having both an epoxy group and a polymerizable double bond in the molecule; an acid pendant type epoxy acrylate resin; a polymerizable double bond-containing acrylic resin obtained by reacting an acrylic resin containing an OH group with a dibasic acid anhydride having a polymerizable double bond; a resin obtained by reacting an acrylic resin containing an OH group with isocyanate and a compound having a polymerizable group; and a resin obtained by performing a basic treatment of a resin having a halogen atom or a leaving group such as a sulfonate group at the α-position or at the β-position and having an ester group in a side chain.

Other preferable examples of the binder polymer according to the invention include a polymer including a structure derived from a compound represented by the following formula (ED) (hereinafter, also referred to as an "ether dimer") as a polymerizable component.

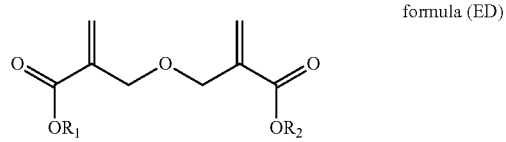

formula (ED)

In the formula (ED), $R^1$ and $R^2$ each independently represent a hydrogen atom, or a hydrocarbon group having 1 to 25 carbon atoms which may be substituted.

When a binder polymer containing an ether dimer-derived structural unit is used, the polymerizable composition of the invention has an advantage that a cured coating film that exhibits excellent transparency in addition to heat resistance may be formed.

In the formula (ED) representing an ether dimer, the hydrocarbon group having 1 to 25 carbon atoms which may be substituted, which are represented by $R^1$ and $R^2$, is not particularly limited, but examples thereof include a linear or branched alkyl group such as methyl, ethyl, n-propyl, isopropyl, n-butyl, isobutyl, t-butyl, t-amyl, stearyl, lauryl or 2-ethylhexyl; an aryl group such as phenyl; an alicyclic group such as cyclohexyl, t-butylcyclohexyl, dicyclopentadienyl, tricyclodecanyl, isobornyl, adamantyl or 2-methyl-2-adamantyl; an alkyl group substituted by alkoxy such as 1-methoxyethyl or 1-ethoxyethyl; and an alkyl group substituted by an aryl group such as benzyl. Among these, in particular, a substituent of primary or secondary carbon, which is difficult to detach by acid or heat, such as methyl, ethyl, cyclohexyl or benzyl, is preferable from the viewpoint of heat resistance.

Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(t-butyl)-2,2'-[oxybis (methylene)]bis-2-propenoate, di(t-amyl)-2,2'-[oxybis (methylene)]bis-2-propenoate, di(stearyl)-2,2'-[oxybis (methylene)]bis-2-propenoate, di(lauryl)-2,2'-[oxybis (methylene)]bis-2-propenoate, di(2-ethylhexyl)-2,2'-[oxybis (methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis (methylene)]bis-2-propenoate, dicyclohexyl-2,2'-[oxybis (methylene)]bis-2-propenoate, di(t-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, and di(2-methyl-2-adamantyl)-2,2'-[oxybis (methylene)]bis-2-propenoate.

Among these, in particular, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are preferred. The binder polymer may contain only one kind of ether dimer-derived structural unit, or may contain two or more kinds thereof.

The binder polymer containing a monomer derived from the compound represented by the formula (ED) may be a copolymer containing a further monomer other than the structure derived from the compound represented by the formula (ED). Examples of the other monomer that may be used together include the monomers listed as the constituent components of the binder polymer, and these monomers may be appropriately used in combination to such an extent that the characteristics of the ether dimer are not impaired.

The acid value of the alkali-soluble resin according to the invention is preferably from 30 to 150 mg KOH/g, and more preferably from 35 to 120 mg KOH/g, and the mass average molecular weight Mw is preferably from 2,000 to 50,000, and more preferably from 3,000 to 30,000.

These binder polymers may be any of a random polymer, a block polymer or a graft polymer.

The content of the binder polymer in the total solid content of the polymerizable composition is preferably from 1% by mass to 40% by mass, more preferably from 3% by mass to 30% by mass, and even more preferably from 4% by mass to 20% by mass.

[Adhesion Enhancing Agent]

In the polymerizable composition of the invention, an adhesion enhancing agent may be added to enhance the adhesiveness to a hard surface of a support or the like. Examples of the adhesion enhancing agent include a silane-based coupling agent and a titanium coupling agent.

Preferable examples of the silane-based coupling agent include γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane, and phenyltrimethoxysilane, and γ-methacryloxypropyltrimethoxysilane is most preferred.

The amount of addition of the adhesion enhancing agent is preferably from 0.5% by mass to 30% by mass, and more preferably from 0.7% by mass to 20% by mass, of the total solid content of the polymerizable composition.

[Other Additives]

The polymerizable composition of the invention may further include various kinds of additives according to the purpose, in addition to the dispersed composition of the invention, (D) polymerization initiator and (E) polymerizable compound, to such an extent that the effect of the invention is not impaired.

—Surfactant—

The polymerizable composition of the invention may include various kinds of surfactants, from the viewpoint of further enhancing the coatability. As the surfactant, various kinds of surfactants such as a fluorine-based surfactant, a nonionic surfactant, a cationic surfactant, an anionic surfactant, and a silicone-based surfactant may be used.

In particular, when the polymerizable composition of the invention include a fluorine-based surfactant, the liquid properties when the polymerizable composition is prepared as a coating liquid (in particular, fluidity) can be further improved, whereby the uniformity in thickness can be further improved and the amount of liquid to be used can be further saved.

Specifically, in the case of forming a film from a coating liquid using a polymerizable composition containing a fluorine-based surfactant, wettability to a surface to which the coating liquid is applied can be improved by decreasing a surface tension therebetween, and the coatability to the surface to be coated can be improved. For this reason, even when a thin film having a thickness of about several micrometers is formed using a small amount of liquid, a film having a uniform thickness with suppressed unevenness in thickness can be more favorably obtained.

The fluorine content in the fluorine-based surfactant is preferably from 3% by mass to 40% by mass, more preferably from 5% by mass to 30% by mass, and particularly preferably from 7% by mass to 25% by mass. A fluorine-based surfactant having a fluorine content within this range is effective in terms of forming a coating film having a uniform thickness or reducing the amount of liquid to be used, and has satisfactory solubility in the polymerizable composition.

Examples of the fluorine-based surfactant include MEGAFAC F171, MEGAFAC F172, MEGAFAC F173, MEGAFAC F176, MEGAFAC F177, MEGAFAC F141, MEGAFAC F142, MEGAFAC F143, MEGAFAC F144, MEGAFAC $R^{30}$, MEGAFAC F437, MEGAFAC F479, MEGAFAC F482, MEGAFAC F780, and MEGAFAC F781 (trade names, manufactured by DIC Corp.); FLUORAD FC430, FLUORAD FC431, and FLUORAD FC171 (trade names, manufactured by Sumitomo 3M, Ltd.); SURFLON S-382, SURFLON SC-101, SURFLON SC-103, SURFLON SC-104, SURFLON SC-105, SURFLON SC1068, SURFLON SC-381, SURFLON SC-383, SURFLON 5393, and SURFLON KH-40 (trade names, manufactured by Asahi Glass Co., Ltd.); and CW-1 (trade name, manufactured by Zeneca Group plc.)

Specific examples of the nonionic surfactant include polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters; PLURONIC L10, L31, L61, L62, 10R5, 1782 and 25R2; and TETRONIC 304, 701, 704, 901, 904 and 150R1 (trade names, manufactured by BASF Corp.)

Specific examples of the cationic surfactant include a phthalocyanine derivative (trade name: EFKA-745, manufactured by Morishita & Co., Ltd.), organosiloxane polymer KP341 (trade name, manufactured by Shin-Etsu Chemical Co., Ltd.), (meth)acrylic acid-based (co)polymers POLYFLOW No. 75, No. 90 and No. 95 (trade names, manufactured by Kyoeisha Chemical Co., Ltd.) and W001 (trade name, manufactured by Yusho Co., Ltd.).

Specific examples of the anionic surfactant include W004, W005 and W017 (trade names, manufactured by Yusho Co., Ltd.)

Specific examples of the silicone-based surfactant include "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA", "TORAY SILICONE SH30PA", and "TORAY SILICONE SH8400" (trade names, manufactured by Toray Silicone Co., Ltd.); "TSF-4440", "TSF-4300", "TSF-4445", "TSF-444(4)(5)(6)(7) 6", "TSF-44 60", and "TSF-4452" (trade names, manufactured by Toshiba Silicone Co., Ltd.); "KP341" (trade name, manufactured by Silicone Co., Ltd.); "BYK323", and "BYK330" (trade names, manufactured by BYK Chemie GmbH).

The surfactants may be used singly, or two or more kinds may be used in combination.

—Other Additives—

The polymerizable composition of the invention may also include known additives such as an inorganic filler, a plasticizer and a sensitizing agent, in order to improve the properties of the cured film.

Examples of the plasticizer include dioctyl phthalate, didodecyl phthalate, triethylene glycol dicaprylate, dimethyl glycol phthalate, tricresyl phosphate, dioctyl adipate, dibutyl sebacate, and triacetylglycerin. When a binding agent is used, the plasticizer may be added in an amount of 10% by mass or less with respect to the total mass of the polymerizable compound and the binder polymer.

The polymerizable composition of the invention exhibits high dispersibility upon dispersion of titanium black, suppresses occurrence of residues in unexposed areas, and has satisfactory adhesion sensitivity. Accordingly, the polymerizable composition may be suitably used in the formation of light shielding color filters.

<Color Filter Having Black Matrix>

A color filter having a black matrix of the invention is formed by using the polymerizable composition of the invention as described above. The black matrix formed by using the polymerizable composition of the invention can suppress the occurrence of residues, and can improve the adhesion sensitivity.

The film thickness of the black matrix is not particularly limited, but from the viewpoint of more effectively achieving the effect of the invention, the black matrix preferably has a thickness after drying of from 0.2 μm to 50 μm, more preferably from 0.5 μm to 30 μm, and even more preferably from 0.7 μm to 20 μm.

The size (length of one side) of the black matrix is preferably from 0.001 mm to 5 mm, more preferably from 0.05 mm to 4 mm, and even more preferably from 0.1 mm to 3.5 mm, from the viewpoint of more effectively achieving the effect of the invention.

<Light Shielding Color Filter with Black Matrix and Method for Producing the Same>

Next, the light shielding color filter having the black matrix of the invention, and a method for producing the same will be explained.

The light shielding color filter having the black matrix of the invention is characterized by having, on a support, a colored pattern formed from the polymerizable composition of the invention.

Hereinafter, the light shielding color filter having the black matrix of the invention will be described in detail, with reference to the method for producing the same.

The method for producing a light shielding color filter having the black matrix of the invention is characterized by including a step of applying the polymerizable composition of the invention on a support to form a polymerizable composition layer (hereinafter, also simply referred to as "polymerizable composition layer forming step"); a step of exposing the polymerizable composition layer via a mask (hereinafter, also simply referred to as "exposing step"); and a step of developing the exposed polymerizable composition layer to form a colored pattern (hereinafter, also simply referred to as "developing step").

Specifically, the light shielding color filter of the invention may be produced by applying the polymerizable composition of the invention on a support directly or via another layer to form a polymerizable composition layer (polymerizable composition layer forming step), exposing the polymerizable composition layer via a mask pattern to light to cure only the exposed coating film portions (exposing step), and developing the exposed portions with a developer (developing step) to form a patterned coating film composed of pixels.

The respective steps of the method for producing a light shielding color filter having the black matrix of the invention will be explained below.

[Polymerizable Composition Layer Forming Step]

In the polymerizable composition layer forming step, a polymerizable composition layer is formed by applying the polymerizable composition of the invention on a support.

Examples of the support include alkali-free glass, soda glass, PYREX (registered trademark) glass, quartz glass, and these glasses to which a transparent electroconductive film is attached, which are used in liquid crystal display devices, or a photoelectric conversion device support used in solid-state imaging devices, for example, a silicon support, and a complementary metal oxide semiconductor (CMOS).

Furthermore, if necessary, an undercoat layer may be formed on these supports in order to improve adhesion to the upper layer, prevent diffusion of substances, or flatten the support surface.

As a method for applying the polymerizable composition of the invention on a support, various coating methods such as slit coating, inkjetting, rotary coating, flowcast coating, roll coating, and screen printing, may be applied.

In order to produce a color filter having a black matrix for solid-state imaging devices, the thickness of a coating film formed from the polymerizable composition is preferably from 0.35 μm to 1.5 μm, and more preferably from 0.40 μm to 1.0 μm, from the viewpoint of resolution and developability.

The polymerizable composition applied on the support is usually dried under the conditions of a temperature of from 70° C. to 110° C. for from about 2 minutes to 4 minutes, whereby a polymerizable composition layer is formed.

In the coating step of applying the polymerizable composition of the invention, for example, even when the polymerizable composition is attached to nozzles of an ejection unit of a coating apparatus, pipes of a coating apparatus, inside a coating apparatus, or the like, the polymerizable composition can be easily removed by washing with a known cleaning liquid. In this case, it is preferable to use a solvent as mentioned above as the solvent contained in the polymerizable composition of the invention as the cleaning liquid, so as to perform the removal by washing more efficiently.

The cleaning liquids described in JP-A No. 7-128867, JP-A No. 7-146562, JP-A No. 8-278637, JP-A No. 2000-273370, JP-A No. 2006-85140, JP-A No. 2006-291191, JP-A No. 2007-2101, JP-A No. 2007-2102, and JP-A No. 2007-281523, may also be suitably used as the cleaning liquid for the removal by washing of the polymerizable composition of the invention.

As the cleaning liquid, it is preferable to use alkylene glycol monoalkyl ether carboxylate, or alkylene glycol monoalkyl ether.

These solvents that may be used as cleaning liquids may be used singly, or as a mixture of two or more kinds.

When two or more kinds of solvents are mixed, a mixed solvent of a solvent having a hydroxyl group and a solvent not having a hydroxyl group is preferred. The mass ratio of the solvent having a hydroxyl group to the solvent not having a hydroxyl group is from 1/99 to 99/1, preferably from 10/90 to 90/10, and more preferably from 20/80 to 80/20. The mixed solvent is particularly preferably a mixed solvent of propylene glycol monomethyl ether acetate (PGMEA) and propylene glycol monomethyl ether (PGME) mixed at a ratio of 60/40.

In order to enhance the penetrability of the cleaning liquid to the polymerizable composition, a surfactant as previously mentioned as the surfactant that may be included in the polymerizable composition may be added to the cleaning liquid.

[Exposing Step]

In the exposing step, the polymerizable composition layer formed in the polymerizable composition layer forming step is exposed to light via a mask, whereby only the exposed coating film portions are cured.

It is preferable to perform the exposure by irradiation with radiation, and the radiation that may be used in the exposure is particularly preferably ultraviolet rays such as g-line, h-line and i-line, and a high-pressure mercury lamp is more preferred. The irradiation intensity is preferably from 5 mJ/cm$^2$ to 1500 mJ/cm$^2$, more preferably from 10 mJ/cm$^2$ to 1000 mJ/cm$^2$, and most preferably from 10 mJ/cm$^2$ to 800 mJ/cm$^2$.

[Developing Step]

Subsequent to the exposing step, an alkali development treatment (developing step) is carried out to dissolve the unexposed portions in an aqueous alkali solution, whereby only the exposed portions remain.

In regard to the developer, in the case of producing a light shielding color filter having a black matrix for solid-state image devices, an organic alkali developer, which does not cause damage to a circuit formed under the color filter, is preferred. The developing temperature is usually from 20° C. to 30° C., and the developing time is from 20 seconds to 90 seconds.

Examples of the alkaline aqueous solution include, alkaline aqueous solutions in which an alkaline compound is dissolved at a concentration of from 0.001 to 10% by mass, and preferably from 0.01 to 1% by mass, the examples of the alkaline compound including, in the case of inorganic developers, sodium hydroxide, potassium hydroxide, sodium carbonate, sodium hydrogen carbonate, sodium silicate and sodium metasilicate; and in the case of organic alkali developers, aqueous ammonia, ethylamine, diethylamine, dimethylethanolamine, tetramethylammonium hydroxide, tetraethylammonium hydroxide, choline, pyrrole, piperidine and 1,8-diazabicyclo[5.4.0]-7-undecene. A water-soluble organic solvent such as methanol or ethanol, a surfactant or the like may be added to the alkaline aqueous developer. Furthermore, when a developer formed from such an alkaline aqueous solution is used, washing (rinsing) with pure water (rinsing) is usually carried out after the development.

The method for producing a color filter having the black matrix of the invention may include, if necessary, a curing step in which the colored pattern is cured by heating and/or exposing to light, after the polymerizable composition layer forming step, the exposing step and the developing step.

Since the color filter having the black matrix of the invention is formed from the polymerizable composition of the invention, the obtained colored pattern exhibits high adhesiveness with respect to a support. Since the cured composition exhibits excellent development resistance, a pattern with excellent exposure sensitivity, favorable adhesiveness of exposed portions with respect to a support, and a resolution that is high enough to form a desired cross-sectional shape, may be formed.

Accordingly, the color filter of the invention may be suitably used in solid-state imaging devices of liquid crystal display devices or CCD devices, and in particular, the color filter is suitable for high-resolution CCD devices, CMOS and the like having more than 1,000,000 pixels. Therefore, the light shielding color filter having the black matrix of the invention is preferably used for solid-state imaging devices.

The color filter having the black matrix of the invention may be used as, for example, a black matrix that is disposed between a light-receiving unit of each pixel and a microlens for collecting light that constitute a CCD.

<Solid-State Imaging Device>

The solid-state imaging device of the invention is formed by including a color filter having a black matrix according to the invention described above, and a patterned film formed from pixels of colors (three colors or four colors) other than the color of the black matrix, according to necessity.

Since the solid-state imaging device of the invention is equipped with a black matrix of the invention, with a suppressed reduction in light shielding properties in the peripheral areas, it is possible to suppress the noise and improve the color reproducibility.

The constitution of the solid-state imaging device of the invention is not particularly limited as long as it includes the black matrix of the invention and functions as a solid-state imaging device, and one example thereof may be a constitution having, on a support, a light-receiving device formed from plural photodiodes and polysilicon etc, which constitute a light-receiving area of a solid-state imaging device (such as a CCD image sensor or a CMOS image sensor), and a black matrix of the invention on the surface of the support opposite to the surface on which the light-receiving device is formed.

<Liquid Crystal Display Device>

One of the liquid crystal display device of the invention is a device at least including a pair of supports, at least one of which being light-transmissive, and between the supports, a color filter, a liquid crystal layer and a liquid crystal driving unit (such as a simple matrix driving system or an active matrix driving system), and the color filter having plural pixels as described above which are isolated from each other by a black matrix of the invention. Since the black matrix is highly flat, unevenness in a cell gap between the color filter and the support or defective display such as color unevenness does not occur in the liquid crystal display device having the black matrix.

Furthermore, another embodiment of the liquid crystal display device of the invention includes at least a pair of supports, at least one of which being light-transmissive, and between the supports, a color filter, a liquid crystal layer and a liquid crystal driving unit, the liquid crystal driving unit having active devices (for example, TFT), and a light shielding color filter formed from the polymerizable composition of the invention disposed among the active devices.

<Wafer-Level Lens>

The wafer-level lens of the invention includes the light shielding color filter of the invention as a light shielding film. The constitution of the wafer-level lens of the invention will be explained below in detail with reference to an example.

FIG. 1 is a planar view showing an example of the constitution of a wafer-level lens array having plural wafer-level lenses.

As shown in FIG. 1, the wafer-level lens array includes a support 1 and lenses 1 arranged on the support 1. Here, FIG. 1 shows plural lenses 10 arranged two-dimensionally with respect to the support 1, but the lenses may be arranged one-dimensionally.

Figure 2:
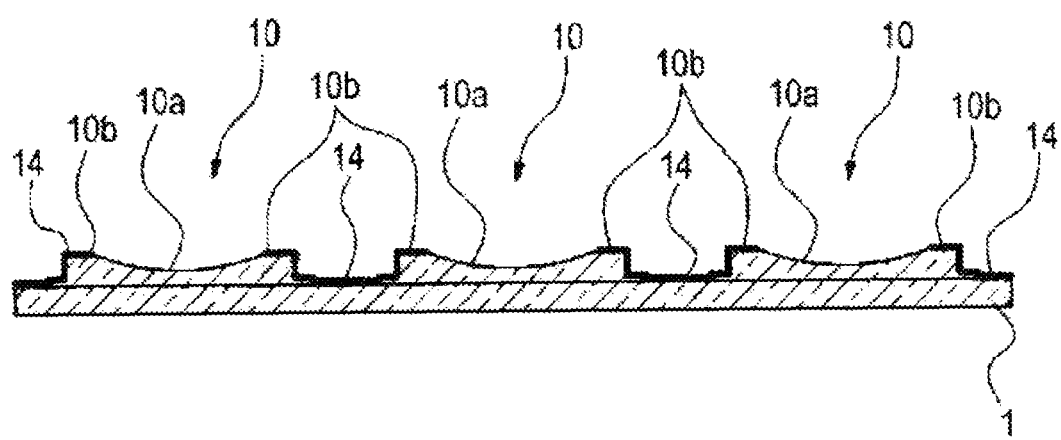
FIG. 2 is a cross-sectional view, dissected along the A-A line, of the wafer-level lens array shown in FIG. 1.

FIG. 2 is a cross-sectional view, which is cut along the A-A line, of the wafer-level lens array shown in FIG. 1.

As shown in FIG. 2, the wafer-level lens array includes a support 1 and plural lenses 10 arranged on the support 1. The plural lenses 10 are arranged one-dimensionally or two-dimensionally with respect to the support 1.

The lenses 10 have a concave lens surface 10a and a lens periphery 10b around the lens surface 10a. Here, the lens surface 10a refers to a surface having an optical property of converging or diverging light entering to lenses 10 in a desired direction, and a curvature and a surface shape being designed in consideration of the optical property. In the example the lens periphery 10b is positioned higher than the center of the lens surface 10a with respect to the support 1. The shape of the lens 10 is not particularly limited, and may be, for example, a so-called convex lens in which the lens surface 10a is protruded in a convex shape, or may be a lens having a non-spherical surface.

In this embodiment, a constitution in which plural lenses 10 are formed on one surface of a support 1 is shown as an example, but a constitution in which plural lenses 10 are formed on both surfaces of the support 1 is also possible. When plural lenses 10 are provided on both surfaces of the support 1, the lenses are formed such that the optical axis of respective lenses on one surface is consistent with the optical axis of the respective lenses on the other surface.

In FIG. 2, the wafer-level lens has a constitution having a single layer of the support 1 on which plural lenses 10 are formed, but a constitution in which two or more supports are layered is also possible.

The wafer-level lens includes a light shielding layer 14 that covers the surface of the lens periphery 10b of the lens 10 and the surface of the support 1 between the lenses 10. The light shielding layer 14 is a layer patterned into the form of region other than the lens surfaces 10a of the lenses on the support 1. In a constitution in which the wafer-level lens have one or more supports, at least one of the support has a light shielding layer 14 on its surface. The light shielding layer 14 is formed from a black resist layer. Since the black resist layer has a lower light reflectance compared with a metal layer or the like, disadvantages such as ghost or flare due to light reflection may be reduced. The black resist layer includes a black resist composition.

Figure 3:
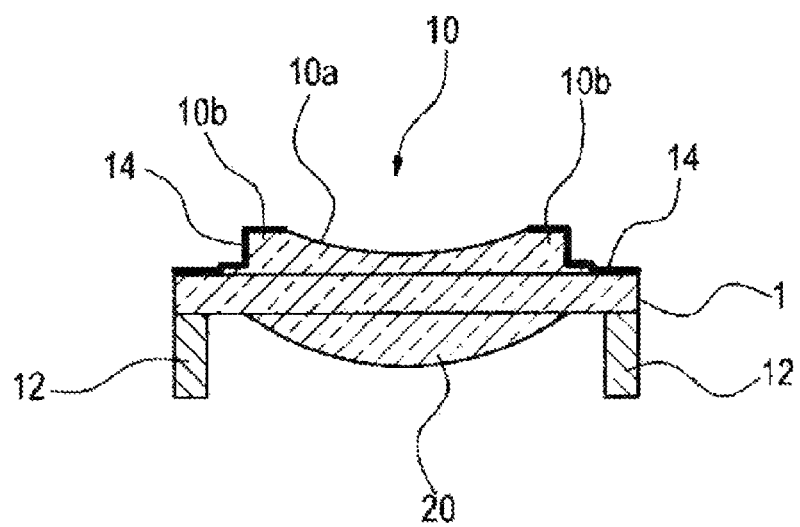
FIG. 3 is a diagram showing another constitution example of the wafer-level lens array.

FIG. 3 is a cross-sectional view showing another constitution example of the wafer-level lens.

In this example, a lens 10 having the same shape as the lens shown in FIG. 2 is formed on one surface of the support 1, and a convex lens 20 is formed on the other surface. On the other surface, a spacer is formed for securing a distance when the support 1 is superposed on a different wafer lens array. The spacer 12 is a member having a lattice shape when viewed from the front, and is bonded to the other surface of the support 1. This example shows a structure including one lens 10 and one lens 20 on the support 1, which is obtained by separating by dicing the structure in which a spacer has been bonded to the wafer-level lens. The spacer 12 may be integrally molded with the support 1 as part of the support 1.

Figure 4:
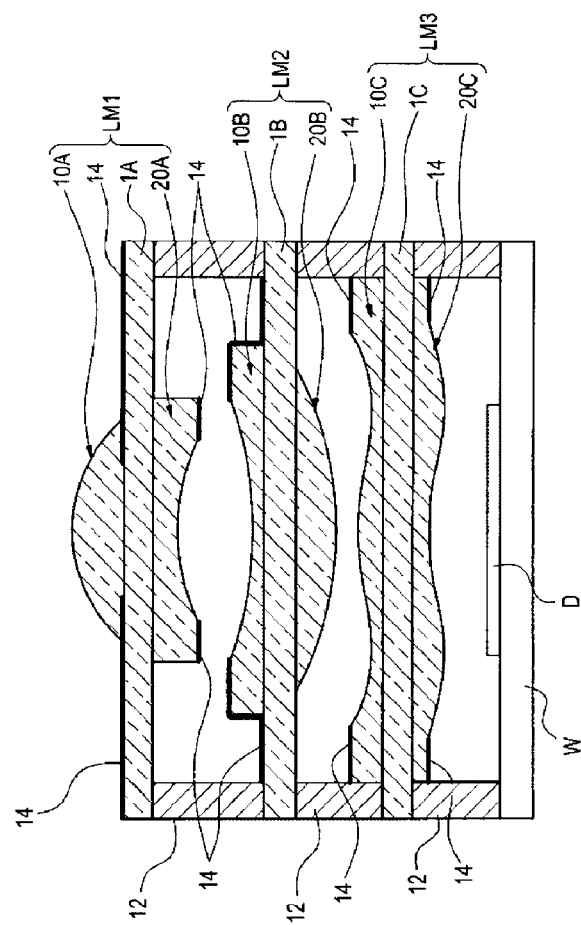
FIG. 4 is a cross-sectional view showing an example of constitution of the imaging unit.

FIG. 4 is a cross-sectional view showing an example of the constitution of an imaging unit.

The imaging unit includes a lens module obtained by dicing a wafer-level lens to separate the lenses from each other, an imaging device (in this case, a solid-state imaging device) D, and a sensor support W provided with the solid-state imaging device D. This example has a constitution in which three lens modules, LM1, LM2 and LM3, are layered in the order of from the light incident side (upper side of FIG. 4).

The lens module LM1 has a convex lens 10A formed on the upper surface of a support 1A, and a lens 20A having a concave lens surface formed on the lower surface. On the upper surface of the support 1A, a light shielding layer 14, which is patterned into a shape corresponding to the region other than the lens surface of the lens 10A, is formed. The lens 20A is provided with a light shielding layer 14 which is patterned into a shape corresponding to the region other than the lens surface.

The lens module LM2 has a concave lens 10B formed on the upper surface of the support 1B, and a lens 20B having a convex lens surface on the lower surface. The lens module LM2 has a constitution that is basically the same as the constitution shown in FIG. 3. On the upper surface of the support 1A, a light shielding layer 14, which is patterned into a shape corresponding to the region other than the lens surface of the lens 10A, i.e., a shape corresponding to the lens periphery and the support surface. In this example, a light shielding layer 14 is not provided on the lower surface of the support 1B, but it is possible to form a light shielding layer 14 which is patterned into a shape corresponding to the region other than the lens surface of the lens 20B.

The lens module LM3 has a lens 10C having a non spherical shape formed on the upper surface of the support 1C, and a lens 20C having a non spherical lens surface formed on the lower surface. The lens 10C and the lens 20C are each provided with a light shielding layer 14 which is patterned into a shape corresponding to the region other than the lens surface.

In addition, each of the lenses 10A, 10B, 10C, 20A, 20B and 20C is provided in a rotationally symmetrical manner with respect to the optical axis. The lens modules LM1, LM2 and LM3 are bonded with spacers 12 disposed therebetween, such that the optical axes of all of the lenses 10A, 10B, 10C, 20A, 20B and 20C are coincident with each other.

The lens modules LM1, LM2 and LM3 are bonded to a sensor support W with spacers 12 disposed therebetween. The lenses 10A, 10B, 10C, 20A, 20B and 20C of the lens modules LM1, LM2 and LM3 form a subject image on the solid-state imaging device D provided on the sensor support W.

The sensor support W is formed by, for example, cutting out a wafer formed from a semiconductor material such as silicon and having an approximately rectangular shape in a planar view. The solid-state imaging device D is provided approximately at the center of the sensor support W. The solid-state imaging device D is, for example, a CCD imaging sensor or a CMOS imaging sensor. The solid-state imaging device D may be, after being made into a chip, bonded to a substrate support on which wiring or the like is formed. Alternatively, the solid-state imaging device D may be produced by subjecting the sensor support W to a known film forming process, a photolithography process, an etching process, an impurity adding process and the like, thereby forming electrodes, insulating films, wirings or the like on the sensor support W.

The spacer 12 and the sensor support W of the lens module LM3 are bonded to each other with, for example, an adhesive or the like. The respective spacers 12 are designed such that the lenses 10A, 10B, 10C, 20A, 20B and 20C of the lens modules LM1, LM2 and LM3 form a subject image on the solid-state imaging device D. The respective spacers 12 are formed to have a thickness that is enough to separate the lenses 10A, 10B, 10C, 20A, 20B and 20C from the overlapping lens modules LM1, LM2 and LM3, or separate the lens module LM 3 from the sensor support W, with a predetermined distance so as not to contact each other.

The shape of the spacer 12 is not particularly limited, as long as the spacer is capable of maintaining the intervals between the lens modules LM1, LM2 and LM3 or the interval between the lens module LM3 and the sensor support W, at a predetermined distance, and the shape may be appropriately modified. For example, the spacer 12 may be a pillar-shaped member provided on each corner of the supports 1A, 1B and 1C. Alternatively, the spacer 12 may be a frame-shaped member that surrounds the solid-state imaging device D. By insolating the solid-state imaging device D from the outside by surrounding the same with the frame-shaped spacer 12, it is possible to prevent light other than that entering through the lens from entering solid-state imaging device D. Furthermore, by sealing the solid-stated imaging device D so as not to contact the outside, attachment of dusts to the solid-state imaging device D can be prevented.

As shown in FIG. 4, in a constitution in which plural supports 1A, 1B and 1C are layered, a reflective layer may be provided, instead of the light shielding layer 14, on the surface of the uppermost layer which is closest to the light incident side. The reflective layer includes a reflective material having a small light transmittance of 0.01% or less and a high reflectance of (4%) or greater. As the reflective material, it is preferable to use a metal such as chromium (Cr), or a metallic material.

The imaging unit thus constituted is reflow-packaged in a circuit board (not depicted) which is mounted in portable terminals or the like. The circuit board has a paste-like solder printed thereon in advance at a position at which the imaging unit is to be mounted. The circuit board on which the imaging unit has been mounted is subjected to a heat treatment by infrared irradiation or hot-air blowing, whereby the imaging unit is welded to the circuit board.

EXAMPLES

Hereinafter, the invention will be more specifically described by way of the Examples, but the invention is not intended to be limited to the following Examples as long as the invention is maintained within the scope of the gist. Furthermore, unless particularly stated otherwise, the units "parts" and "%" are on a mass basis.

<Synthesis of Specific Resin 1>

600.0 g of ε-caprolactone and 22.8 g of 2-ethyl-1-hexanol were introduced into a 500-mL three-necked flask, and dissolved by stirring while introducing nitrogen. 0.1 g of monobutyltin oxide were added thereto, and the mixture was heated to 100° C. 8 hours after, disappearance of the raw materials was confirmed by gas chromatography, and the mixture was cooled to 80° C. After adding 0.1 g of 2,6-di-t-butyl-4-methylphenol to the mixture, 27.2 g of 2-methacryloyloxyethyl isocyanate were added thereto. 5 hours after, disappearance of the raw materials was confirmed by $^1$H-NMR, and the mixture was cooled to room temperature. Thus, 200 g of a precursor M1 as a solid were obtained. Identification of M1 was carried out by $^1$H-NMR, IR and mass analysis.

50.0 g of the precursor M1, 50.0 g of 4-vinylbenzoic acid, 2.3 g of dodecylmercaptan, and 233.3 g of propylene glycol monomethyl ether acetate were introduced into a nitrogen-purged three-necked flask, and the mixture was stirred with a stirrer (trade name: THREE-ONE MOTOR, manufactured by Shinto Scientific Co., Ltd.) While introducing nitrogen into the flask, the temperature of the mixture was raised to 75° C. by heating. 0.2 g of dimethyl 2,2-azobis(2-methylpropionate) (trade name: "V-601", manufactured by Wako Pure Chemical Industries, Ltd.) were added thereto, and the resulting mixture was heated and stirred for 2 hours at 75° C. 2 hours after, 0.2 g of V-601 were further added, and the mixture was heated and stirred for 3 hours. A 30% solution of a specific resin 1, having the following structure (X:Y (wt %)=50:50), was thus obtained.

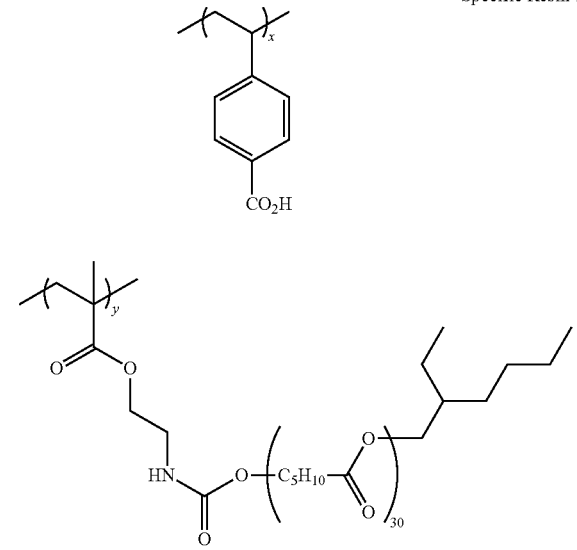

Specific Resin 1

Specific resins 2 to 7 and comparative resins 1 to 3 as described below were synthesized by a similar synthesis method to the synthesis method for the specific resin 1. Table 1 presents the composition ratios, the number of atoms other than hydrogen atoms in the graft chain, and the weight average molecular weight.

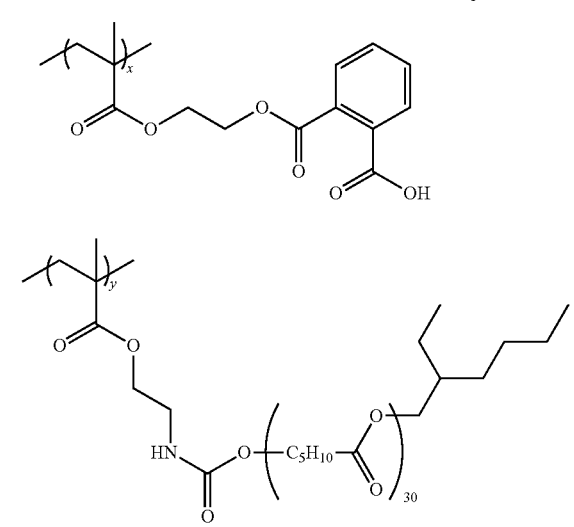

Specific Resin 2

-continued
Specific Resin 3
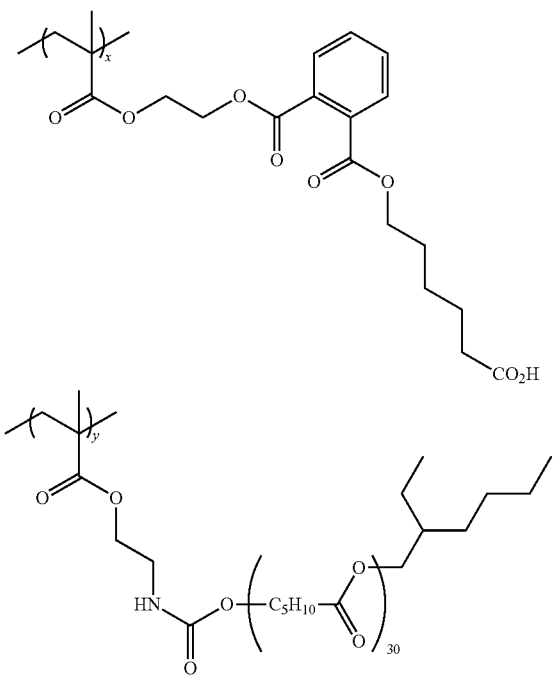
Specific Resin 4
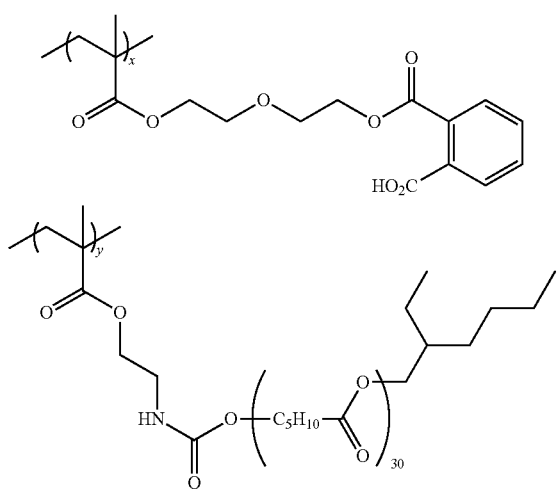
Specific Resin 5
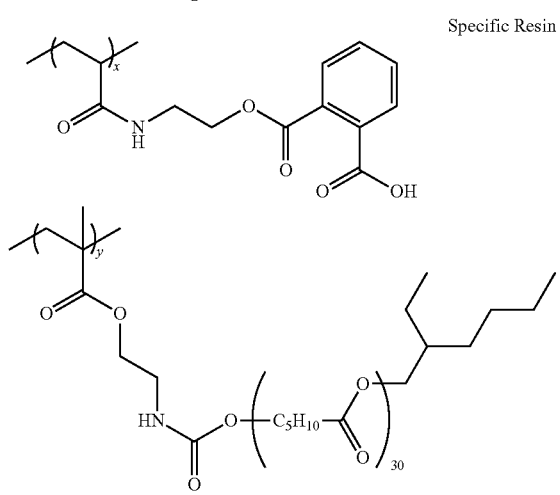
-continued
Specific Resin 6
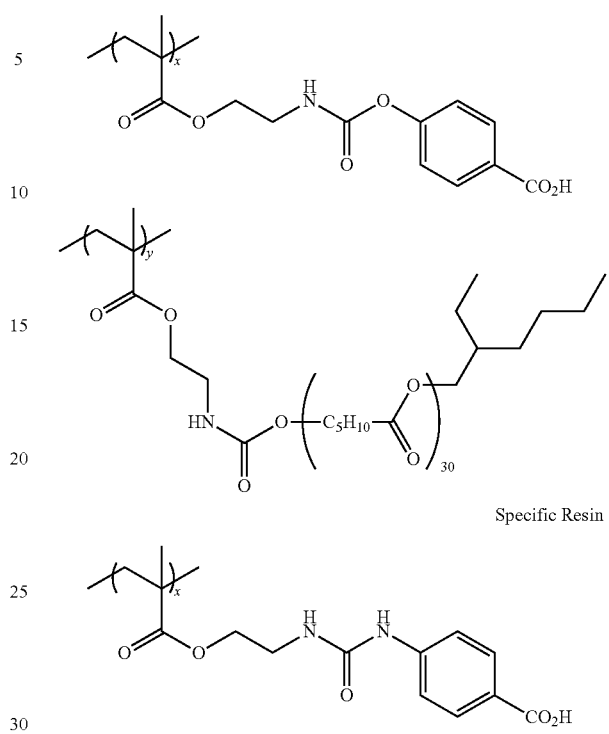
Specific Resin 7
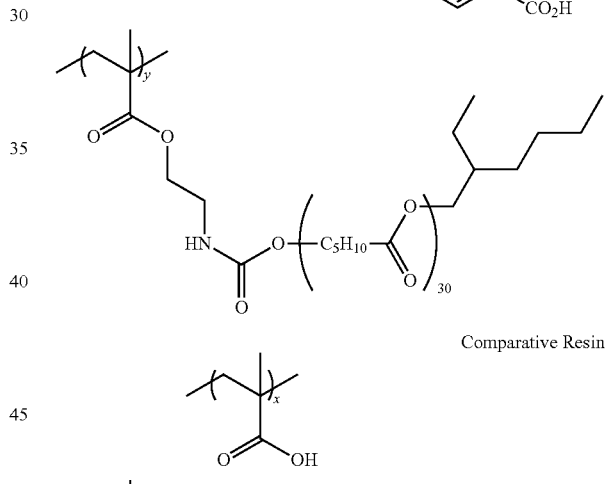
Comparative Resin 1
Comparative Resin 2
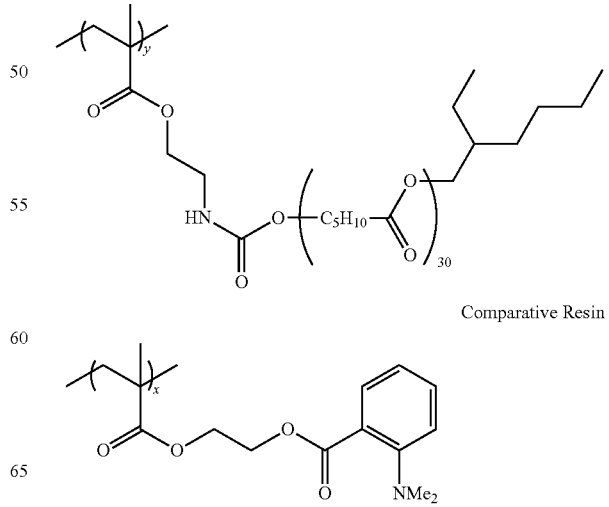

-continued

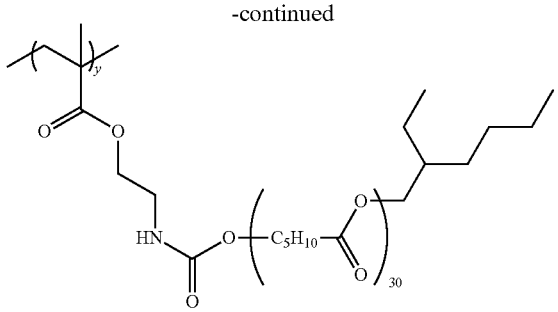

TABLE 1

| | Composition ratio of resin (wt %) | | Chain length of linking group between acidic functional group and main chain unit (number of atoms other than hydrogen atoms) | Weight average molecular weight |
|---|---|---|---|---|
| | x | y | | |
| Specific resin 1 | 50 | 50 | 6 | 34000 |
| Specific resin 2 | 50 | 50 | 14 | 32000 |
| Specific resin 3 | 50 | 50 | 22 | 35000 |
| Specific resin 4 | 50 | 50 | 17 | 31000 |
| Specific resin 5 | 50 | 50 | 14 | 29000 |
| Specific resin 6 | 50 | 50 | 15 | 35000 |
| Specific resin 7 | 50 | 50 | 15 | 39000 |
| Comparative resin 1 | 50 | 50 | 0 | 35000 |
| Comparative resin 2 | 50 | 50 | 14 | 34000 |

Example 1

Preparation of Titanium Black Dispersion

The following composition 1 was subjected to a high viscosity dispersion treatment using two rolls, thereby obtaining a dispersion. Prior to the high viscosity dispersion treatment, the composition was kneaded for 30 minutes using a kneader.
<Composition 1>

| | |
|---|---|
| Titanium black (average primary particle size: 75 nm, trade name: 13M-C, manufactured by Mitsubishi Materials Corp.) | 35 parts |
| Propylene glycol monomethyl ether acetate | 65 parts |

The following composition 2 was added to the obtained dispersion, and the mixture was stirred for 3 hours using a homogenizer under the conditions of 3000 rpm. The resulting mixed solution was subjected to a fine dispersion treatment for 4 hours in a dispersing machine (trade name: DISPER-MAT, manufactured by GETZMANN GmbH), using zirconia beads having a diameter of 0.3 mm. A titanium black dispersion liquid A (dispersed composition of the invention; hereinafter, indicated as TB dispersion liquid A) was thus obtained.
<Composition 2>

| | |
|---|---|
| 30 wt % solution of specific resin 1 in propylene glycol monomethyl ether acetate | 30 parts |

—Viscosity of Dispersed Composition—

The viscosities of the dispersed compositions thus obtained were measured using an E type rotary viscometer (manufactured by Toki Sangyo Co., Ltd.). The results are presented in Table 2 shown below. The smaller the viscosity of the dispersed composition is, the higher the dispersibility is.

It can be seen from the results of Table 2 that the dispersed compositions of the invention exhibit lower viscosities as compared with the Comparative Examples, indicating that the dispersibility of titanium black is favorable.

(Preparation of Polymerizable Composition)

The following composition 3 was mixed with a stirrer, and thus a polymerizable composition A was prepared.
<Composition 3>

| | |
|---|---|
| Benzyl methacrylate/acrylic acid copolymer (binder polymer) [Composition ratio: benzyl methacrylate/acrylic acid copolymer = 80/20 (weight %), weight average molecular weight: 25000] | 2.0 parts |
| Dipentaerythritol hexaacrylate (polymerizable compound) | 3.0 parts |
| TB dispersion liquid A (obtained as described above) | 24.0 parts |
| Propylene glycol monomethyl ether acetate (solvent) | 10 parts |
| Ethyl-3-ethoxypropionate (solvent) | 8 parts |
| Polymerization initiator (compound described in Table 2 below) | 0.8 parts |
| 4-Methoxyphenol (polymerization inhibitor) | 0.01 parts |

—Evaluation of Storage Stability (Stability Over Time)—

The polymerizable composition thus obtained was stored at room temperature for one month, and the degree of settling of titanium black was evaluated according to the following determination criteria. The value indicating the degree of settling was calculated from the change ratio of absorbance of the polymerizable composition, which is diluted 1000 times with PGMEA, using a visible absorptometer (trade name: CARY-5, manufactured by Varian, Inc.) The results are presented in the following Table 2.

—Determination Criteria—

A: Settling of titanium black was observed to a degree of from 0% to less than 2%.

B: Settling of titanium black was observed to a degree of from 2% to less than 5%.

C: Settling of titanium black was observed to a degree of 5% or more.

Example 2 to Example 7, Example 9 to Example 13, and Comparative Example 1 to Comparative Example 2

A similar operation as that performed in Example 1 was carried out, except that the specific resin 1 used in the preparation of the dispersed composition of Example 1 was replaced with the specific resins or comparative resins shown in the following Table 2, and the polymerization initiator in the polymerizable composition was replaced with the polymerization initiators shown in the Table 2. Furthermore, evaluation of the dispersed compositions and the polymerizable compositions was carried out in the same manner as Example 1. The results are presented in the following Table 2.

Example 8

A similar operation to Example 2 was carried out, except that the dispersant used in the preparation of the dispersed composition of Example 2 was added in two steps, i.e., at the time of starting the dispersion and during the dispersion. Furthermore, evaluation of the dispersed composition and the polymerizable composition was carried out in the same manner as Example 1. The results are presented in the following Table 2.

Example 14

A similar operation to Example 2 was carried out, except that different dispersing resins were added in two steps during the preparation of the dispersed composition of Example 2, i.e., half the amount of the dispersing resin 1 added in Example 2 was added as a dispersant at the time of starting the dispersion, and the same amount of the dispersing resin 2 was added during the dispersion. Furthermore, evaluation of the dispersed composition and the polymerizable composition was carried out in the same manner as Example 1. The results are presented in the following Table 2.

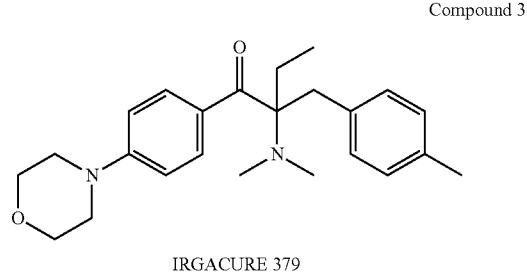

IRGACURE 379 (Compound 3)

TABLE 2

|  | (B) Specific resin or Comparative resin | (E) Polymerization initiator | Dispersion method | Viscosity of dispersed composition (mPa · s) | Evaluation of polymerizable composition | | |
|---|---|---|---|---|---|---|---|
|  |  |  |  |  | Storage stability | Residues | Adhesion sensitivity/mJ |
| Example 1 | Specific resin 1 | Compound 1 | Single-stage dispersion | 20 | B | A | 300 |
| Example 2 | Specific resin 2 | Compound 1 | Single-stage dispersion | 15 | A | A | 250 |
| Example 3 | Specific resin 3 | Compound 1 | Single-stage dispersion | 15 | A | B | 220 |
| Example 4 | Specific resin 4 | Compound 1 | Single-stage dispersion | 13 | A | A | 200 |
| Example 5 | Specific resin 5 | Compound 1 | Single-stage dispersion | 13 | A | A | 250 |
| Example 6 | Specific resin 6 | Compound 1 | Single-stage dispersion | 12 | A | A | 230 |
| Example 7 | Specific resin 7 | Compound 1 | Single-stage dispersion | 10 | A | A | 230 |
| Example 8 | Specific resin 2 | Compound 1 | Two-stage dispersion | 9 | A | A | 250 |
| Example 9 | Specific resin 1 | Compound 2 | Single-stage dispersion | 20 | B | A | 190 |
| Example 10 | Specific resin 1 | Compound 3 | Single-stage dispersion | 20 | B | A | 300 |
| Example 11 | Specific resin 1 | Compound 4 | Single-stage dispersion | 20 | B | A | 300 |
| Example 12 | Specific resin 1 | Compound 5 | Single-stage dispersion | 20 | B | A | 190 |
| Example 13 | Specific resin 1 | Compound 6 | Single-stage dispersion | 20 | B | A | 150 |
| Example 14 | Specific resin 1/ Specific resin 2 | Compound 1 | Two-stage dispersion | 8 | A | A | 250 |
| Comparative Example 1 | Comparative resin 1 | Compound 1 | Single-stage dispersion | 35 | C | B | 400 |
| Comparative Example 2 | Comparative resin 2 | Compound 1 | Single-stage dispersion | 30 | C | C | 350 |

The polymerization initiators described in Table 2 are as follows.

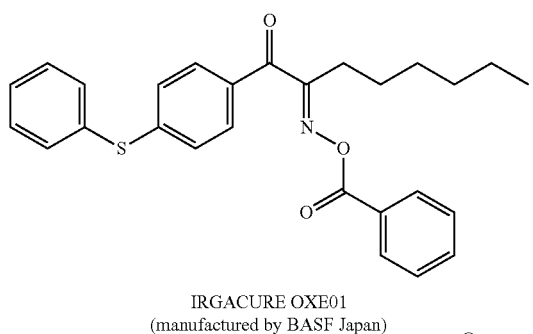

IRGACURE OXE01 (manufactured by BASF Japan) (Compound 1)

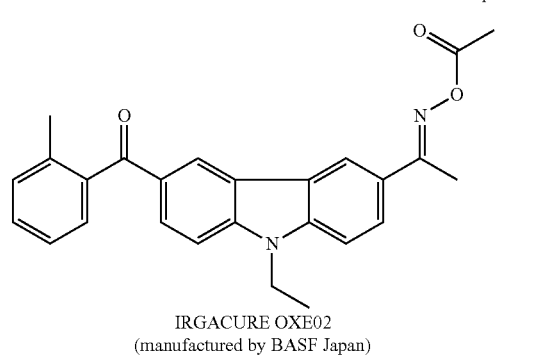

IRGACURE OXE02 (manufactured by BASF Japan) (Compound 2)

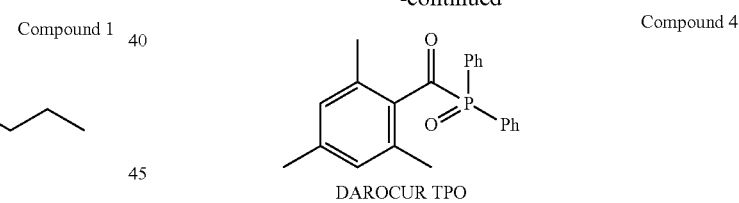

DAROCUR TPO (Compound 4)

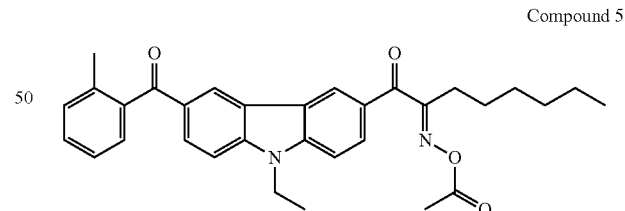

Compound 5

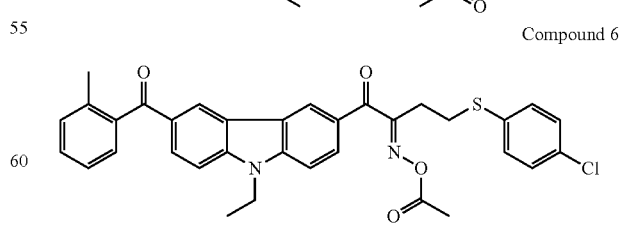

Compound 6

As is obvious from the Table 2, the dispersible compositions of the invention used in Examples 1 to 13, including a specific resin, exhibit a small viscosity of the dispersed composition and a satisfactory dispersibility of titanium black. Further, the polymerizable compositions of the invention used in Examples 1 to 13 exhibit excellent storage stability as compared with the Comparative Example. Accordingly, the polymerizable compositions of the invention exhibits excellent dispersibility of titanium black and excellent dispersion stability over time.

<Production of Color Filter Having Black Matrix for Solid-State Imaging Devices>

The polymerizable composition A was applied as a resist solution on an undercoat layer formed on a silicon wafer with a spin coater to form a coating film having a thickness of 0.7 µm. The resultant was allowed to stand for 10 minutes, and was subjected to a heat treatment (prebaking) for 120 seconds using a hot plate at 100° C.

Subsequently, the polymerizable composition layer was exposed to light via an island pattern mask having a pattern size of 2 µm square at an exposure amount of 1000 mJ/cm$^2$ and a wavelength of 365 nm, using an i-line stepper exposure apparatus (trade name: FPA-3000i5+, manufactured by Canon, Inc.)

Thereafter, the exposed silicon wafer support having a coating film formed thereon was placed on a horizontal rotating table of a spin shower developing machine (trade name: Model DW-30, manufactured by Chemitronics Co., Ltd.), and paddle development was performed for 60 seconds at 23° C. with CD-2000 (trade name, manufactured by FujiFilm Electronics Materials Corp.)

Subsequently, the silicon wafer having a coating film formed thereon was fixed on the horizontal rotating table with a vacuum chuck system, and while rotating the silicon wafer support with a rotating device at a speed of rotation of 50 rpm, pure water was supplied in a shower form from spraying nozzles positioned above the center of rotation, thereby performing a rinse treatment. Thereafter, the silicon wafer support was spray dried, and thus a wafer having a black matrix was formed.

—Evaluation of Residues—

The presence or absence of residues in the portions that had not been exposed to light in the exposing step (unexposed portions) was observed by an SEM and evaluated. The evaluation criteria are as follows.

—Evaluation Criteria—

A: No residues were recognized in the unexposed portions.

B: A slight amount of residues were recognized in the unexposed portions, but it was within an acceptable level in actual use.

C: A significant amount of residues were recognized in the unexposed portions.

—Evaluation of Adhesion Sensitivity—

The polymerizable composition was applied on an undercoat layer of a silicon wafer, thereby forming a polymerizable composition layer (coating film). Then, the coated silicon wafer was subjected to a heat treatment (prebaking) for 120 seconds using a hot plate at 100° C. Subsequently, the polymerizable composition was exposed to light via an island pattern mask having a pattern size of 2 µm square at different amounts of exposure ranging from 100 to 1000 mJ/cm$^2$, at a wavelength of 365 nm, with an i-line stepper exposure apparatus (trade name: FPA-3000i5+, manufactured by Canon, Inc.). Thereafter, the silicon wafer with the exposed coating film was placed on a horizontal rotating table of a spin shower developing machine (trade name: Model DW-30, manufactured by Chemitronics Co., Ltd.), and paddle development was performed for 60 seconds at 23° C. using CD-2000 (trade name, manufactured by FujiFilm Electronics Materials Corp.). A colored pattern was thus formed on the silicon wafer.

The silicon wafer having a colored pattern formed thereon was fixed on the horizontal rotating table with a vacuum chuck system, and while rotating the silicon wafer with a rotating device at a speed of rotation of 50 r.p.m., pure water was supplied in a shower form from spraying nozzles positioned above the center of rotation, thereby performing a rinse treatment. Subsequently, the silicon wafer was spray dried. Thereafter, the size of the colored pattern was measured using a critical dimension SEM (trade name: "S-9260A", manufactured by Hitachi High-Technologies Corp.) The amount of exposure to obtain a pattern line width of 2 µm was evaluated as the exposure sensitivity. With regard to the adhesion sensitivity, the smaller the amount of exposure is, the greater the sensitivity is. The evaluation results are shown in the Table 2.

As is obvious from the Table 2, in Examples 1 to 13, in which a specific resin is used for a black matrix for a solid-state imaging device, occurrence of residues in unexposed portions is suppressed and the adhesion sensitivity is high, as compared with Comparative Examples 1 and 2. Further, when Examples 1 to 9, 12 and 13 are compared with Examples 10 and 11, it is found that the adhesion sensitivity is further increased by using an oxime-based compound as a polymerization initiator.

Examples 15 to 27 and Comparative Examples 3 and 4

Production of Black Matrix for Liquid Crystal Display Devices

Subsequently, color filters having a black matrix for liquid crystal display devices were produced using the same polymerizable compositions as the polymerization compositions used for producing solid-state imaging devices in Examples 1 to 13 and Comparative Examples 1 and 2, and the obtained color filters were evaluated.

Specifically, the same polymerization composition as that used for the production of a color filter for solid-state imaging devices was applied on a glass support of 250 mm×350 mm by slit coating under the following conditions. Subsequently, the coated support was allowed to stand for 10 minutes, and was subjected to vacuum drying and prebaking (100° C., 80 seconds), thereby forming a polymerizable composition coating film. Thereafter, the entire surface of the polymerizable composition coating film was exposed to light at an amount of exposure of 1000 mJ/cm$^2$ (illuminance: 20 mW/cm$^2$), and the exposed coating film was covered with a 1% aqueous solution of an alkali developer (trade name: CDK-1, manufactured by FujiFilm Electronics Materials Corp.) and allowed to stand for 60 seconds. Subsequently, pure water was sprayed in a shower form to wash away the developer. The coating film that had been exposed to light and developed was subjected to a heat treatment (post-baking) for one hour in an oven at 220° C., and thus a black matrix was formed on the glass support.

(Slit Coating Conditions)

Gap between apertures at the front end of coating head: 50 µm

Coating speed: 100 mm/sec

Clearance between support and coating head: 150 µm

Dried film thickness: 1.75 µm

Coating temperature: 23° C.

The evaluation was carried out in the same manner as the evaluation of the black matrix for solid-state imaging devices, and the results are presented in Table 3.

TABLE 3

|  | Polymerizable composition | Residues | Adhesion sensitivity (mJ) |
|---|---|---|---|
| Example 15 | Same as Example 1 | A | 250 |
| Example 16 | Same as Example 2 | A | 230 |
| Example 17 | Same as Example 3 | A | 200 |
| Example 18 | Same as Example 4 | A | 180 |
| Example 19 | Same as Example 5 | A | 230 |
| Example 20 | Same as Example 6 | A | 200 |
| Example 21 | Same as Example 7 | A | 200 |
| Example 22 | Same as Example 13 | A | 210 |
| Example 23 | Same as Example 8 | A | 140 |
| Example 24 | Same as Example 9 | A | 250 |
| Example 25 | Same as Example 10 | A | 250 |
| Example 26 | Same as Example 11 | A | 140 |
| Example 27 | Same as Example 12 | A | 130 |
| Comparative Example 3 | Same as Comparative Example 1 | B | 350 |
| Comparative Example 4 | Same as Comparative Example 2 | C | 300 |

As is obvious from the Table 3, the polymerizable composition of the invention, when used as a color filter having a black matrix for liquid crystal display devices, exhibits suppressed occurrence of residues in unexposed portions and exhibits high adhesion sensitivity.

Example 28

Production of Solid-State Imaging Devices

—Preparation of Chromatic Colored Polymerizable Composition—

A colored polymerizable composition R-1 for red color (R), a colored polymerizable composition G-1 for green color (G), and a colored polymerizable composition B-1 for blue color (B) were prepared in a similar manner to the preparation of the polymerizable composition in Example 1, except that titanium black used as a black pigment was changed to the following chromatic pigments.

(Chromatic Pigments for Formation of Colored Pixels of RGB)

Pigment for red color (R)

C.I. Pigment Red 254

Pigment for green color (G)

A mixture of C.I. Pigment Green 36 and C.I. Pigment Yellow 219 mixed at 30/70 (mass ratio)

Pigment for blue color (B)

A mixture of C.I. Pigment Blue 15:6 and C.I. Pigment Violet 23 mixed at 30/70 (mass ratio)

<Production of Color Filter for Solid-State Imaging Devices>

Pigment dispersion liquids (P1) of red color (R), green color (G) and blue color (B) were prepared by mixing an dispersing 40 parts of the pigment, 50 parts of DISPERBYK-161 (trade name, manufactured by BYK Chemie GmbH; 30% solution) as a dispersant and 110 parts of propylene glycol monomethyl ether as a solvent, with a bead mill for 15 hours.

A coating liquid of polymerizable composition (R-1) was prepared by mixing and stirring the following compositions ratio with the dispersed pigment dispersion liquid (P1). The same procedure was performed to prepare the coating liquids of polymerizable compositions G-1 and B-1.

| | |
|---|---|
| Colorant (pigment dispersion liquid (P1)) | 50 parts |
| Polymerization initiator (oxime-based photopolymerization initiator) (trade name: CGI-124, manufactured by BASF Japan) | 30 parts |
| TO-1382 (manufactured by Toagosei Co., Ltd.) (polymerizable compound manufactured by Toagosei Co., Ltd., carboxyl group-containing pentafunctional acrylate) | 25 parts |
| Dipentaerythritol hexaacrylate | 30 parts |
| Solvent (PGMEA) | 200 parts |
| Support adhesive (3-methacryloxypropyltrimethoxysilane) | 1 part |

A colored pattern of red color (R) having the size of 1.6× 1.6 μm was formed using the colored polymerizable composition R-1 for red color (R) on the wafer with the light shielding filter having a black matrix produced in Example 1. In a similar manner, a chromatic colored pattern of green color (G) having the size of 1.6×1.6 μm and a chromatic colored pattern of blue color (B) were sequentially formed using the colored polymerizable composition G-1 for green color (G) and the colored polymerizable composition B-1 for blue color (B). A color filter for solid-state imaging devices was thus produced.

—Evaluation—

The full-color color filter was incorporated in a solid-state imaging device, and it was confirmed that the black matrix of the solid-state imaging device exhibited high light shielding properties, high resolution, and excellent color separability.

Examples 29

Production of Liquid Crystal Display Device

—Preparation of Chromatic Colored Polymerizable Composition—

A coating liquid of the polymerizable composition R-1 was prepared by using pigment dispersion liquid (P1) that had been dispersion treated in the above process, by stirring and mixing to give the following composition ratio. The same procedure was carried out to prepare the coating liquids of polymerizable compositions G-1 and B-1.

| | |
|---|---|
| Colorant (pigment dispersion liquid (P1)) | 200 parts |
| Propylene glycol monomethyl ether acetate (PGMEA: solvent) | 9.20 parts |
| Ethyl lactate | 36.67 parts |
| Resin (40% PGMEA solution of benzyl methacrylate/methacrylicacid/2-hydroxyethyl methacrylate copolymer (molar ratio = 60/22/18)) | 33.51 parts |
| Ethylenically unsaturated double bond-containing compound (dipentaerythritol hexaacrylate) | 12.20 parts |
| Polymerization inhibitor (p-methoxyphenol) | 0.0061 parts |
| Fluorine-based surfactant (trade name: F-475, manufactured by DIC Corporation) | 0.83 parts |
| Photopolymerization initiator (trihalomethyltriazine-based photopolymerization initiator) | 0.586 parts |

The pigment dispersion liquid (P1) was prepared by using the colored polymerizable composition R-1 for red color (R), the colored polymerizable composition G-1 for green color (G), and the colored polymerizable composition B-1 for blue color (B) prepared for the production of the color filter for solid-state imaging device, respectively.

—Production of Color Filter for Liquid Crystal Display Devices—

The light shielding filter produced in Example 1 was used as a black matrix, and a colored pattern of red color (R) having a size of 80×80 μm was formed on the black matrix using the colored polymerizable composition R-1 for red color (R) by the same method as the method described in Example 1. In the same manner, a chromatic colored pattern of green color (G) and a chromatic colored pattern of blue color (B) were sequentially formed using the colored polymerizable composition G-1 for green color (G) and the colored polymerizable composition B-1 for blue color (B). A color filter having a black matrix for liquid crystal display devices was thus produced.

—Evaluation—

A liquid crystal display device was produced by providing the full-color color filter with an ITO transparent electrode, an oriented film or the like. The polymerizable composition of the invention exhibited satisfactory uniformity in a surface of the coating film, and the liquid crystal display device exhibited no display unevenness and exhibited satisfactory image quality.

Example 30

Production of Wafer-Level Lens

A wafer-level lens having a light shielding layer formed from the light shielding color filter of the invention was produced by applying the polymerizable composition A prepared in Example 1 to a silicon wafer provided with a lens.

A lens module was prepared by cutting out the obtained wafer-level lens, and an imaging device and a sensor support were attached to the lens module to produce an imaging unit. The wafer-level lens of the invention exhibited high uniformity in a surface of the coating of the portions corresponding to the light shielding layer, and high light shielding properties. The image quality achieved by using the imaging unit was satisfactory.

The invention claimed is:

1. A dispersed composition comprising: (A) titanium black; (B) a polymer compound comprising a constituent component having a side chain structure to which an acidic group is linked via a linking group; and (C) a solvent, wherein:
the polymer compound (B) is a polymer compound comprising a constituent component represented by the following formula (1-2):

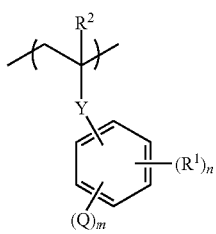

formula (1-2)

wherein, in formula (1-2), $R^1$ represents an alkyl group, an aryl group, an alkoxy group, an aryloxy group, a heteroaryloxy group, an alkyloxycarbonyl group, an aryloxycarbonyl group, an alkylamide group, an arylamide group, a halogen atom or a nitro group; Q represents a carboxylic acid group; n represents an integer from 0 to 4; m represents an integer from 1 to 5; $R^2$ represents a hydrogen atom or an alkyl group; and Y represents a divalent linking group;
the polymer compound (B) further comprises a graft chain having a polyester structure; and
the number of atoms other than hydrogen atoms per one graft chain is from 40 to 10,000.

2. The dispersed composition according to claim 1, wherein the divalent linking group represented by Y includes a functional group selected from the group consisting of an ester group, an amide group, and a sulfonamide group.

3. The dispersed composition according to claim 1, wherein the dispersed composition is a liquid obtained by dispersing, by a multistage dispersion method, a liquid containing (A) titanium black, (B) the polymer compound, and (C) the solvent.

4. The dispersed composition according to claim 1, wherein the divalent linking group represented by Y is selected from the group consisting of the following (Y-1) to (Y-22):

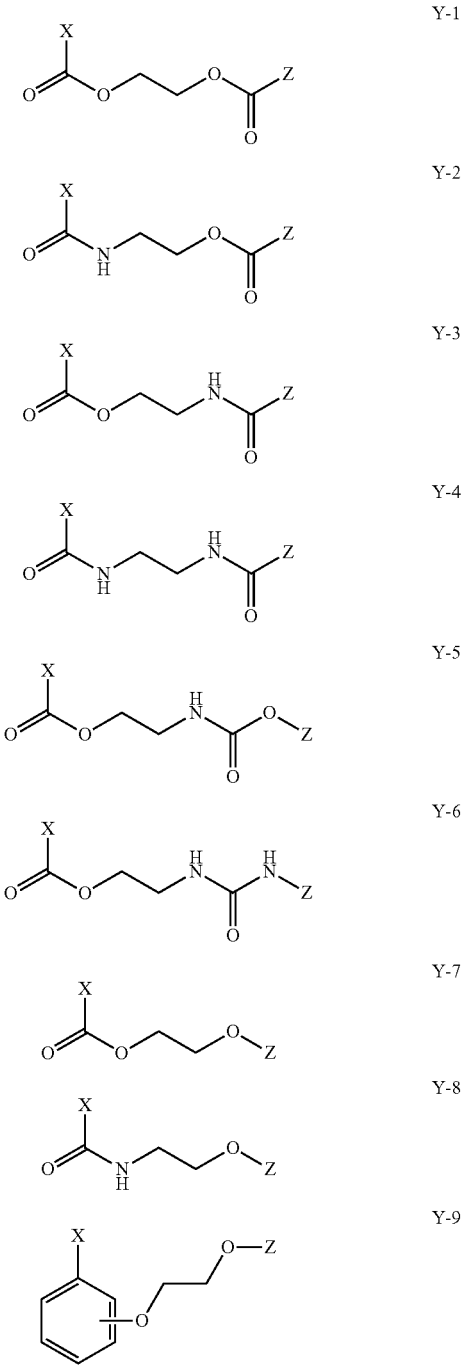

Y-10 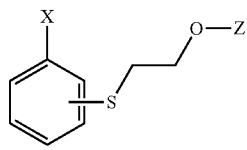

Y-11 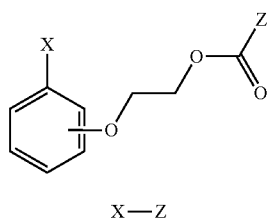

Y-12 X—Z

Y-13 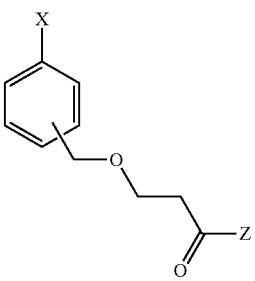

Y-14 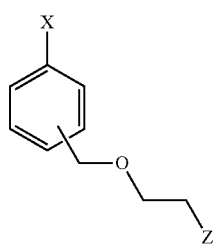

Y-15 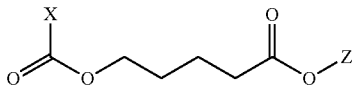

Y-16 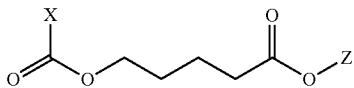

Y-17 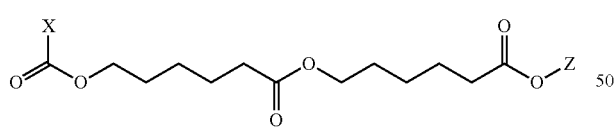

Y-18 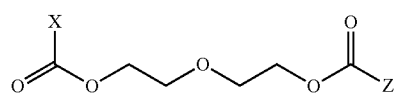

Y-19 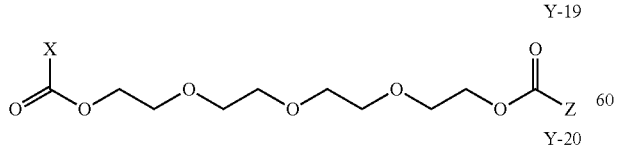

Y-20 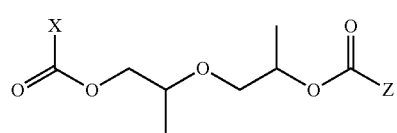

Y-21 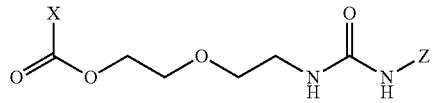

Y-22 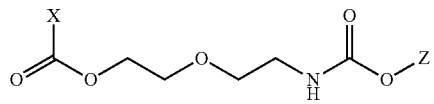

wherein, in (Y-1) to (Y-22), X represents a binding moiety to the main chain part of the polymer, and Z represents a moiety linked to the partial structure represented by the following formula (2):

formula (2)

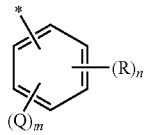

wherein in formula (2), * represents a binding moiety to the divalent linking group selected from the group consisting of (Y-1) to (Y-22); R represents an alkyl group, an aryl group, an alkoxy group, an aryloxy group, a heteroaryloxy group, an alkyloxycarbonyl group, an aryloxycarbonyl group, an alkylamide group, an arylamide group, a halogen atom or a nitro group; Q represents a carboxylic acid group; n represents an integer from 0 to 4; and m represents an integer from 1 to 5.

5. The dispersed composition according to claim 4, wherein the divalent linking group represented by Y is Y-1.

6. The dispersed composition according to claim 1, wherein the graft chain comprises at least one structural unit selected from the group consisting of the following formulae (1) and (2):

(1)
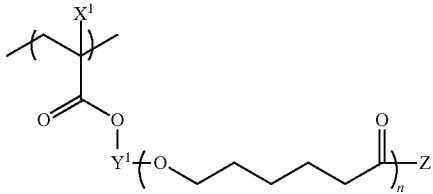

(2)
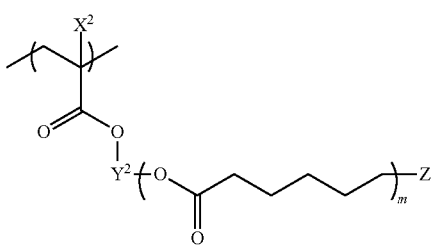

wherein in formulae (1) and (2), $X^1$ and $X^2$ each independently represents a hydrogen atom or a monovalent organic group; $Y^1$ and $Y^2$ each independently represents a divalent linking group; $Z^1$ and $Z^2$ each independently represents a monovalent organic group; n represents an integer from 2 to 500, and m represents an integer from 1 to 500.

7. The dispersed composition according to claim 6, wherein $Y^1$ and $Y^2$ in formulae (1) and (2) each independently represents a linking group selected from the group consisting of the following (y-1) to (y-19):

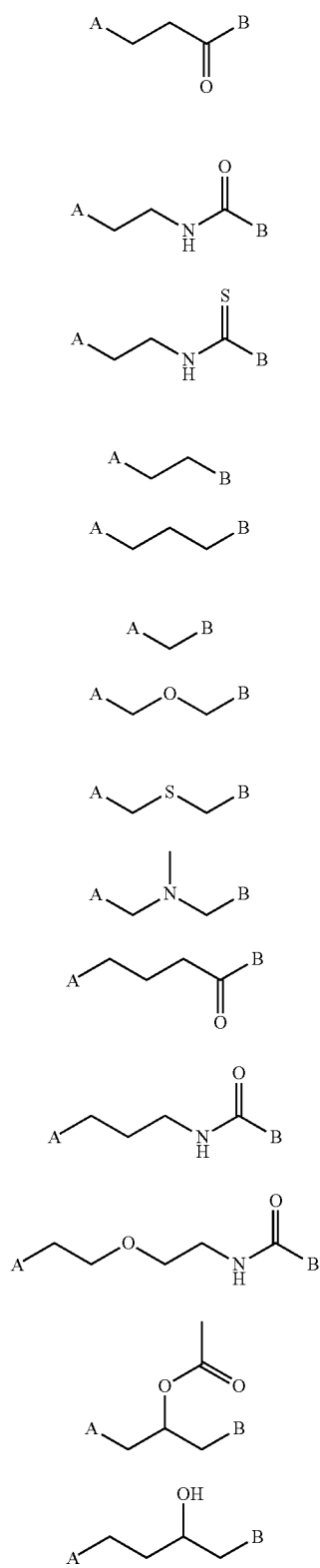

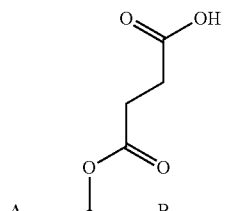

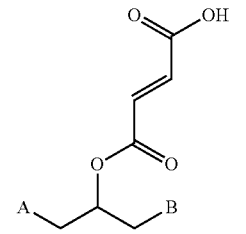

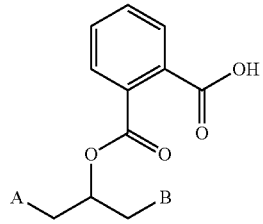

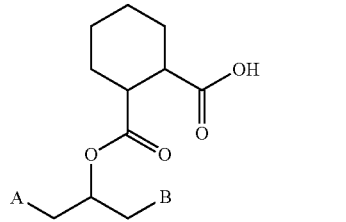

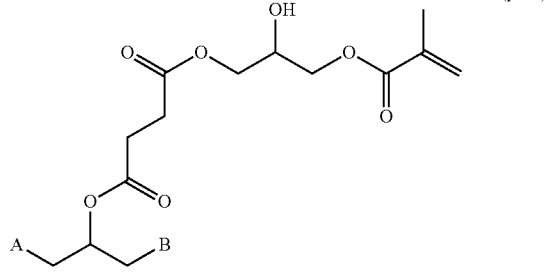

wherein in (y-1) to (y-19), A and B represent a linking group to the main chain and a linking group to the graft chain of formulae (1) and (2), respectively.

8. The dispersed composition according to claim 6, wherein $Z^1$ represents an alkoxy group having 5 to 24 carbon atoms and $Z^2$ represents an alkylcarbonyloxy group having an alkyl moiety having 5 to 24 carbon atoms.

9. A photopolymerizable composition comprising: (A) titanium black; (B') a polymer compound comprising a constituent component having a side chain structure to which an acidic group is linked via a linking group that provides an adsorptive interaction with (A) the titanium black; (C) a solvent; (D) an oxime photoinitiator; and (E) a polymerizable compound, wherein the polymer compound (B') further comprises a graft chain having a polyester structure; and the number of atoms other than hydrogen atoms per one graft chain is from 40 to 10,000.

10. The photopolymerizable composition according to claim 9, wherein the oxime photoinitiator (D) is selected from the following compounds:

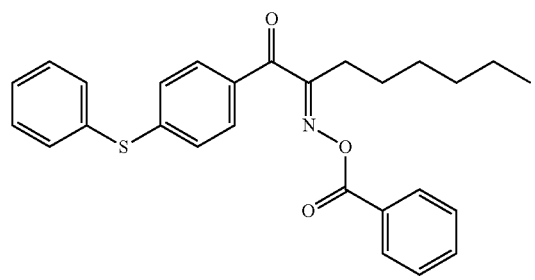

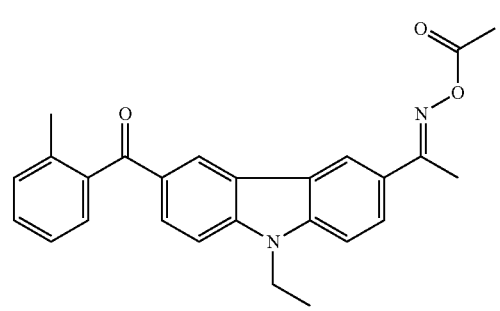

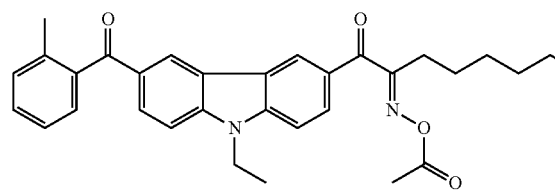

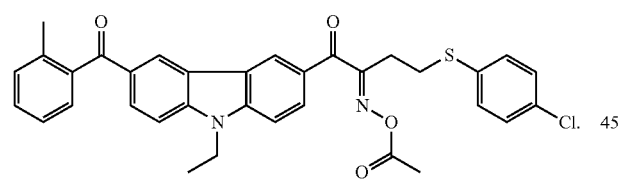

11. A light shielding color filter comprising a support and a colored region, the colored region being formed by applying the photopolymerizable composition according to claim 9 onto the support, and exposing and developing the photopolymerizable composition.

12. A solid-state imaging element comprising the light shielding color filter according to claim 11.

13. A wafer-level lens comprising the light shielding color filter according to claim 11.

14. An imaging unit comprising the wafer-level lens according to claim 13.

15. The photopolymerizable composition according to claim 9, wherein the polymer compound (B) is a polymer compound comprising a constituent component represented by the following formula (1-2):

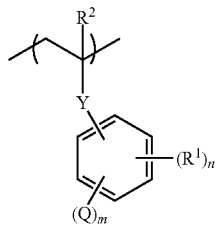

formula (1-2)

wherein, in formula (1-2), $R^1$ represents an alkyl group, an aryl group, an alkoxy group, an aryloxy group, a heteroaryloxy group, an alkyloxycarbonyl group, an aryloxycarbonyl group, an alkylamide group, an arylamide group, a halogen atom or a nitro group; Q represents a carboxylic acid group, n represents an integer from 0 to 4; m represents an integer from 1 to 5; $R^2$ represents a hydrogen atom or an alkyl group; and Y represents a divalent linking group.

16. The photopolymerizable composition according to claim 15, wherein the divalent linking group represented by Y includes a functional group selected from the group consisting of an ester group, an amide group, and a sulfonamide group.

17. The photopolymerizable composition according to claim 15, wherein the divalent linking group represented by Y is selected from the group consisting of the following (Y-1) to (Y-22):

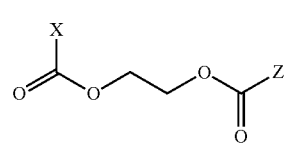

Y-1

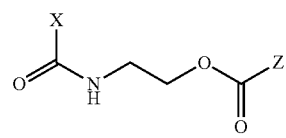

Y-2

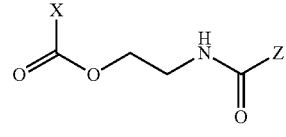

Y-3

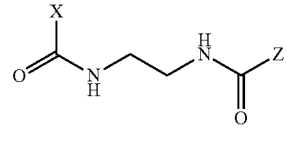

Y-4

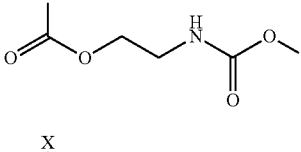

Y-5

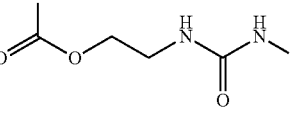

Y-6

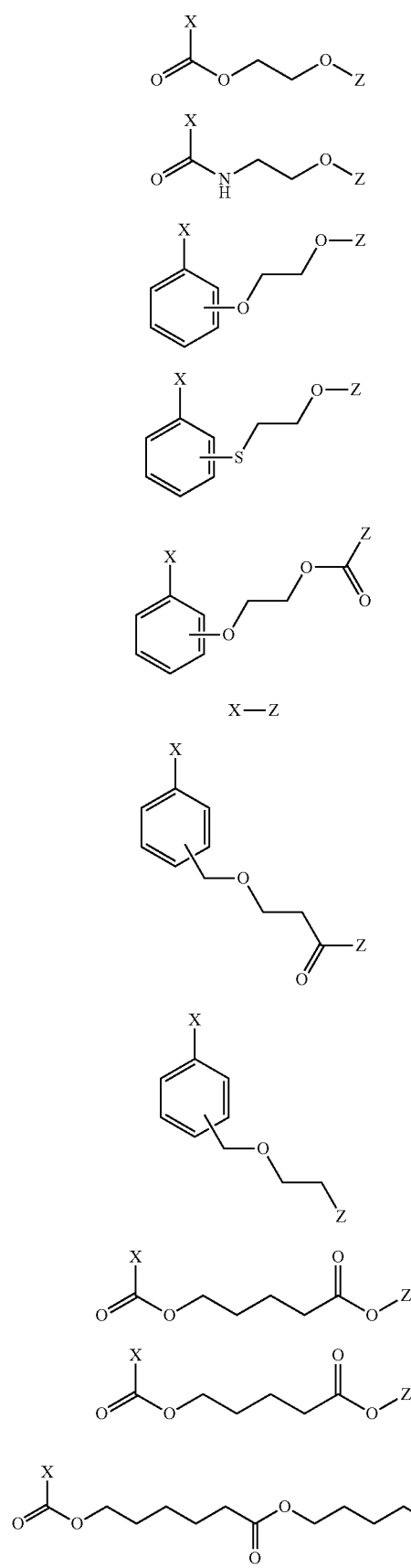

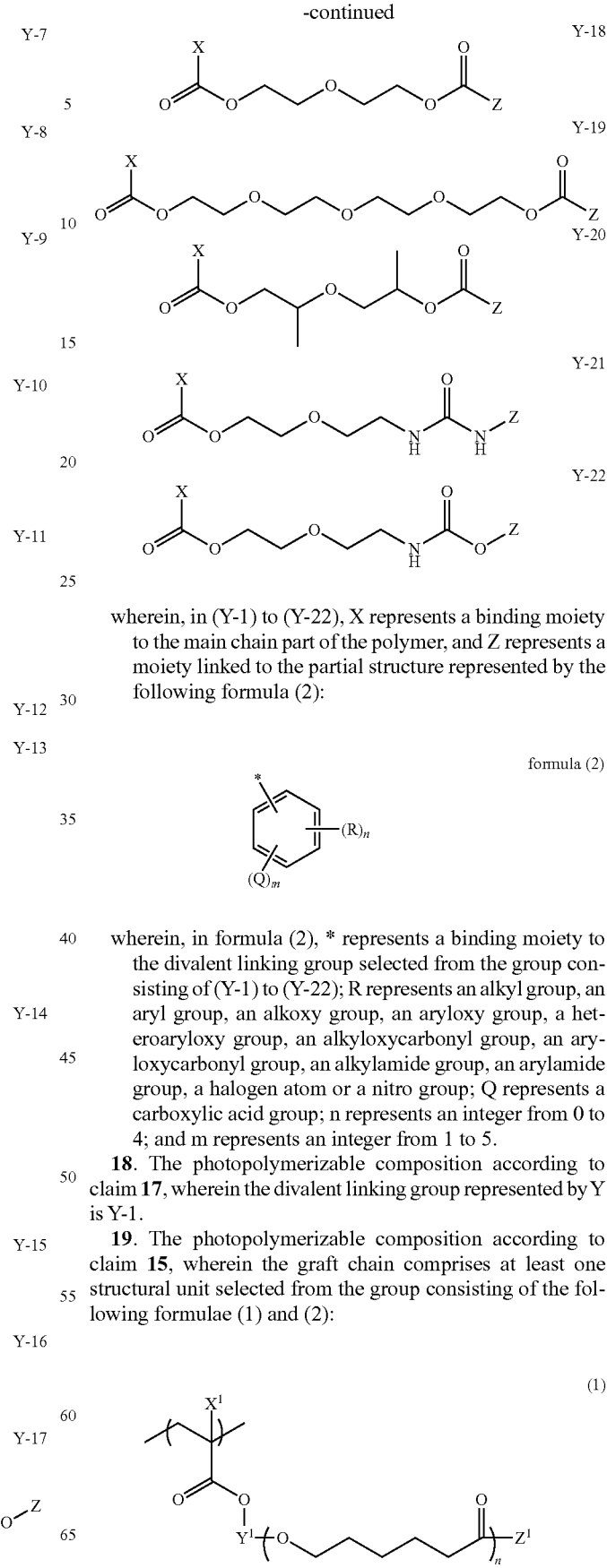

wherein, in (Y-1) to (Y-22), X represents a binding moiety to the main chain part of the polymer, and Z represents a moiety linked to the partial structure represented by the following formula (2):

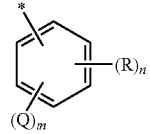

formula (2)

wherein, in formula (2), * represents a binding moiety to the divalent linking group selected from the group consisting of (Y-1) to (Y-22); R represents an alkyl group, an aryl group, an alkoxy group, an aryloxy group, a heteroaryloxy group, an alkyloxycarbonyl group, an aryloxycarbonyl group, an alkylamide group, an arylamide group, a halogen atom or a nitro group; Q represents a carboxylic acid group; n represents an integer from 0 to 4; and m represents an integer from 1 to 5.

18. The photopolymerizable composition according to claim 17, wherein the divalent linking group represented by Y is Y-1.

19. The photopolymerizable composition according to claim 15, wherein the graft chain comprises at least one structural unit selected from the group consisting of the following formulae (1) and (2):

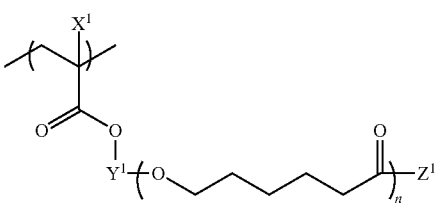

(1)

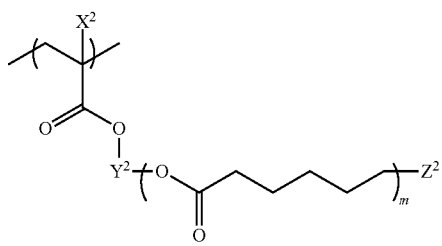

(2)

wherein in formulae (1) and (2), $X^1$ and $X^2$ each independently represents a hydrogen atom or a monovalent organic group; $Y^1$ and $Y^2$ each independently represents a divalent linking group; $Z^1$ and $Z^2$ each independently represents a monovalent organic group; n represents an integer from 2 to 500, and m represents an integer from 1 to 500.

20. The photopolymerizable composition according to claim 19, wherein $Y^1$ and $Y^2$ in formulae (1) and (2) each independently represents a linking group selected from the group consisting of the following (y-1) to (y-19):

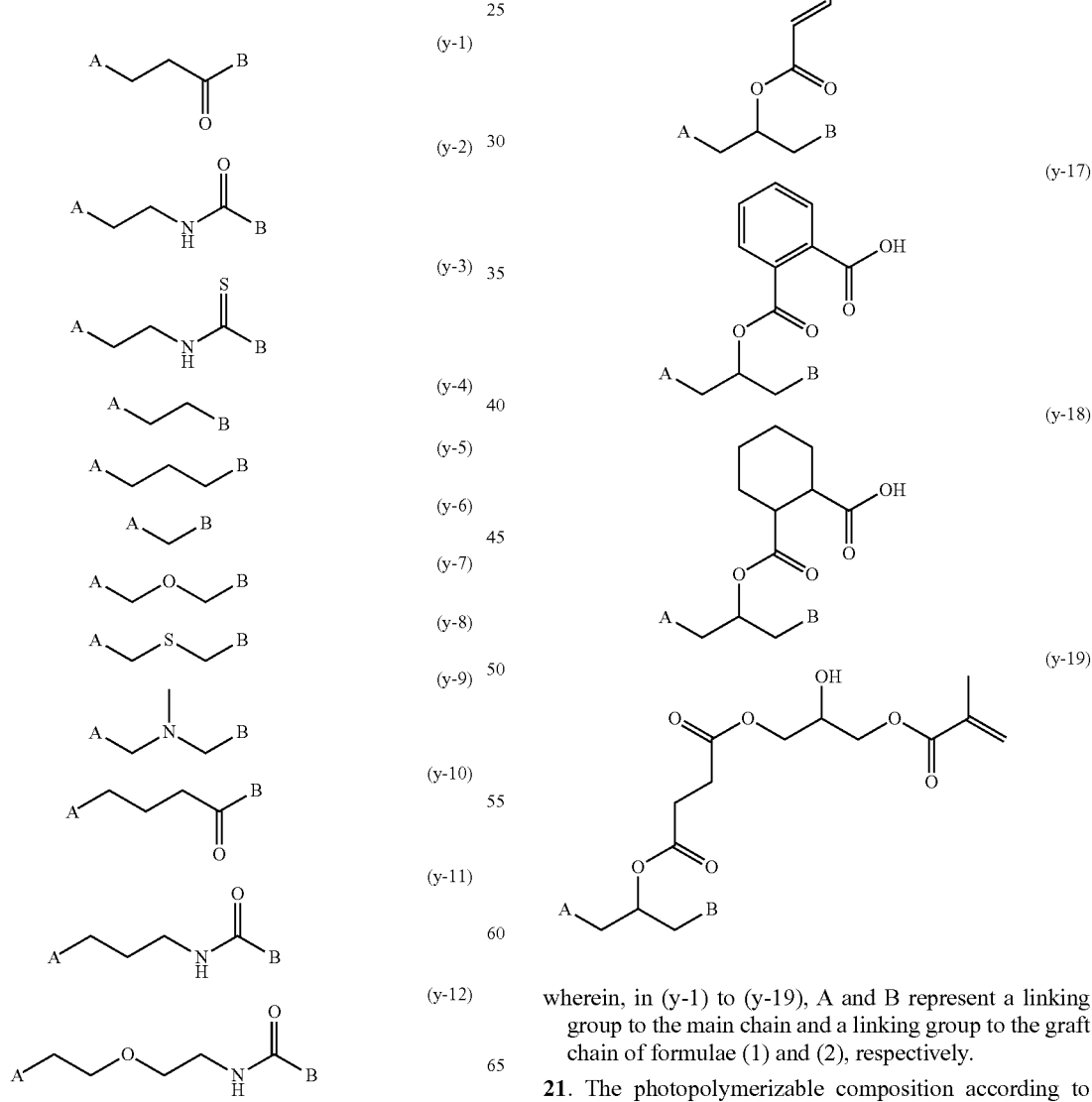

wherein, in (y-1) to (y-19), A and B represent a linking group to the main chain and a linking group to the graft chain of formulae (1) and (2), respectively.

21. The photopolymerizable composition according to claim 19, wherein $Z^1$ represents an alkoxy group having 5 to 24 carbon atoms and $Z^2$ represents an alkylcarbonyloxy group having an alkyl moiety having 5 to 24 carbon atoms.

22. The photopolymerizable composition according to claim 9, wherein the polymerizable compound (E) is a compound obtained by adding ethylene oxide or propylene oxide to a polyfunctional alcohol and (meth)acrylating the resultant.

23. The photopolymerizable composition according to claim 9, wherein the polymerizable compound (E) is dipentaerythritol hexa(meth)acrylate.

* * * * *